(12) United States Patent
Liu

(10) Patent No.: US 10,079,601 B2
(45) Date of Patent: Sep. 18, 2018

(54) KEYSWITCH WITH ADJUSTABLE TACTILE FEEDBACK AND SWITCH THEREOF

(71) Applicant: DARFON ELECTRONICS CORP., Taoyuan (TW)

(72) Inventor: Chia-Hung Liu, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 0 days.

(21) Appl. No.: 15/636,651

(22) Filed: Jun. 29, 2017

(65) Prior Publication Data
US 2018/0006648 A1    Jan. 4, 2018

(30) Foreign Application Priority Data
Jul. 1, 2016    (TW) .............................. 105120945 A

(51) Int. Cl.
| | |
|---|---|
| H01H 13/00 | (2006.01) |
| G06F 3/02 | (2006.01) |
| H03K 17/975 | (2006.01) |
| H01H 13/705 | (2006.01) |
| H03K 17/96 | (2006.01) |
| H03K 17/98 | (2006.01) |

(52) U.S. Cl.
CPC ......... *H03K 17/975* (2013.01); *G06F 3/0216* (2013.01); *H01H 13/705* (2013.01); *H03K 17/9622* (2013.01); *H03K 17/98* (2013.01); *H01H 13/00* (2013.01); *H01H 2215/028* (2013.01); *H03K 2217/96077* (2013.01)

(58) Field of Classification Search
CPC ........... H01H 13/7065; H01H 2215/00; H01H 2215/028; H01H 2217/006; H01H 13/84; H01H 13/85; H01H 2215/03; G06F 3/0216; G06F 1/1662; G06F 3/202
USPC ............... 200/344, 521; 400/490, 491.3, 492
See application file for complete search history.

(56) References Cited

U.S. PATENT DOCUMENTS

| | | | |
|---|---|---|---|
| 4,500,758 A | * | 2/1985 | Guckenheimer .... H01H 13/702 200/5 A |
| 4,597,681 A | * | 7/1986 | Hodges ...................... B41J 5/10 200/331 |

(Continued)

FOREIGN PATENT DOCUMENTS

| | | |
|---|---|---|
| CN | 203536260 U | 4/2014 |
| TW | I230958 | 4/2005 |
| TW | 201005778 | 2/2010 |

*Primary Examiner* — Vanessa Girardi
(74) *Attorney, Agent, or Firm* — Winston Hsu

(57) ABSTRACT

A keyswitch includes a base having a pillar, a cap having a rib and movable relative to the base, a sleeve rotatably sleeving the pillar and having first and second top surfaces and convex and concave portions, an elastic member abutting against the sleeve and the base, and a resilient arm abutting against a first or second position on the convex portion with rotation of the sleeve. When the resilient arm abuts against the first position, the rib abuts against the first top surface to prepress the elastic member for generating a first preload. When the cap is pressed for moving the sleeve downward, the resilient arm moves from the first or second position to the concave portion. When the resilient arm abuts against the second position, the rib abuts against the second top surface to prepress the elastic member for generating a second preload larger than the first preload.

44 Claims, 40 Drawing Sheets

(56) References Cited

U.S. PATENT DOCUMENTS

| | | | | | |
|---|---|---|---|---|---|
| 4,795,888 | A | * | 1/1989 | MacFarlane | B41J 5/26 235/145 R |
| 5,391,006 | A | * | 2/1995 | Danziger | B41J 5/16 400/488 |
| 5,677,826 | A | * | 10/1997 | Sellers | G06F 1/1616 200/344 |
| 5,767,464 | A | * | 6/1998 | Dyer | H01H 3/125 200/344 |
| 5,879,088 | A | * | 3/1999 | English | G06F 3/0202 200/306 |
| 8,928,621 | B2 | * | 1/2015 | Ciesla | G06F 3/0202 345/173 |
| 9,760,172 | B2 | * | 9/2017 | Ray | G06F 3/016 |
| 2009/0153370 | A1 | * | 6/2009 | Cooper | G05G 9/047 341/21 |
| 2018/0006648 | A1 | * | 1/2018 | Liu | H03K 17/975 |

\* cited by examiner

KEYSWITCH WITH ADJUSTABLE TACTILE FEEDBACK AND SWITCH THEREOF

BACKGROUND OF THE INVENTION

1. Field of the Invention

The present invention relates to a keyswitch and a switch thereof, and more specifically, to a keyswitch with an adjustable tactile feedback via rotation of a sleeve relative to a base and a switch thereof.

2. Description of the Prior Art

A keyboard, which is the most common input device, could be found in variety of electronic apparatuses for users to input characters, symbols, numerals and so on. Furthermore, from consumer electronic products to industrial machine tools, they are all equipped with a keyboard for performing input operations.

In practical application, there are various kinds of keyswitches for providing different tactile feedbacks. For example, a gaming keyboard would indicates that it has red, brown or black keyswitches installed thereon on its packing box to remind the user of what kind of tactile feedback (e.g. high or low triggering position, long or short travel distance, required actuation force, tactile or linear feedback, clicky or non-clicky tactile feedback, etc.) the gaming keyboard could provide. That is to say, a conventional mechanical keyswitch could only provide one single kind of tactile feedback without a tactile feedback adjusting function. Thus, if the user wants to experience different kinds of tactile feedbacks, the user must buy a new keyboard or replace the original keyswitches on the gaming keyboard with new keyswitches for providing another kind of tactile feedback. In such a manner, it would cause a high replacement cost, so as to greatly limit flexibility in use and operational convenience of the mechanical keyswitch.

SUMMARY OF THE INVENTION

The present invention provides a keyswitch. The keyswitch includes a base, a cap, a sleeve, an elastic member, and a resilient arm. The base has a pillar extending along a Z-axis. The Z-axis, an X-axis and a Y-axis are perpendicular to each other. The cap has a first rib and a limiting arm. The first rib protrudes toward the base along the Z-axis. The limiting arm protrudes toward the base along the Z-axis and is movably connected to the base, so as to make the cap movable upward and downward between a high position and a low position along the Z-axis. The sleeve rotatably sleeves the pillar. The sleeve is located under the cap and has a first top surface, a second top surface, and an outer annular surface formed thereon. The first top surface is higher than the second top surface along the Z-axis. The outer annular surface has a convex portion and a concave portion. The elastic member abuts against the sleeve and the base for driving the sleeve to move away from the base. The resilient arm is adjacent to the pillar. The resilient arm selectively abuts against a first position or a second position on the convex portion with rotation of the sleeve on the pillar around the Z-axis to have a first amount of deformation when the cap is located at the high position. The resilient arm abuts against the concave portion to have a second amount of deformation when the cap is located at the low position. The first amount of deformation is different from the second amount of deformation. When the resilient arm abuts against the first position, the first rib abuts against the first top surface to make the sleeve prepress the elastic member at a first length for generating a first preload. When the cap moves downward along the Z-axis to move the sleeve downward, the resilient arm moves from the first position to the concave portion. When the resilient arm abuts against the second position, the first rib abuts against the second top surface to make the sleeve prepress the elastic member at a second length for generating a second preload, the first length is larger than the second length to make the first preload smaller than the second preload. When the cap moves downward along the Z-axis to move the sleeve downward, the resilient arm moves from the second position to the concave portion. When the cap is released, the elastic member drives the sleeve to move to the high position along the Z-axis relative to the pillar, so as to make the resilient arm back to abut against the first position or the second position on the convex portion.

The present invention further provides a keyswitch. The keyswitch includes a base, a cap, a sleeve, an elastic member, and a resilient arm. The base has a pillar extending along a Z-axis. The Z-axis, an X-axis and a Y-axis are perpendicular to each other. The cap has a limiting arm. The limiting arm protrudes toward the base along the Z-axis and is movably connected to the base, so as to make the cap movable upward and downward between a high position and a low position along the Z-axis. The resilient arm is adjacent to the pillar. The sleeve abuts against the cap and rotatably sleeves the pillar for rotating on the pillar around the Z-axis. The sleeve has an outer annular surface formed thereon. The outer annular surface has a first convex portion, a first concave portion, a second convex portion, a second concave portion and an arc-shaped bar. The arc-shaped bar extends above the second convex portion but not extends above the first convex portion. The resilient arm selectively abuts against the first convex portion or the second convex portion when the cap is located at the high position. The elastic member abuts against the sleeve and the base respectively for driving the sleeve to move away from the base. When the resilient arm abuts against the second convex portion and the cap is pressed to move the sleeve downward along the Z-axis, the resilient arm needs to cross the arc-shaped bar with downward movement of the sleeve during the resilient arm moves from the second convex portion to the second concave portion. When the resilient arm abuts against the first convex portion and the cap is pressed to move the sleeve downward, the resilient arm does not need to cross the arc-shaped bar during the resilient arm moves from the first convex portion to the first concave portion. When the cap is released, the elastic member drives the sleeve to move upward along the Z-axis relative to the pillar, so as to make the resilient arm move back to abut against the first convex portion or the second convex portion.

The present invention further provides a keyswitch. The keyswitch includes a base, a cap, a sleeve, an elastic member, and a resilient arm. The base has a pillar. A top surface and a protruding block are adjacent to the pillar. The pillar protrudes from the top surface along a Z-axis. The Z-axis, an X-axis and a Y-axis are perpendicular to each other. The protruding block is higher than the top surface along the Z-axis. The cap has a limiting arm extending toward the base along the Z-axis. The limiting arm is movably connected to the base to make the cap movable upward and downward between a high position and a low position along the Z-axis. The sleeve abuts against the cap and rotatably sleeves the pillar. The sleeve has an outer annular surface formed thereon. The outer annular surface has a first convex portion, a first concave portion, a second convex portion, and a second concave portion. A groove and a bottom surface are formed on a bottom end of the sleeve. The sleeve rotates on the pillar around the Z-axis to make the protruding block selectively located under the groove or the bottom surface. The elastic member abuts against the sleeve and the base respectively for driving the sleeve to move away from the base. The resilient arm is adjacent to the pillar. The resilient arm abuts against the first convex portion when the sleeve rotates around the Z-axis to make the protruding block located under the groove, and the resilient arm abuts against the second convex portion when the sleeve rotates around the Z-axis to make the protruding block located under the bottom surface. When the protruding block is located under the groove and the cap is pressed, the sleeve moves downward and the resilient arm moves from the first convex portion to the first concave portion until the protruding block is contained in the groove, so that a maximum movable distance of the cap along the Z-axis is set as a first travel distance. When the protruding block is located under the bottom surface and the cap is pressed, the sleeve moves downward and the resilient arm moves from the second convex portion to the second concave portion until the protruding block abuts against the bottom surface, so that the maximum movable distance of the cap along the Z-axis is set as a second travel distance less than the first travel distance. When the cap is released, the elastic member drives the sleeve to move upward along the Z-axis relative to the pillar, so as to make the resilient arm move back to abut against the first convex portion or the second convex portion.

The present invention further provides a keyswitch. The keyswitch includes a base, a cap, a sleeve, a switch unit, and an elastic member. The base has a pillar extending along a Z-axis. The Z-axis, an X-axis and a Y-axis are perpendicular to each other. The cap has a limiting arm. The limiting arm protrudes toward the base along the Z-axis and is movably connected to the base, so as to make the cap movable upward and downward between a high position and a low position along the Z-axis. The switch unit is adjacent to the pillar. The switch unit has a resilient arm and a contact point opposite to the resilient arm. The contact point and the resilient arm extend toward the cap respectively. The switch unit is electrically connected to a circuit board. The sleeve abuts against the cap and rotatably sleeves the pillar for rotating on the pillar around the Z-axis. The sleeve has an outer annular surface formed thereon. The outer annular surface has a first convex portion, a first concave portion, a second convex portion, a second concave portion, a first transition portion, and a second transition portion lower than the first transition portion along the Z-axis. The first convex portion, the first transition portion and the first concave portion are arranged from down to up along the Z-axis. The second convex portion, the second transition portion and the second concave portion are arranged from down to up along the Z-axis. The resilient arm selectively abuts against the first convex portion or the second convex portion when the cap is located at the high position. The elastic member abuts against the sleeve and the base respectively for driving the sleeve to move away from the base. When the resilient arm abuts against the first convex portion and the cap is pressed to move the sleeve downward along the Z-axis, the resilient arm moves from the first convex portion to the first concave portion along the first transition portion to make the resilient arm located at a first triggering position for triggering the contact point. When the resilient arm abuts against the second convex portion and the cap is pressed to move the sleeve downward along the Z-axis, the resilient arm moves from the second convex portion to the second concave portion along the second transition portion to make the resilient arm located at a second triggering position lower than the first triggering position along the Z-axis for triggering the contact point. When the cap is released, the elastic member drives the sleeve to move upward along the Z-axis relative to the pillar, so as to make the resilient arm move to abut against the first convex portion or the second convex portion and to be separate from the contact point.

The present invention further provides a keyswitch. The keyswitch includes a base, a cap, a resilient arm, an internal sleeve, an external sleeve, and an elastic member. The base has a pillar extending along a Z-axis. The Z-axis, an X-axis and a Y-axis are perpendicular to each other. The cap has a first rib and a limiting arm. The first rib and the limiting arm protrude toward the base along the Z-axis. The limiting arm is movably connected to the base to make the cap movable upward and downward between a high position and a low position along the Z-axis. The resilient arm is adjacent to the pillar. The internal sleeve has a support surface. The external sleeve is supported on the support surface. The external sleeve rotatably sleeves the pillar for rotating on the pillar around the Z-axis. The external sleeve has a first top surface, a second top surface, and an outer annular surface formed thereon. The first top surface is higher than the second top surface along the Z-axis. The outer annular surface has a first convex portion, a first concave portion, a second convex portion, a second concave portion, and an arc-shaped bar. The resilient arm selectively abuts against the first convex portion or the second convex portion when the cap is located at the high position. The arc-shaped bar at least extends above the second convex portion and has a bottom edge surface and an upper edge surface. The elastic member abuts against the internal sleeve and the base for driving the internal sleeve to move away from the base. When the resilient arm abuts against the second convex portion, the first rib of the cap is separate from the second top surface of the external sleeve at a gap, and the resilient arm needs to cross the arc-shaped bar during the resilient arm moves from the second convex portion to the second concave portion. When a downward moving distance of the cap is less than the gap, the cap drives the internal sleeve to move downward and the resilient arm abuts against the bottom edge surface to make the external sleeve not move together with the internal sleeve, so as to make the external sleeve separate from the support surface of the internal sleeve. When the downward moving distance of the cap is larger than the gap to make the cap drive the external sleeve to move downward, the resilient arm crosses the arc-shaped bar to abut against the upper edge surface with downward movement of the external sleeve, and then the resilient arm drives the external sleeve to collide with the support surface of the internal sleeve for making a sound. When the resilient arm abuts against the first convex portion, the first rib abuts against the first top surface, and then the resilient arm moves from the first convex portion to the first concave portion when the cap is pressed to move the internal sleeve and the external sleeve downward along the Z-axis. When the cap is released, the elastic member drives the external sleeve via the internal sleeve to move upward along the Z-axis relative to the pillar, so as to make the resilient arm back to abut against the first convex portion or the second convex portion.

The present invention further provides a switch. The switch includes a base, a resilient arm, a sleeve, and an elastic arm. The base has a positioning structure extending along a Z-axis. The Z-axis, an X-axis and a Y-axis are perpendicular to each other. The resilient arm is adjacent to the positioning structure. The sleeve has an outer annular surface and rotatably sleeves the positioning structure for rotating on the positioning structure around the Z-axis and moving upward and downward between a high position and a low position along the Z-axis. The outer annular surface has a first large radius portion, a first small radius portion, a second large radius portion, and a second small radius portion. The resilient arm selectively abuts against the first large radius portion or the second large radius portion when the sleeve is located at the high position. The elastic member abuts against the sleeve and the base respectively for driving the sleeve to move away from the base. When the resilient arm abuts against the first large radius portion and the sleeve moves downward along the Z-axis, the resilient arm moves from the first large radius portion to the first small radius portion along a first path and the first path interacts with the resilient arm to generate a first tactile feedback. When the resilient arm abuts against the second large radius portion and the sleeve moves downward along the Z-axis, the resilient arm moves from the second large radius portion to the second small radius portion along a second path and the second path interacts with the resilient arm to generate a second tactile feedback. When the sleeve is released, the elastic member drives the sleeve to move upward along the Z-axis, so as to make the resilient arm move back to abut against the first large radius portion or the second large radius portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 14b is a top view of the external sleeve in FIG. 14a.

DETAILED DESCRIPTION

Figure 1:
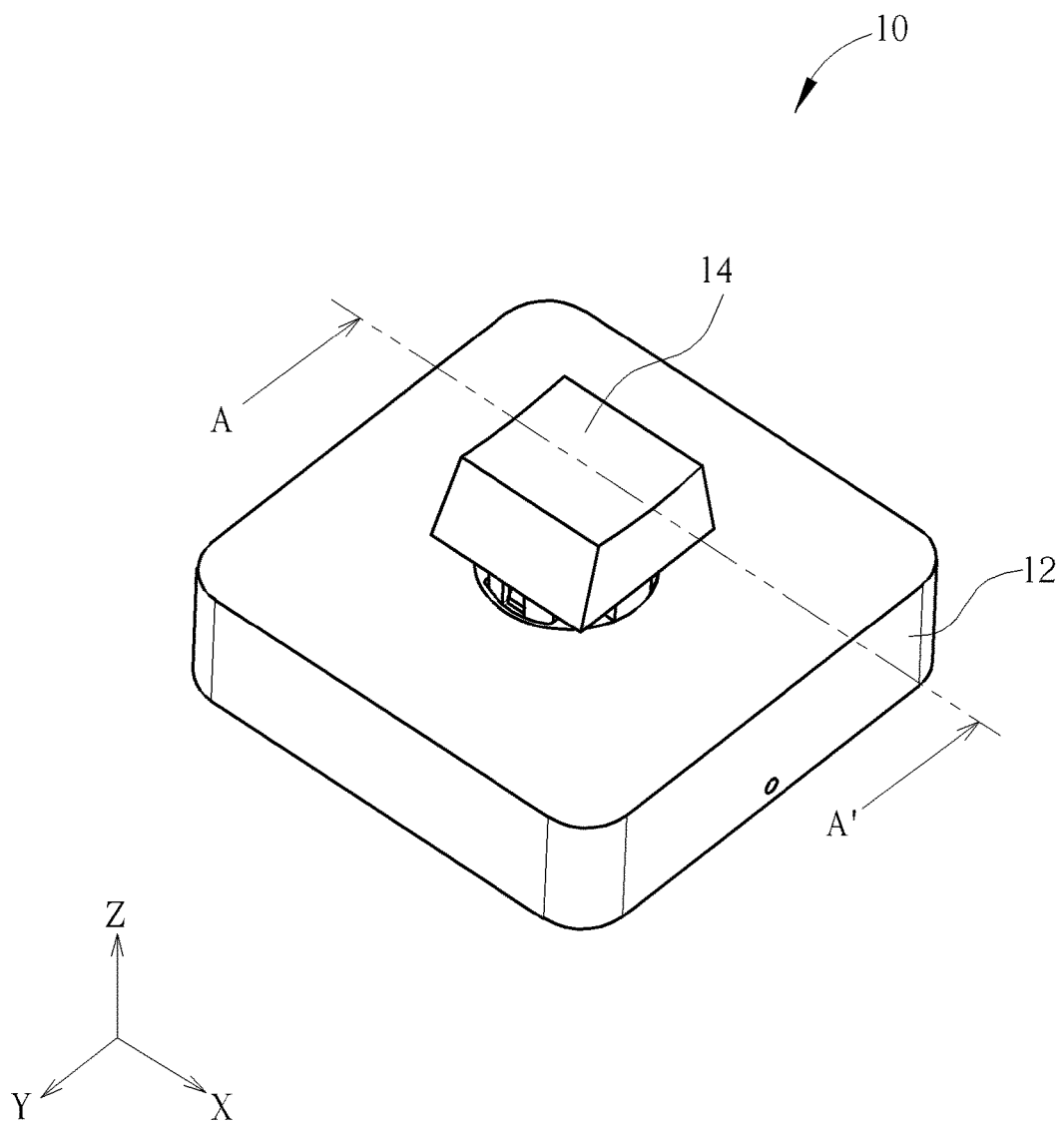
FIG. 1 is a diagram of a keyswitch according to an embodiment of the present invention.
Figure 2:
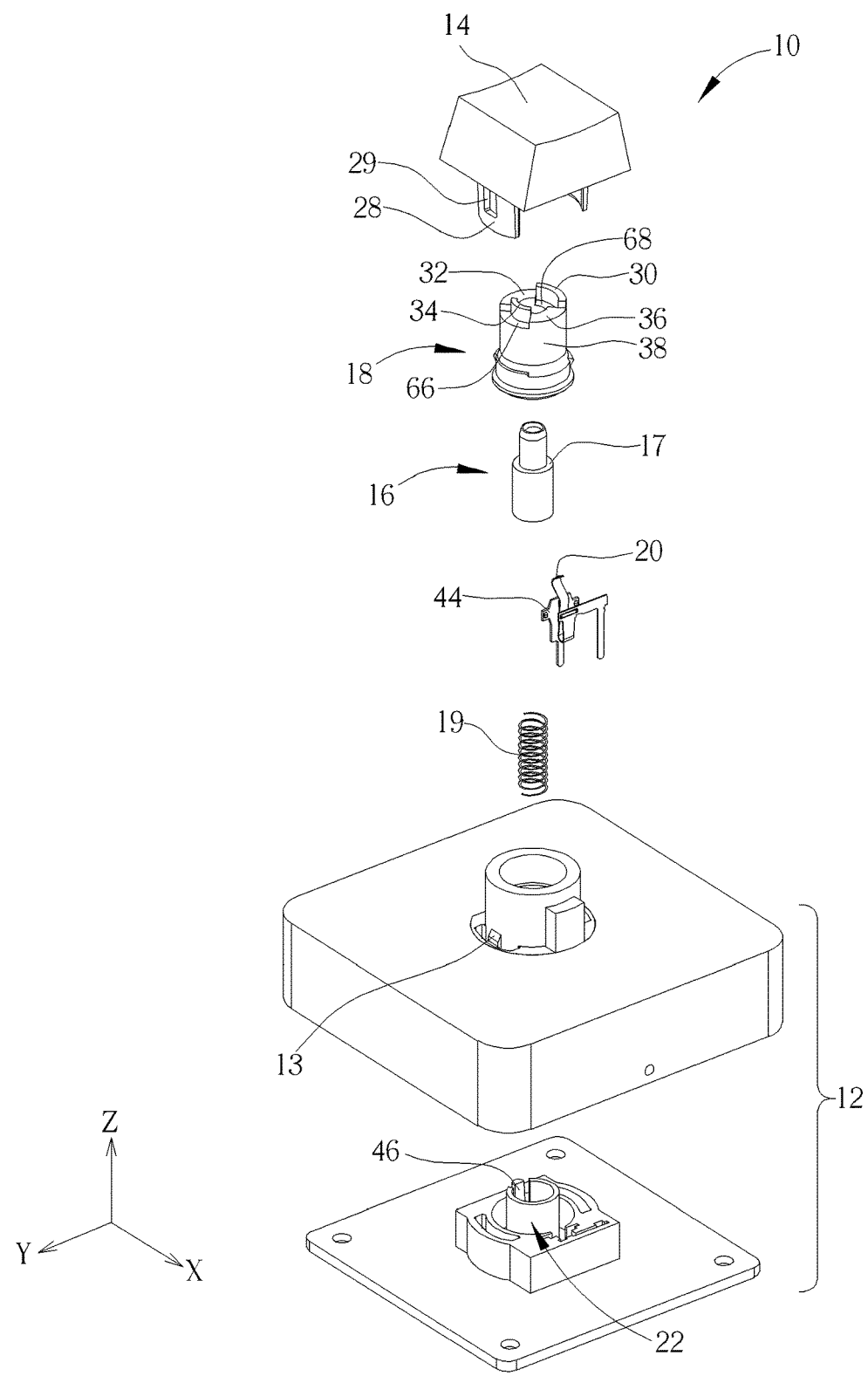
FIG. 2 is an exploded diagram of the keyswitch in FIG. 1.
Figure 3:
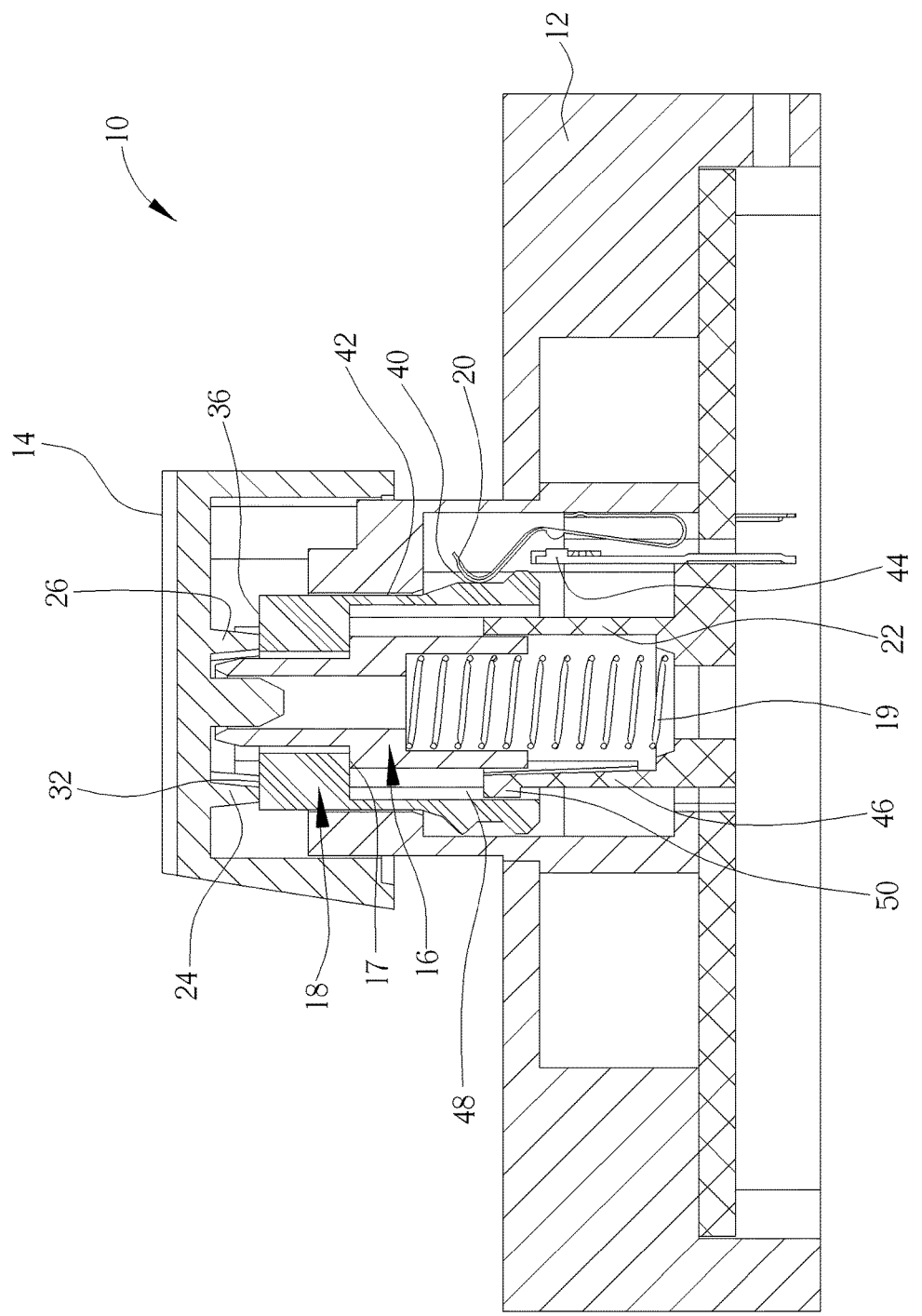
FIG. 3 is a cross-sectional diagram of the keyswitch in FIG. 1 along a cross-sectional line A-A'.
Figure 4:
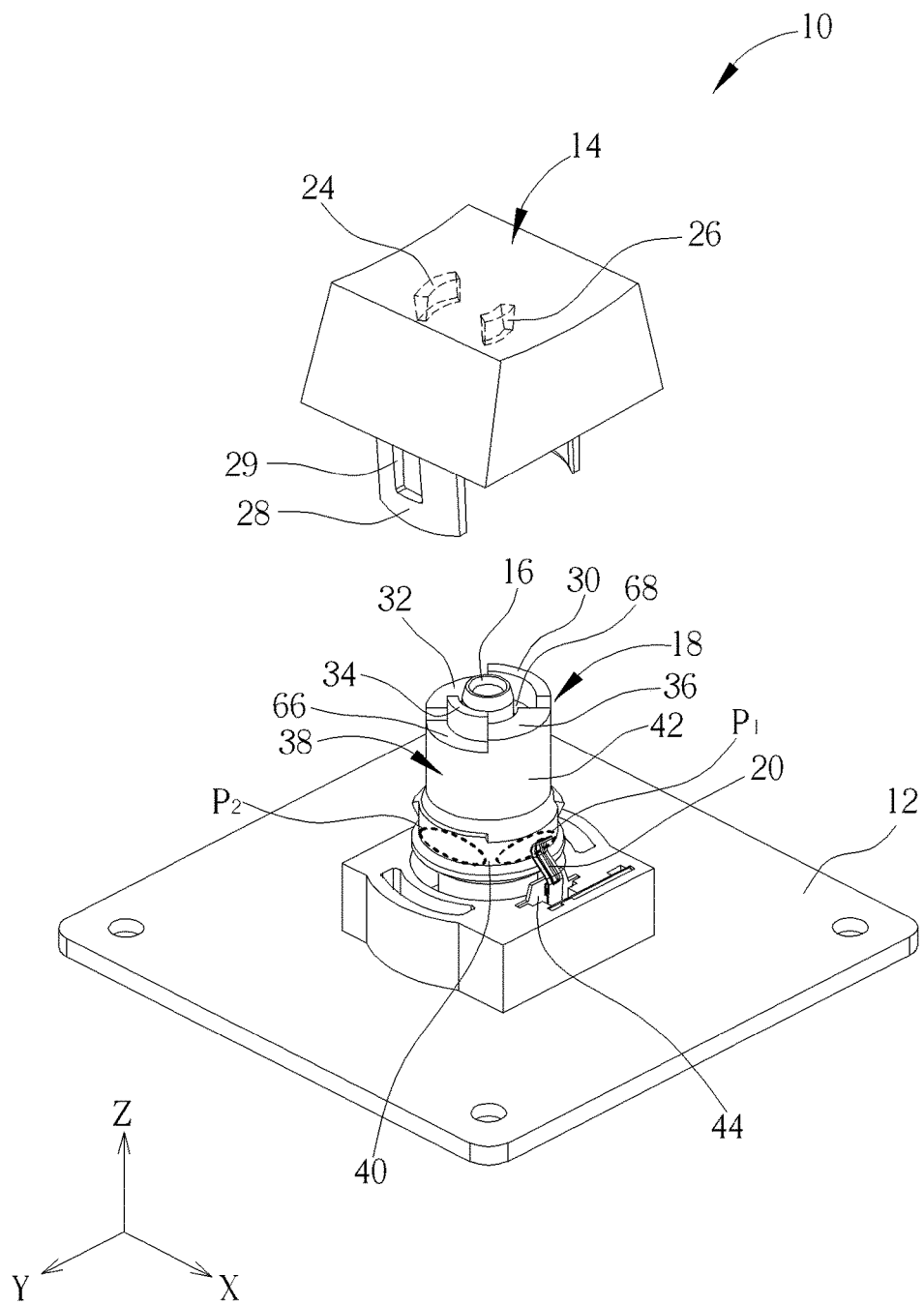
FIG. 4 is a partial exploded diagram of the keyswitch in FIG. 1.
Figure 5:
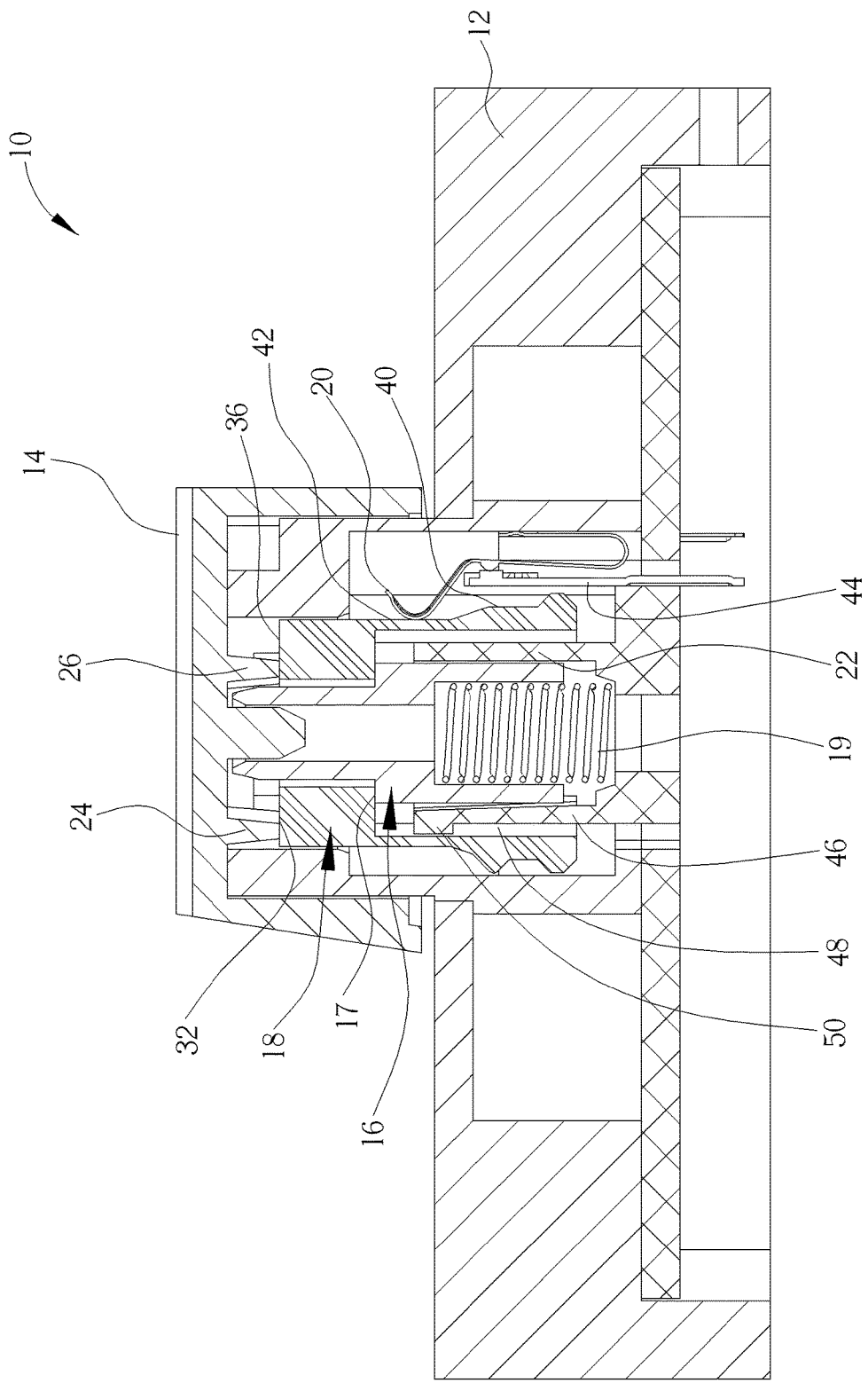
FIG. 5 is a cross-sectional diagram of a cap in FIG. 3 being pressed to a low position.

Please refer to FIG. 1, FIG. 2, FIG. 3, FIG. 4, and FIG. 5. FIG. 1 is a diagram of a keyswitch 10 according to an embodiment of the present invention. FIG. 2 is an exploded diagram of the keyswitch 10 in FIG. 1. FIG. 3 is a cross-sectional diagram of the keyswitch 10 in FIG. 1 along a cross-sectional line A-A'. FIG. 4 is a partial exploded diagram of the keyswitch 10 in FIG. 1. FIG. 5 is a cross-sectional diagram of the cap 14 in FIG. 3 being pressed to a low position. For clearly showing the internal mechanical design of the keyswitch 10, only a bottom half structure is depicted for a base 12 in FIG. 4. As shown in FIG. 1, FIG. 2, FIG. 3, FIG. 4, and FIG. 5, the keyswitch 10 includes the base 12, the cap 14, an internal sleeve 16, an external sleeve 18, an elastic member 19, and a resilient arm 20. The base 12 has a pillar 22. The pillar 22 extends along a Z-axis as shown in FIG. 2. The Z-axis, an X-axis and a Y-axis are perpendicular to each other. The resilient arm 20 is adjacent to the pillar 22. The cap 14 has a first rib 24, a second rib 26, and a limiting arm 28. The limiting arm 28 is movably connected to the base 12 (e.g. utilizing a hole 29 of the limiting arm 28 to movably sleeve a limiting block 13 of the base 12 for constraining a movable distance of the cap 14 relative to the base 12, but not limited thereto), so as to make the cap 14 movable between a high position and a low position along the Z-axis. The second rib 26 and the first rib 24 could be preferably opposite to each other and be in an arc shape.

To be more specific, the first rib 24 and the second rib 26 could have the same center of curvature, and a curvature radius of the first rib 24 could be larger than a curvature radius of the second rib 26. Via the design that the second rib 26 and the first rib 24 are in an arc shape to abut against the external sleeve 18, abutting between the cap 14 and the external sleeve 18 could be more steady, but not limited thereto, meaning that the present invention could adopt the cap could abut against the external sleeve via one single rib in another embodiment.

An upper section of the external sleeve 18 is supported on a support surface 17 of the internal sleeve 16, and a bottom section of the external sleeve 18 rotatably sleeves the pillar 22. The external sleeve 18 is located under the cap 14 and has a top surface 30, a top surface 32, atop surface 34, atop surface 36, and an outer annular surface 38 formed thereon. In this embodiment, the top surface 30 is higher than the top surface 32 along the Z-axis. The top surface 30 and the top surface 34 are opposite to each other and are in an arc shape for abutting against the first rib 24 and the second rib 26 respectively. The top surface 32 and the top surface 36 are opposite to each other and are in an arc shape for abutting against the first rib 24 and the second rib 26 respectively. The outer annular surface 38 could have a first convex portion 40 and a first concave portion 42. The first convex portion 40 and the first concave portion 42 are in an annular shape and extend along a plane formed by the X-axis and the Y-axis in parallel. The elastic member 19 could abut against the internal sleeve 16 and the base 12 respectively and could be preferably a spring (but not limited thereto), for providing an elastic force to drive the external sleeve 18 to move away from the base 12.

Via the aforesaid design, when the first rib 24 and the second rib 26 abut against the top surface 32 and the top surface 36 of the external sleeve 18 respectively and the cap 14 is located at the high position, the resilient arm 20 abuts against a first position $P_1$ on the first convex portion 40 (as shown in FIG. 4) and the external sleeve 18 prepresses the elastic member 19 via the internal sleeve 16 at a first length as shown in FIG. 3 for generating a first preload, so as to provide a tactile feedback with a relatively small preload when a user presses the keyswitch 10.

In this embodiment, as shown in FIG. 3 and FIG. 5, the keyswitch 10 could further include a contact point 44. The resilient arm 20 and the contact point 44 are opposite to each other and extend toward the cap 14 respectively. The resilient arm 20 and the contact point 44 are electrically connected to a circuit board (not shown in the figures) of the keyswitch 10. To be more specific, when the cap 14 is located at the high position as shown in FIG. 3, the resilient arm 20 abuts against the first position $P_1$ on the first convex portion 40 to be biased outwardly by the first convex portion 40 for generating a first amount of deformation, so as to be separate from the contact point 44. When the cap 14 is pressed to the low position as shown in FIG. 5, the resilient arm 20 moves to abut against the first concave portion 42. During the aforesaid process, deformation of the resilient arm 20 is reduced to generate a second amount of deformation different from the first amount of deformation. In such a manner, the resilient arm 20 could abut against the contact point 44 for triggering the contact point 44, so as to generate a corresponding input signal to the circuit board of the keyswitch 10 for performing a corresponding input function.

Figure 6:
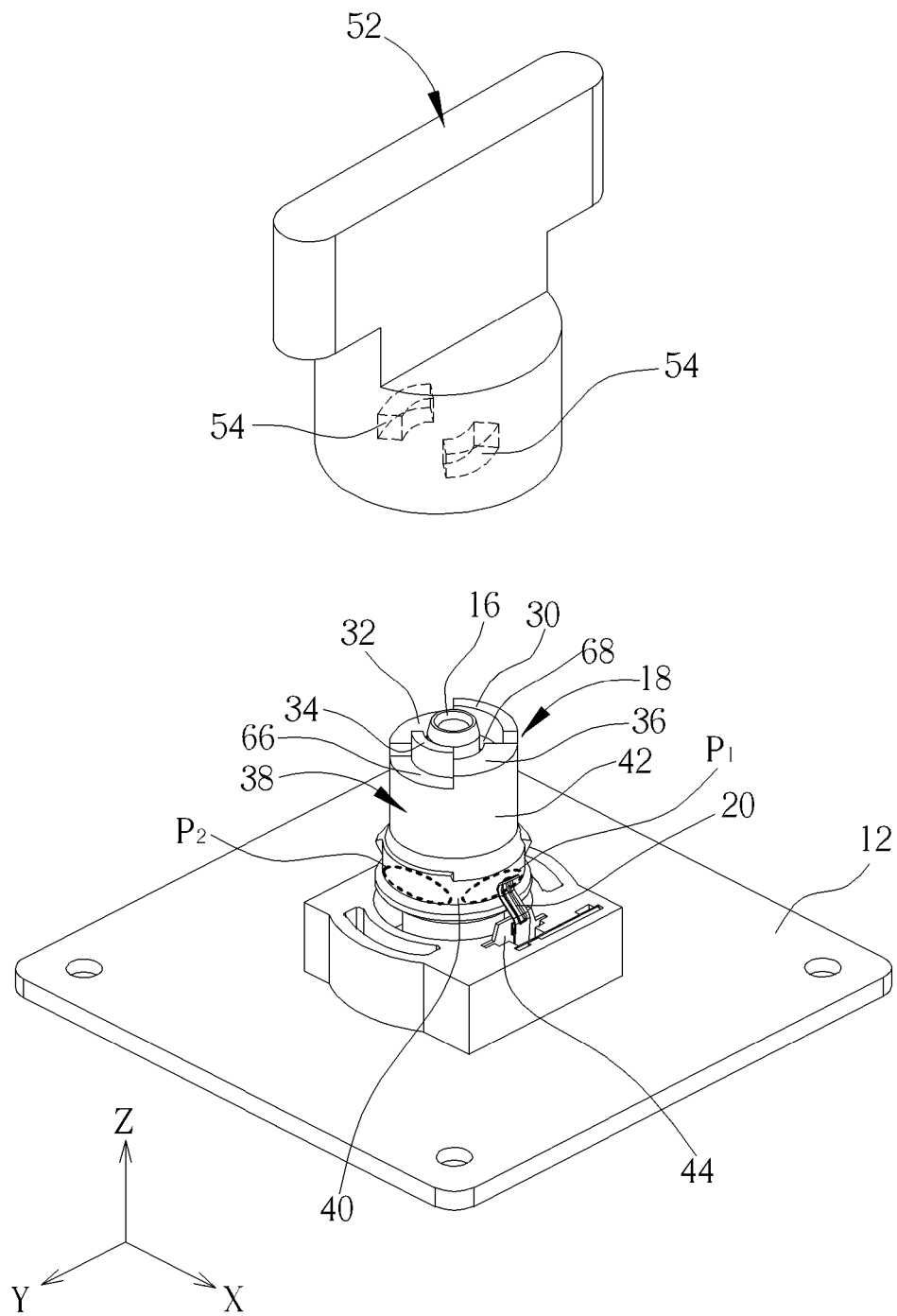
FIG. 6 is an exploded diagram of an adjusting tool and the keyswitch after the cap is detached.
Figure 7:
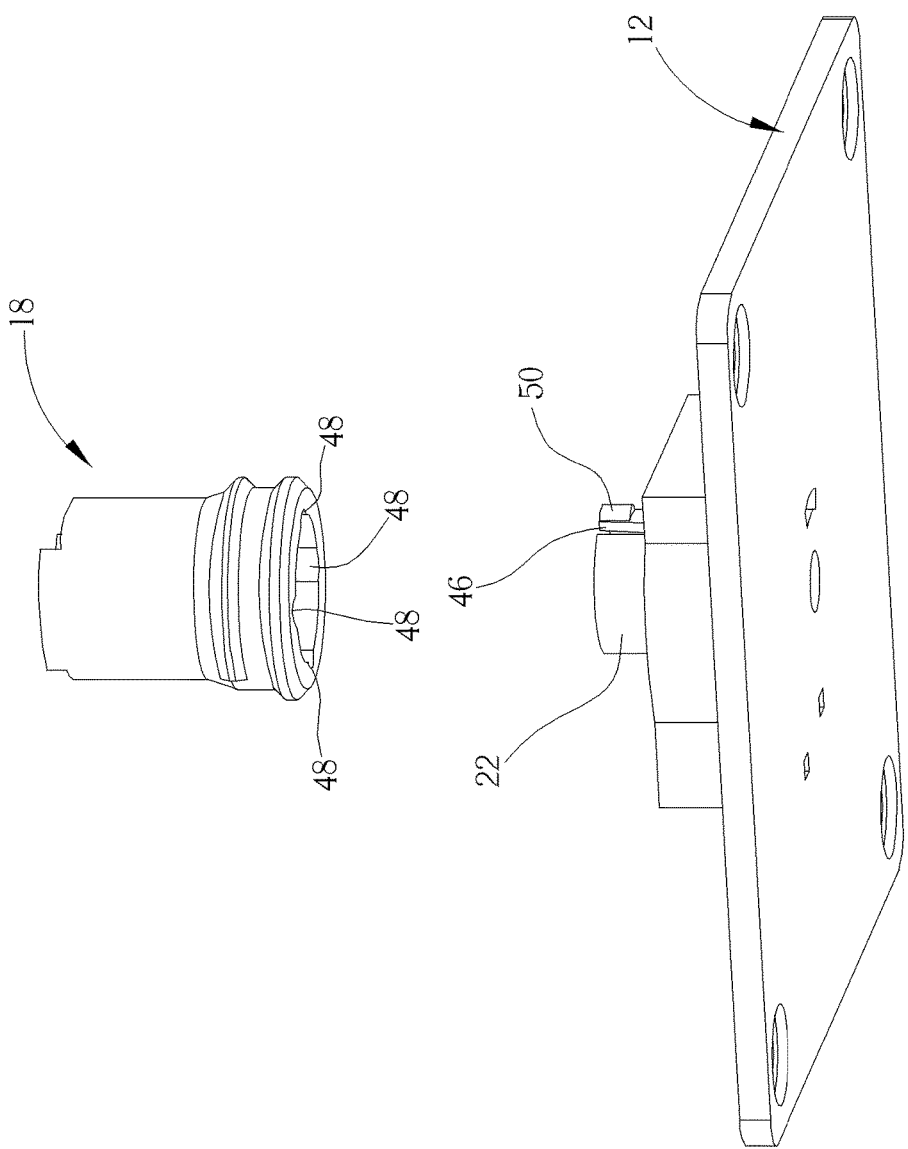
FIG. 7 is an enlarged diagram of an external sleeve and a pillar of a base in FIG. 2 from another viewing angle.
Figure 8:
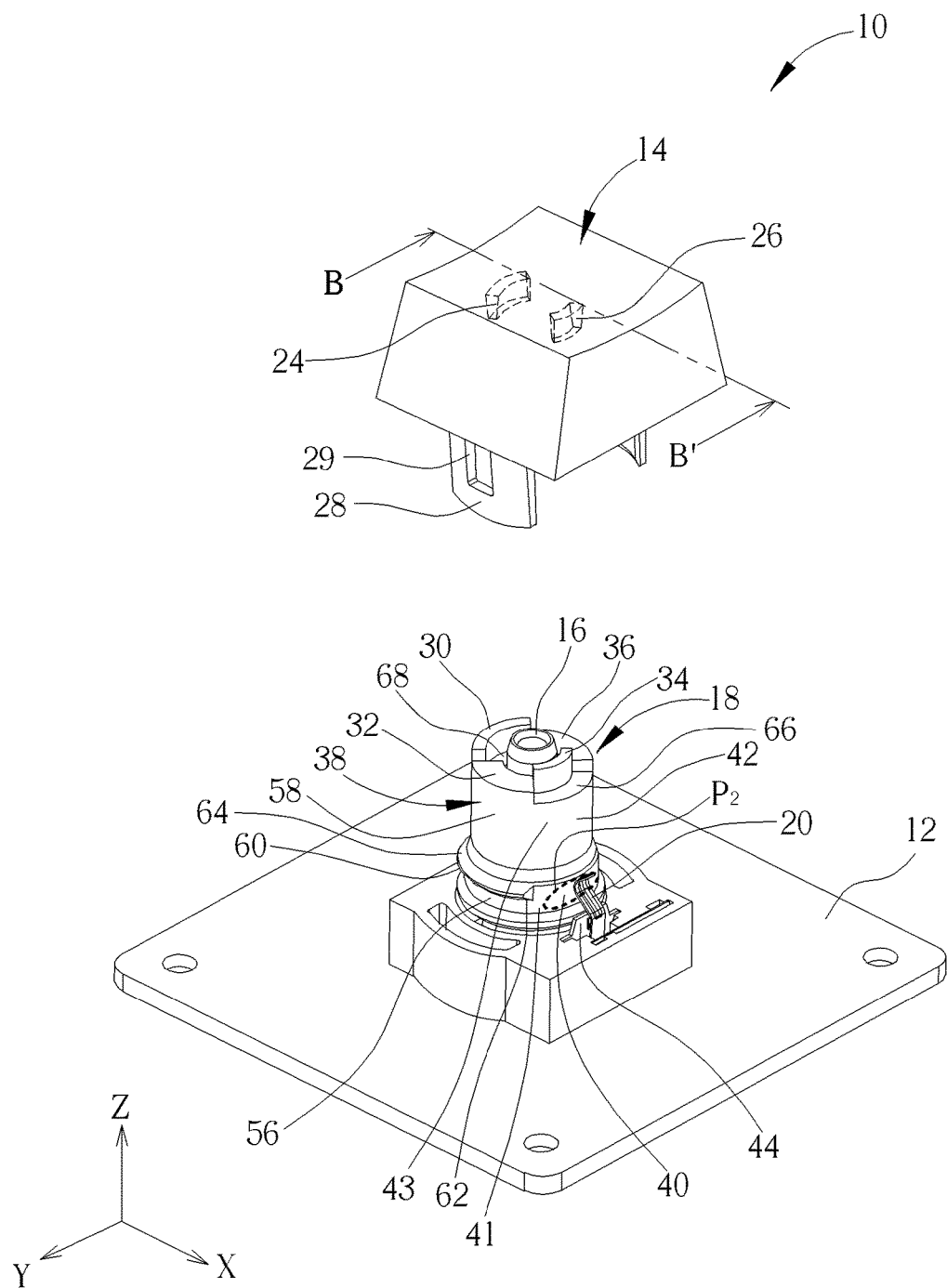
FIG. 8 is a partial exploded diagram of the keyswitch in FIG. 4 when the external sleeve rotates 90° (counterclockwise from a top view) to make a resilient arm abut against a second position on a first convex portion.
Figure 9:
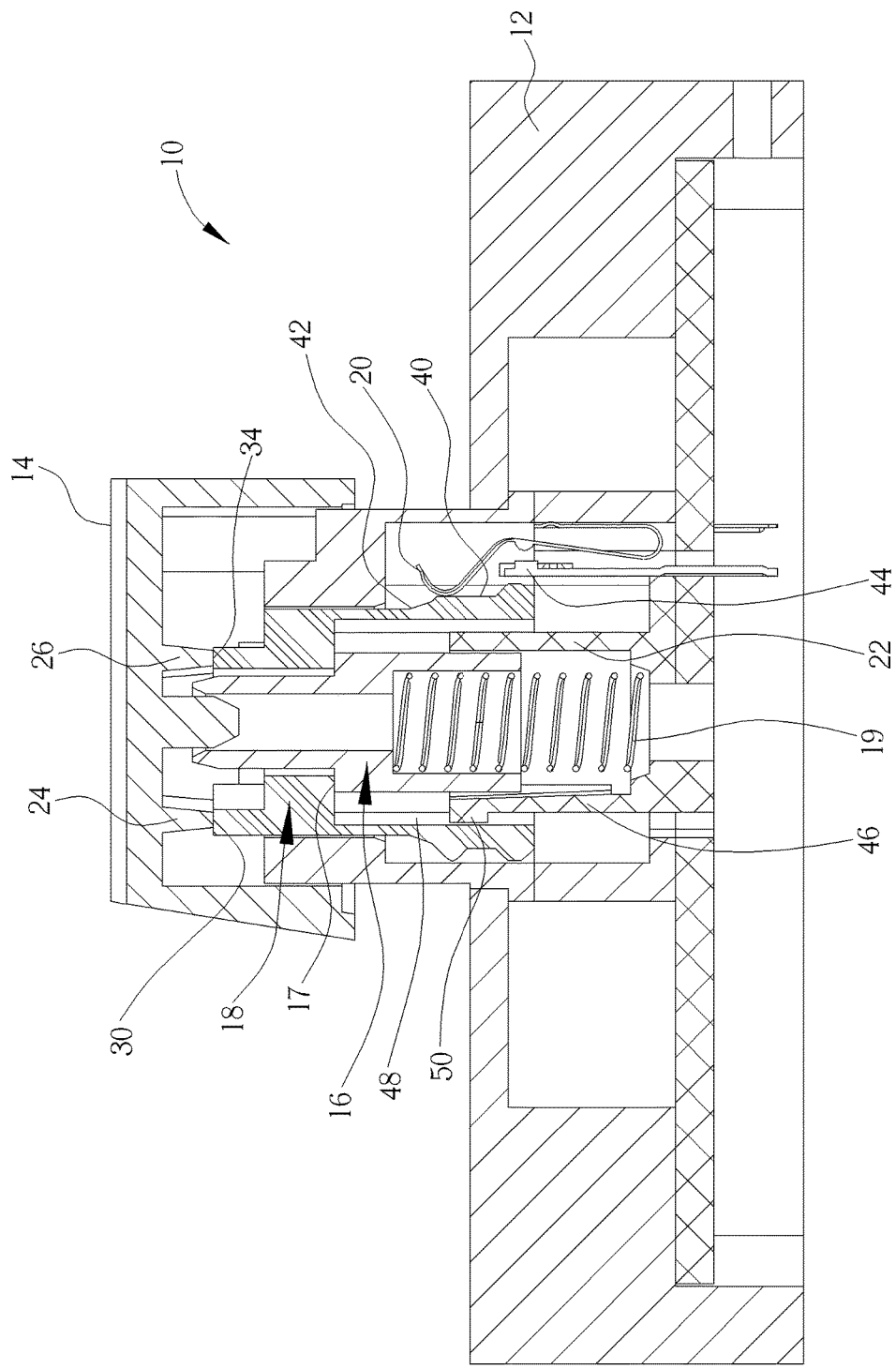
FIG. 9 is a cross-sectional diagram of the keyswitch in FIG. 8 along a cross-sectional line B-B' when the cap is assembled with the base.
Figure 10:
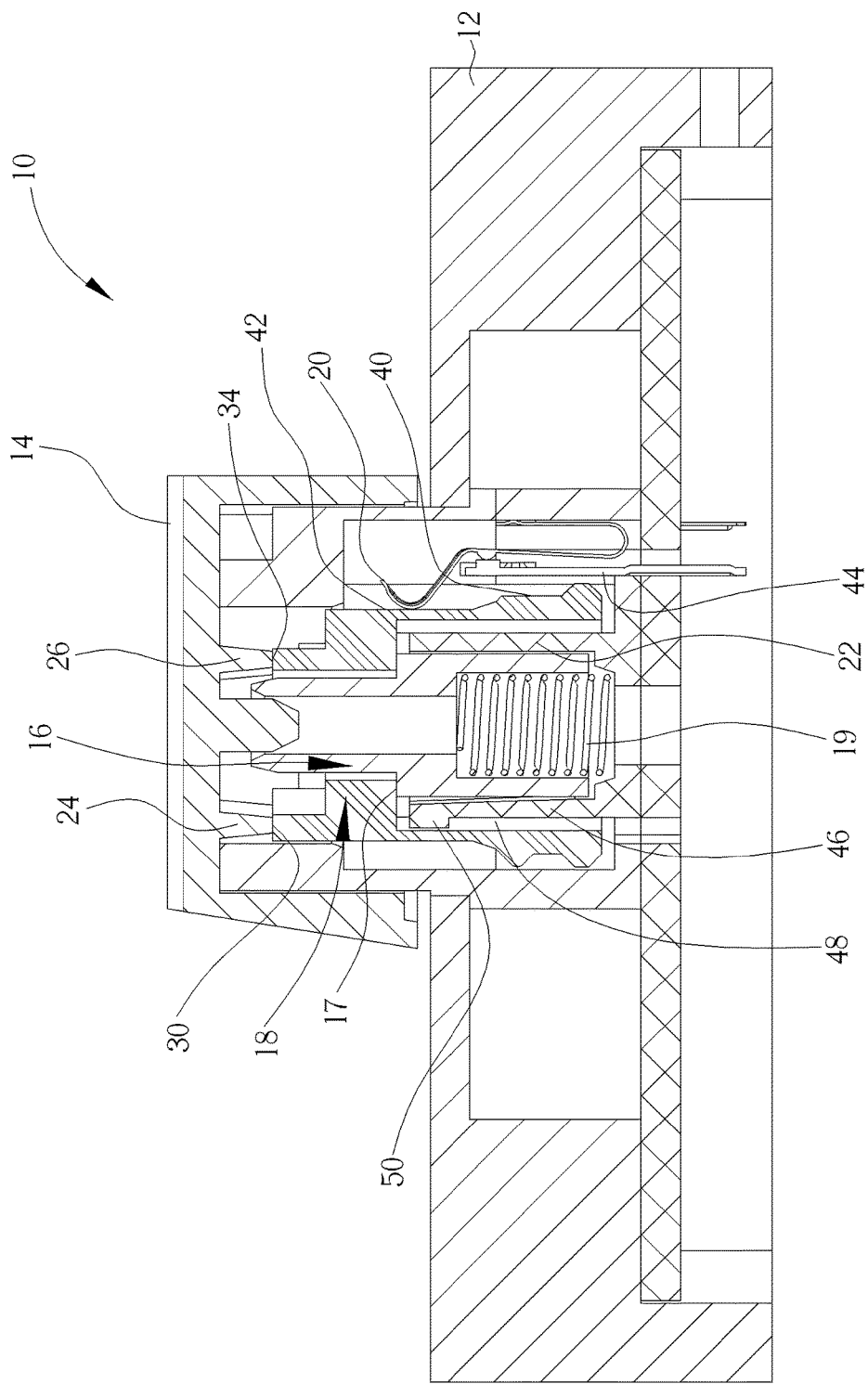
FIG. 10 is a cross-sectional diagram of the cap in FIG. 9 being pressed to the low position.

More detailed description for the tactile feedback adjusting operation of the keyswitch 10 is provided as follows. Please refer to FIG. 2, FIG. 3, FIG. 6, FIG. 7, FIG. 8, FIG. 9, and FIG. 10. FIG. 6 is an exploded diagram of an adjusting tool 52 and the keyswitch 10 after the cap 14 is detached. FIG. 7 is an enlarged diagram of the external sleeve 18 and the pillar 22 of the base 12 in FIG. 2 from another viewing angle. FIG. 8 is a partial exploded diagram of the keyswitch 10 in FIG. 4 when the external sleeve 18 rotates 90° (counterclockwise from a top view) to make the resilient arm 20 abut against a second position $P_2$ on the first convex portion 40. FIG. 9 is a cross-sectional diagram of the keyswitch 10 in FIG. 8 along a cross-sectional line B-B' when the cap 14 is assembled with the base 12. FIG. 10 is a cross-sectional diagram of the cap 14 in FIG. 9 being pressed to the low position. As shown in FIG. 2, FIG. 3, FIG. 6, FIG. 7, FIG. 8, FIG. 9, and FIG. 10, when the user wants to perform a preload adjusting operation of the keyswitch 10, the user just needs to detach the cap 14 from the base 12, and then utilizes an adjusting tool or a plier to rotate the external sleeve 18 on the pillar 22 around the Z-axis for making the resilient arm 20 abut against the second position $P_2$ on the first convex portion 40 (as shown in FIG. 8) instead of abutting against the first position $P_1$ on the first convex portion 40 (as shown in FIG. 6).

During the aforesaid process, for making the user surely aware of whether the external sleeve 18 is rotated to a right position, as shown in FIG. 2 and FIG. 7, the pillar 22 could have a positioning arm 46 and the external sleeve 18 could have at least one positioning slots 48 formed therein (four shown in FIG. 7, but not limited thereto). An end of the positioning arm 46 corresponding to the positioning slot 48 could have a protruding point 50 formed thereon. Accordingly, the external sleeve 18 could make the resilient arm 20 abut against the first position $P_1$ as shown in FIG. 4 or the second position $P_2$ as shown in FIG. 8 steadily via structural engagement between the protruding point 50 and the positioning slot 48. In such a manner, when the cap 14 is assembled with the base 12, the cap 14 could abut against the external sleeve 18 correctly. In practical application, when a keyboard having the keyswitch 10 is sold in the market, the adjusting tool 52 (preferably a T-shaped tool in a key form as shown in FIG. 6, but not limited thereto) could be attached to a packing box of the keyboard. The adjusting tool 52 could have two third ribs 54 opposite to each other. Accordingly, when the cap 14 is detached from the base 12, the user could sleeve the adjusting tool 52 on a top end of the external sleeve 18 to make the two third ribs 54 laterally abut against the top surface 30, and then rotate the adjusting tool 52 to make the external sleeve 18 rotate on the pillar 22 around the Z-axis, so that the user could complete the rotation operation of the external sleeve 18 more rapidly and conveniently.

After the aforesaid operation are completed and the cap 14 is assembled with the base 12, as shown in FIG. 8, FIG. 9, and FIG. 10, the resilient arm 20 abuts against the second position $P_2$ on the first convex portion 40 (as shown in FIG. 9) when the first rib 24 and the second rib 26 abuts against the top surface 30 and the top surface 34 of the external sleeve 18 respectively and the cap 14 is located at the high position, so as to make the external sleeve 18 prepress the elastic member 19 via the internal sleeve 16 at a second length as shown in FIG. 9 for generating a second preload, wherein the first length of the elastic member 19 as shown in FIG. 3 is larger than the second length of the elastic member 19 as shown in FIG. 9. That is to say, the cap 14 receives the first preload provided by the elastic member 19 when the resilient arm 20 abuts against the first position $P_1$ on the first convex portion 40 as shown in FIG. 4, and the cap 14 receives the second preload provided by the elastic member 19 when the external sleeve 18 rotates to make the resilient arm 20 abut against the second position $P_2$ on the first convex portion 40 as shown in FIG. 8. The second preload is larger than the first preload, so as to provide a tactile feedback with a relatively large preload when the user presses the keyswitch 10.

On the other hand, when the cap 14 is located at the high position as shown in FIG. 9, the resilient arm 20 abuts against the second position $P_2$ on the first convex portion 40 to be biased outward by the first convex portion 40, so as to be separate from the contact point 44. When the cap 14 is pressed to move to the low position as shown in FIG. 10, the resilient arm 20 abuts against the first concave portion 42 instead. During this process, deformation of the resilient arm 20 is reduced to make the resilient arm 20 abut against the contact point 44, so as to generate a corresponding input signal to the circuit board of the keyswitch 10 for performing a corresponding input function.

Figure 11:
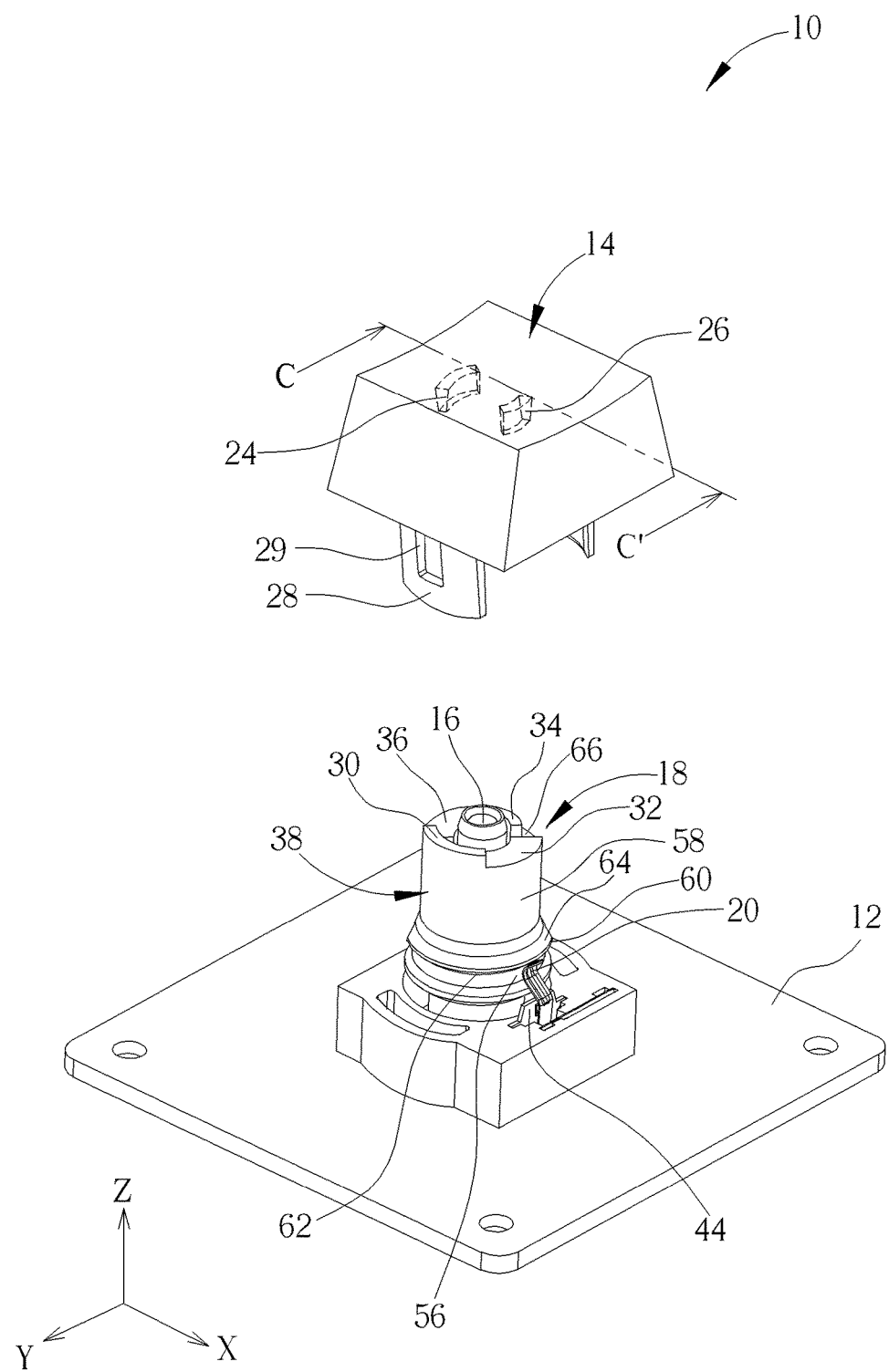
FIG. 11 is a partial exploded diagram of the keyswitch in FIG. 8 when the external sleeve continues rotating 90° (counterclockwise from a top view) to make the resilient arm abut against a second convex portion.
Figure 12:
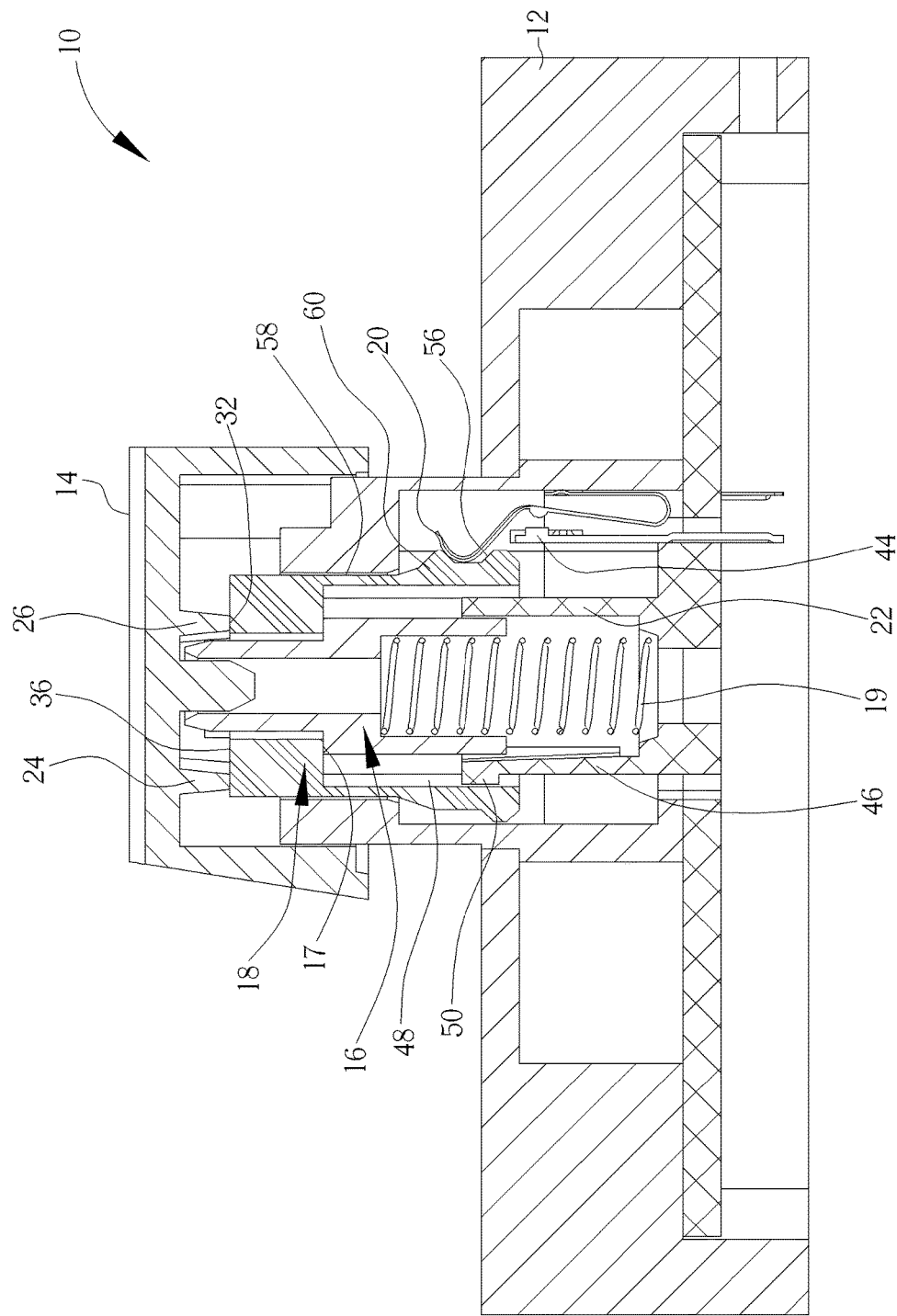
FIG. 12 is a cross-sectional diagram of the keyswitch in FIG. 11 along a cross-sectional line C-C' when the cap is assembled with the base.
Figure 13:
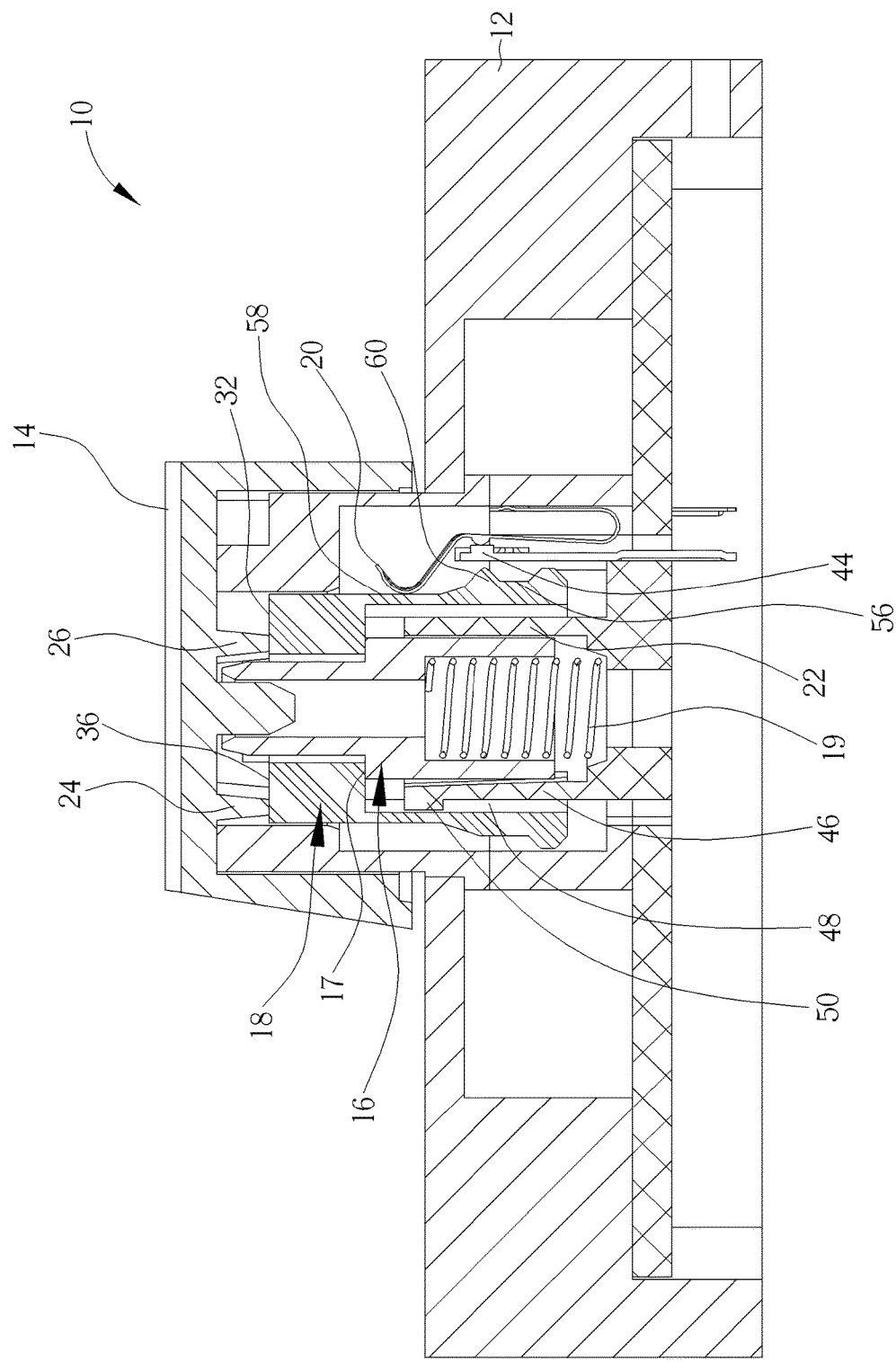
FIG. 13 is a cross-sectional diagram of the cap in FIG. 12 being pressed to the low position.

Please refer to FIG. 8, FIG. 11, FIG. 12, and FIG. 13. FIG. 11 is a partial exploded diagram of the keyswitch 10 in FIG. 8 when the external sleeve 18 continues rotating 90° (counterclockwise from a top view) to make the resilient arm 20 abut against a second convex portion 56. FIG. 12 is a cross-sectional diagram of the keyswitch 10 in FIG. 11 along a cross-sectional line C-C' when the cap 14 is assembled with the base 12. FIG. 13 is a cross-sectional diagram of the cap 14 in FIG. 12 being pressed to the low position. As shown in FIG. 8, FIG. 11, FIG. 12, and FIG. 13, the outer annular surface 38 could further have the second convex portion 56, a second concave portion 58 and an arc-shaped bar 60. The arc-shaped bar 60 could have a bottom edge surface 62 and an upper edge surface 64. The arc-shaped bar 60 extends above the second convex portion 56, but does not extend above the second position $P_2$ on the first convex portion 40 (as shown in FIG. 8). In this embodiment, the outer annular surface 38 could have an annular convex portion 41 and an annular concave portion 43. The annular convex portion 41 is connected to the first convex portion 40 and the second convex portion 56. The annular concave portion 43 is connected to the first concave portion 42 and the second concave portion 58. Accordingly, when the external sleeve 18 rotates on the pillar 22, the resilient arm 20 could slide from the first convex portion 40 to the second convex portion 56 along the annular convex portion 41 or slide from the first concave portion 42 to the second concave portion 58 along the annular concave portion 43 (it depends on whether the cap 14 is pressed), so as to make sliding of the resilient arm 20 on the outer annular surface 38 smooth.

Via the aforesaid design, when the user wants to switch the keyswitch 10 to provide a clicky tactile feedback, the user just needs to rotate the external sleeve 18 on the pillar 22 around the Z-axis (e.g. rotating the external sleeve 18 by the user's fingers or utilizing the adjusting tool 52 to rotate the external sleeve 18) from a position where the resilient arm 20 abuts against the first convex portion 40 as shown in FIG. 8 counterclockwise to a position where the resilient arm 20 abuts against the second convex portion 56 as shown in FIG. 11.

After the rotation operation of the external sleeve 18 is completed and the cap 14 is assembled with the base 12, the keyswitch 10 could provide a clicky tactile feedback during the user presses the cap 14. To be more specific, when the cap 14 is located at the high position as shown in FIG. 12, the resilient arm 20 abuts against the second convex position 56 to be separate from the contact point 44. Subsequently, when the cap 14 is pressed to the low position, the external sleeve 18 moves downward with the cap 14 to make the resilient arm 20 cross the arc-shaped bar 60 for moving from the second convex portion 56 to the second concave portion 58. Accordingly, the keyswitch 10 could provide a clicky tactile feedback during the user presses the cap 14. Moreover, deformation of the resilient arm 20 could be reduced to make the resilient arm 20 trigger the contact point 44, so that the keyswitch 10 could perform a corresponding input function.

On the other hand, when the external sleeve 18 is rotated from the position where the resilient arm 20 abuts against the second convex portion 56 as shown in FIG. 11 back to the position where the resilient arm 20 abuts against the second position $P_2$ on the first convex portion 40 as shown in FIG. 8 and then the cap 14 presses the external sleeve 18, the external sleeve 18 moves downward accordingly and the resilient arm 20 does not need to cross the arc-shaped bar 60 during the resilient arm 20 moves from the first convex portion 40 to the first concave portion 42, so as to provide a non-clicky tactile feedback when the user presses the cap 14.

Figure 14A:
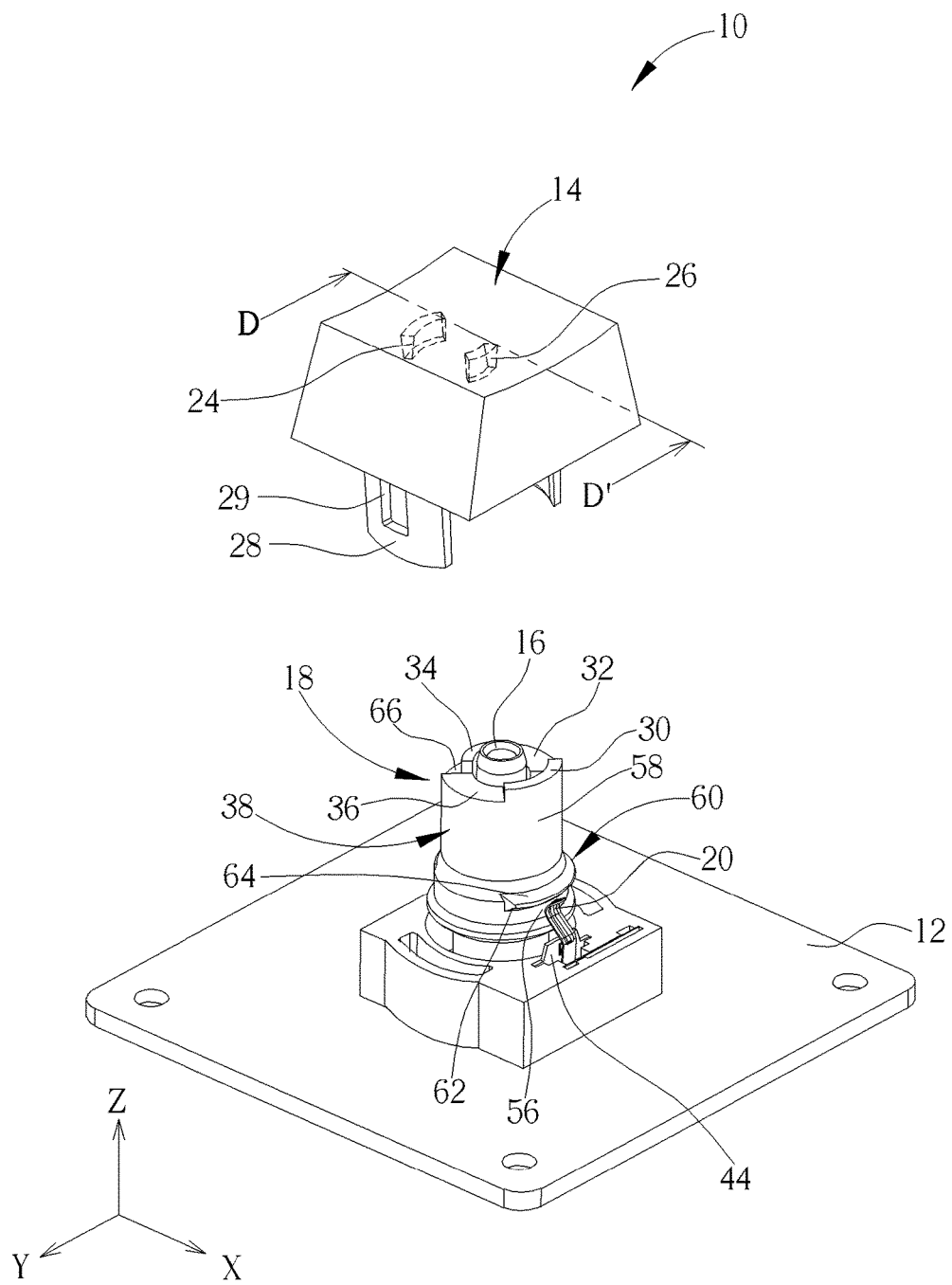
FIG. 14a is a partial exploded diagram of the keyswitch in FIG. 11 when the external sleeve continues rotating 90° (counterclockwise from a top view) to make the resilient arm abut against the second convex portion.
Figure 14B:
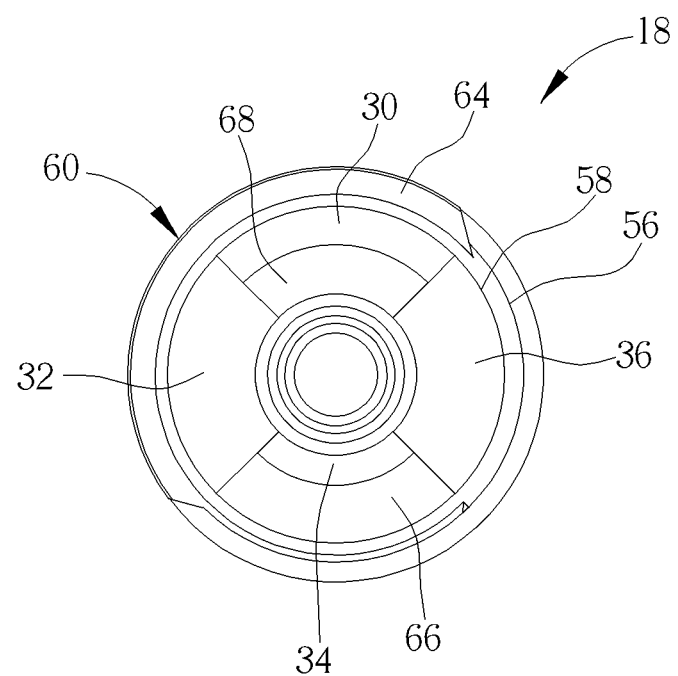
Figure 15:
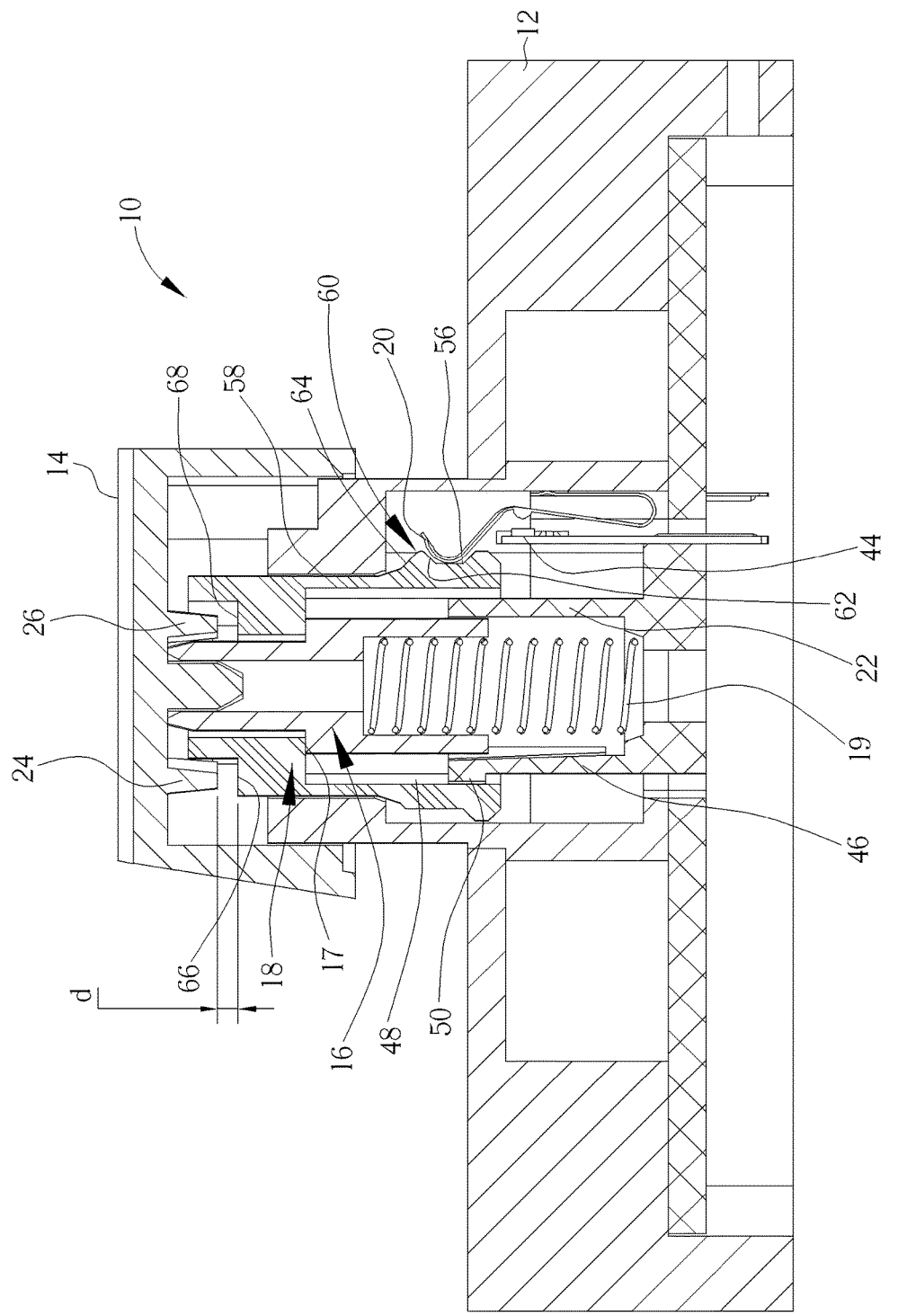
FIG. 15 is a cross-sectional diagram of the keyswitch in FIG. 14a along a cross-sectional line D-D' when the cap is assembled with the base.
Figure 16:
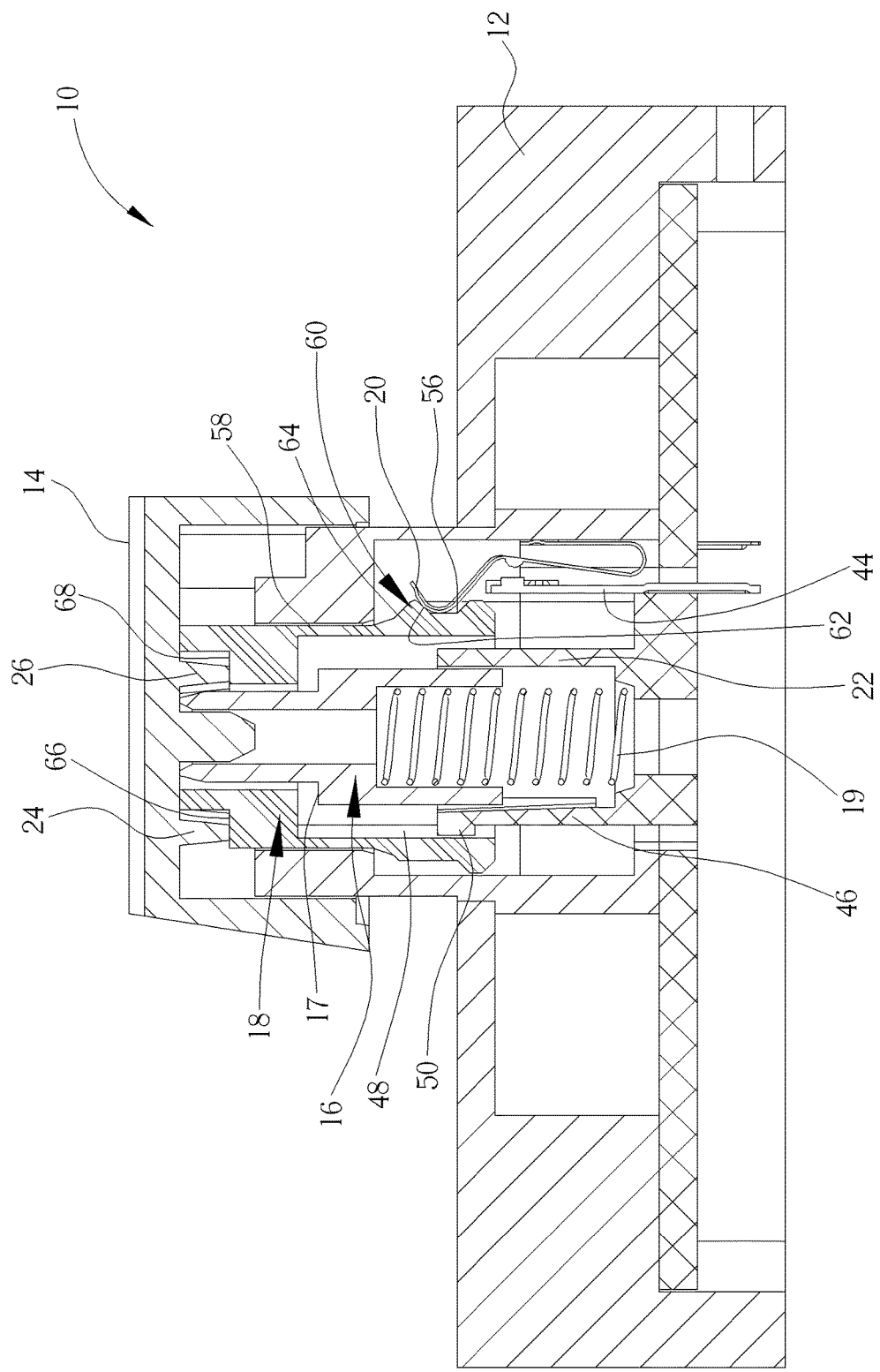
FIG. 16 is a cross-sectional diagram of the cap in FIG. 15 being pressed to make a first rib and a second rib contact top surfaces respectively.
Figure 17:
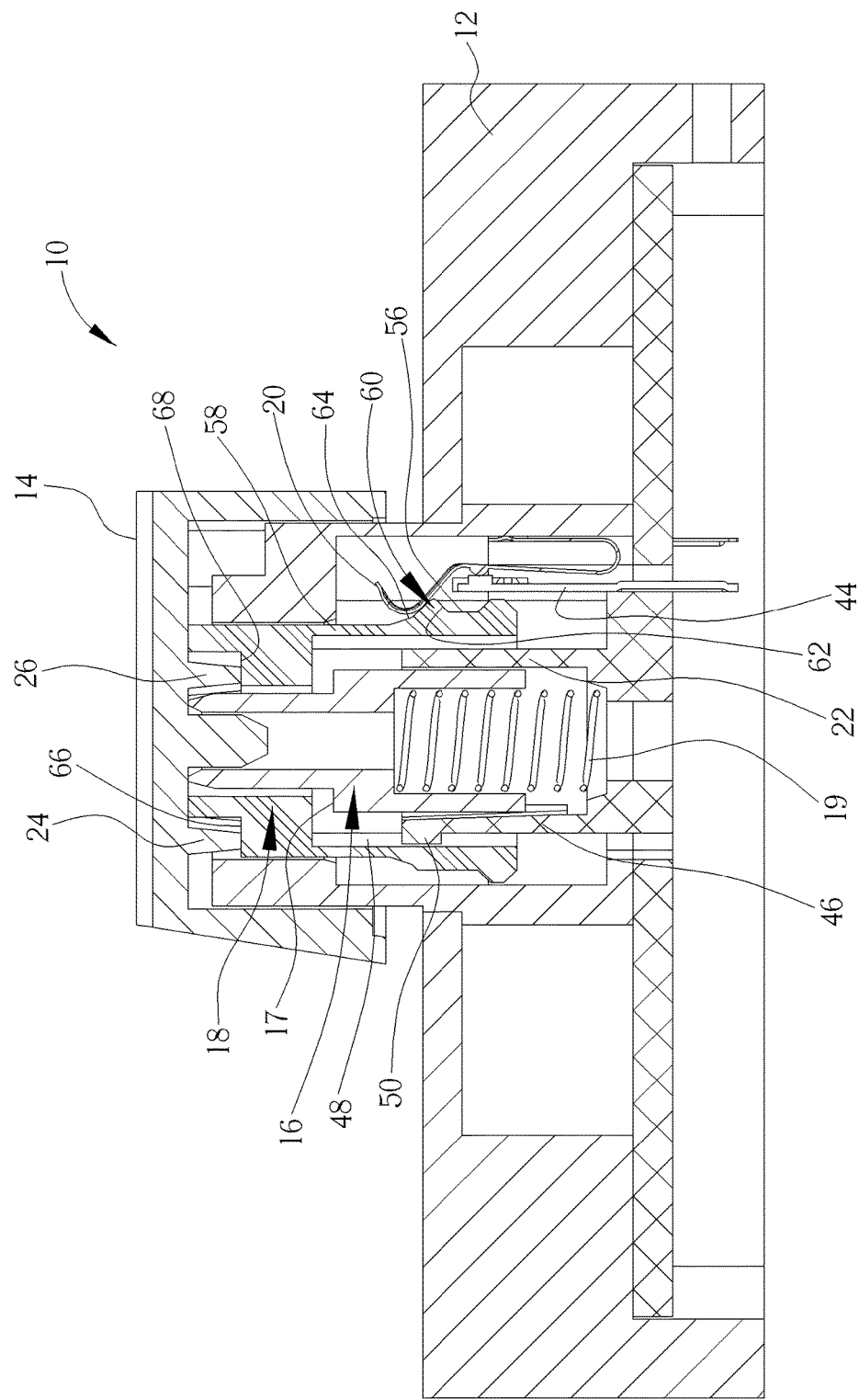
FIG. 17 is a cross-sectional diagram of the cap in FIG. 16 being pressed to make the resilient arm abut against an upper edge surface of an arc-shaped bar.
Figure 18:
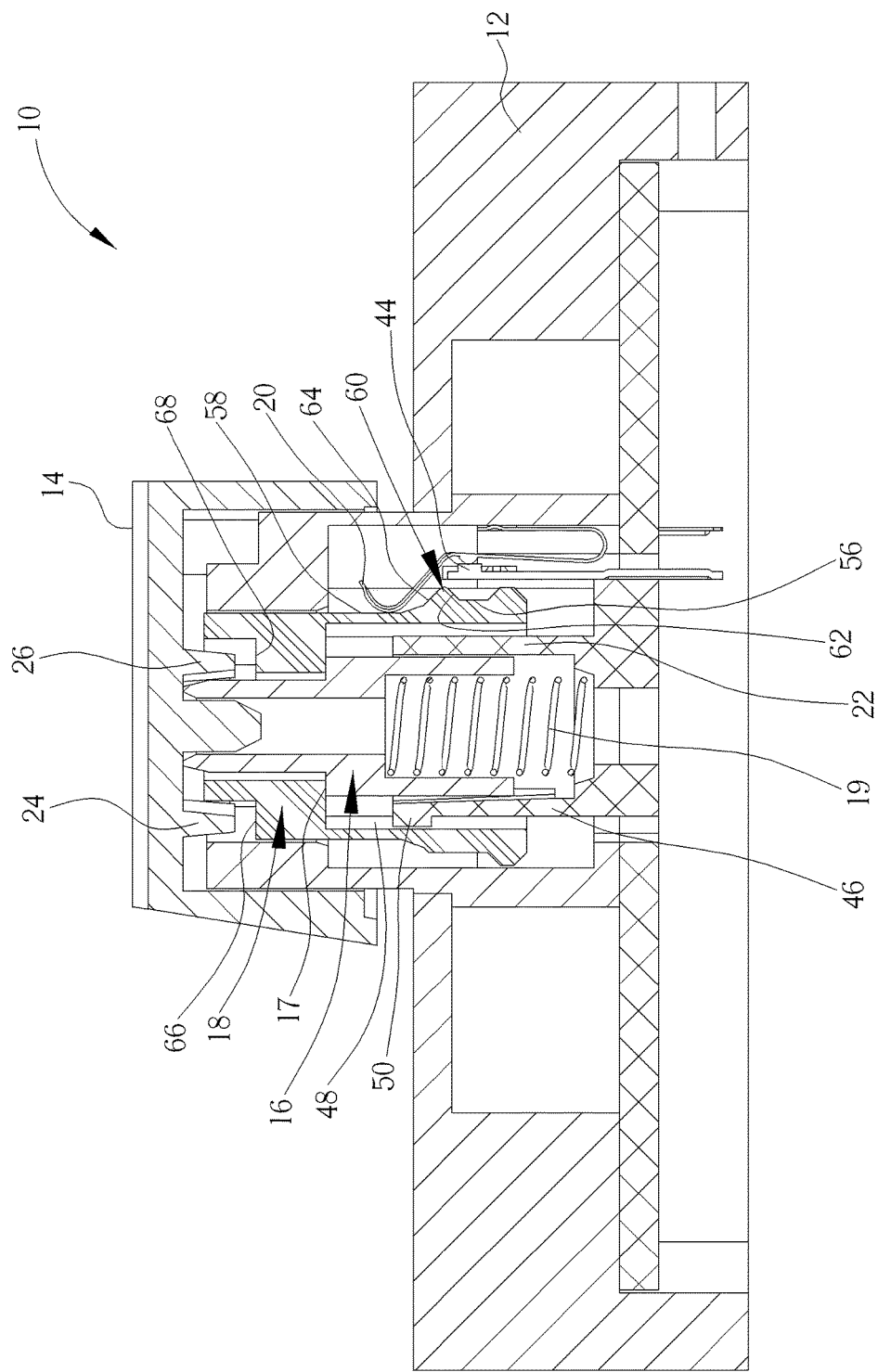
FIG. 18 is a cross-sectional diagram of the resilient arm in FIG. 17 driving the external sleeve to collide with a support surface of the internal sleeve for making a sound.
Figure 19:
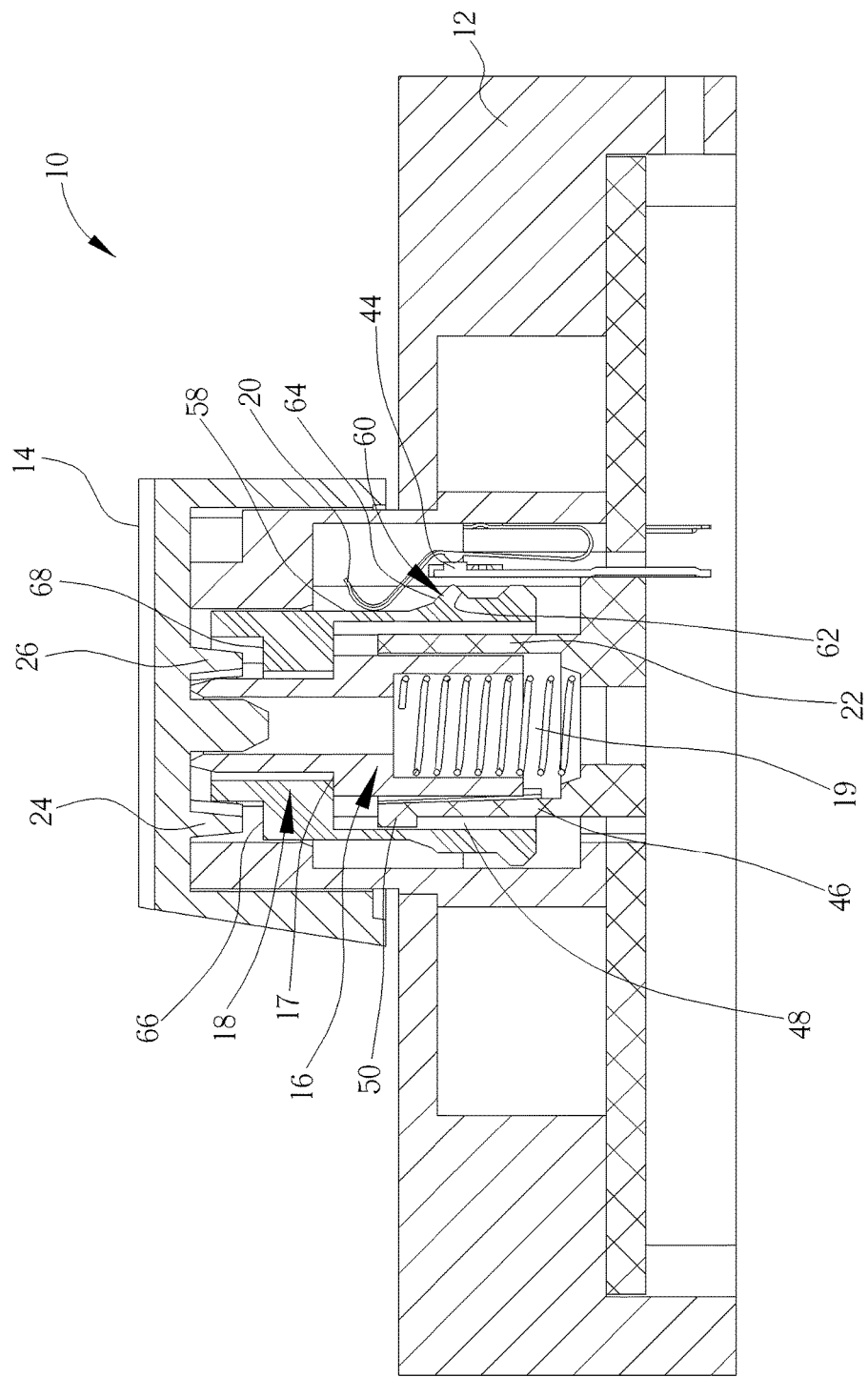
FIG. 19 is across-sectional diagram of the cap in FIG. 18 being pressed to the low position.

Please refer to FIG. 11, FIG. 14a, FIG. 14b, FIG. 15, FIG. 16, FIG. 17, FIG. 18, and FIG. 19. FIG. 14a is a partial exploded diagram of the keyswitch 10 in FIG. 11 when the external sleeve 18 continues rotating 90° (counterclockwise from a top view) to make the resilient arm 20 abut against the second convex portion 56. FIG. 14b is a top view of the external sleeve 18 in FIG. 14a (as shown in FIG. 14b, in this embodiment, the extending angle of the arc-shaped bar 60 is about equal to 180°, but not limited thereto). As shown in FIG. 2 and FIG. 14b, top surfaces 66, 68 could have the same height, the top surfaces 30, 34 could have the same height, and the top surfaces 32, 36 could have the same height, wherein the heights of the top surfaces 30, 34 could be larger than the heights of the top surfaces 66, 68, and the heights of the top surfaces 32, 36 are between the heights of the top surfaces 30, 34 and the heights of the top surfaces 66, 68. FIG. 15 is a cross-sectional diagram of the keyswitch 10 in FIG. 14a along a cross-sectional line D-D' when the cap 14 is located at the high position, only contacts the internal sleeve 16 and is separate from the top surfaces 66, 68 of the external sleeve 18 at a gap d. FIG. 16 is a cross-sectional diagram of the cap 14 in FIG. 15 being pressed to move a distance substantially equal to the gap D when the first rib 24 and the second rib 26 contact the top surface 66 and the top surface 68 respectively and the resilient arm 20 abuts against the bottom edge surface 62 (at this time, the resilient arm 20 blocks the external sleeve 18 but the internal sleeve 16 has already moved the distance substantially equal to the gap D, so as to make the internal sleeve 16 separate from the external sleeve 18). FIG. 17 is a cross-sectional diagram of the cap 14 in FIG. 16 being pressed to make the resilient arm 20 abut against the upper edge surface 64 of the arc-shaped bar 60. FIG. 18 is a cross-sectional diagram of the resilient arm 20 in FIG. 17 driving the external sleeve 18 to collide with the support surface 17 of the internal sleeve 16 for making a sound. FIG. 19 is a cross-sectional diagram of the cap 14 in FIG. 18 being pressed to the low position.

As shown in FIG. 14a, FIG. 14b, FIG. 15, FIG. 16, FIG. 17, FIG. 18, and FIG. 19, the external sleeve 18 could further have the top surface 66 and the top surface 68 opposite to each other. In this embodiment, the top surface 66, 68 could be preferably in an arc shape and lower than the top surfaces 30, 32, 34, and 36 along the Z-axis. When the user wants to switch the keyswitch 10 to provide a tactile feedback with a clicky sound, the user just needs to rotate the external sleeve 18 on the pillar 22 around the Z-axis (e.g. rotating the external sleeve 18 by the user's fingers or utilizing the adjusting tool 52 to rotate the external sleeve 18) to a position where the resilient arm 20 abuts against the second convex portion 56 under the arc-shaped bar 60 as shown in FIG. 14a and the cap 14 is separate from the external sleeve 18 at the gap d as shown in FIG. 15.

After the rotation operation of the external sleeve 18 is completed and the cap 14 is assembled with the base 12, the keyswitch 10 could provide a tactile feedback with a clicky sound when the user presses the cap 14. To be more specific, when the cap 14 is located at the high position as shown in FIG. 15 (at this time, the first rib 24 and the second rib 26 of the cap 14 are separate from the top surface 66 and the top surface 68 of the external sleeve 18 respectively at the gap d), the resilient arm 20 abuts against the second convex portion 56 to be separate from the contact point 44. When the cap 14 is pressed, the external sleeve 18 moves downward with the cap 14, so as to make the resilient arm 20 cross the arc-shaped bar 60 for moving from the second convex portion 56 to the second concave portion 58.

During the aforesaid process, when the downward moving distance of the cap 14 is less than the gap d (at this time, the cap 14 has not contacted the external sleeve 18 yet), the resilient arm 20 stops the external sleeve 18 from moving together with the cap 14 since the resilient arm 20 abuts against the bottom edge surface 62 of the external sleeve 18. Accordingly, the cap 14 could only drive the internal sleeve 16 to move downward, so as to make the external sleeve 18 separate from the support surface 17 of the internal sleeve (as shown in FIG. 16). Subsequently, when the downward moving distance of the cap 14 is larger than the gap d to make the resilient arm 20 cross the arc-shaped bar 60 to abut against the upper edge surface 64 instead (as shown in FIG. 17), the resilient arm 20 could move the external sleeve 18 downward to collide with the support surface 17 of the internal sleeve 16 for making a clicky sound (as shown in FIG. 18). In such a manner, the keyswitch 10 could provide a tactile feedback with a clicky sound. Finally, when the cap 14 is pressed to the low position as shown in FIG. 19 and the resilient arm 20 moves from the second convex portion 56 to the second concave portion 58, deformation of the resilient arm 20 is reduced to make the resilient arm 20 contact the contact point 44, so that the keyswitch 10 could perform a corresponding input function.

On the contrary, when the external sleeve 18 is rotated from the position where the resilient arm 20 abuts against the second convex portion 56 as shown in FIG. 14a to the position where the resilient arm 20 abuts against the first convex portion 40 as shown in FIG. 4 or FIG. 8, the external sleeve 18 abuts against the cap 14 without the gap d. Accordingly, when the cap 14 is pressed, the cap 14 could drive the internal sleeve 16 and the external sleeve 18 to move together, meaning that the external sleeve 18 does not collide with the internal sleeve 16 during the aforesaid process, so as to provide a tactile feedback without a clicky sound when the user presses the cap 14.

It should be mentioned that the switching design of the keyswitch provided by the present invention is not limited to the aforesaid embodiments (i.e. switching the keyswitch 10 from a tactile feedback with a small preload to a tactile feedback with a large preload, a clicky tactile feedback or a tactile feedback with a clicky sound). For example, in another embodiment that the design in which the rib of the cap could selectively abut against one of the top surfaces with different heights is omitted, the present invention could only adopt the design that the resilient arm abuts against the first convex portion or the second convex portion under the arc-shaped bar with rotation of the external sleeve, so as to switch the keyswitch to provide a clicky or non-clicky tactile feedback for simplifying the structural design of the keyswitch. As for other derived embodiments, the related description could be reasoned by analogy according to the aforesaid embodiments and omitted herein.

Furthermore, in another embodiment that the design in which the keyswitch could provide a tactile feedback with a clicky sound (e.g. utilizing the external sleeve to collide with the internal sleeve to generate the clicky sound) is omitted, the external sleeve could be formed with the internal sleeve integrally for simplifying the sleeve design of the keyswitch provided by the present invention.

Figure 20:
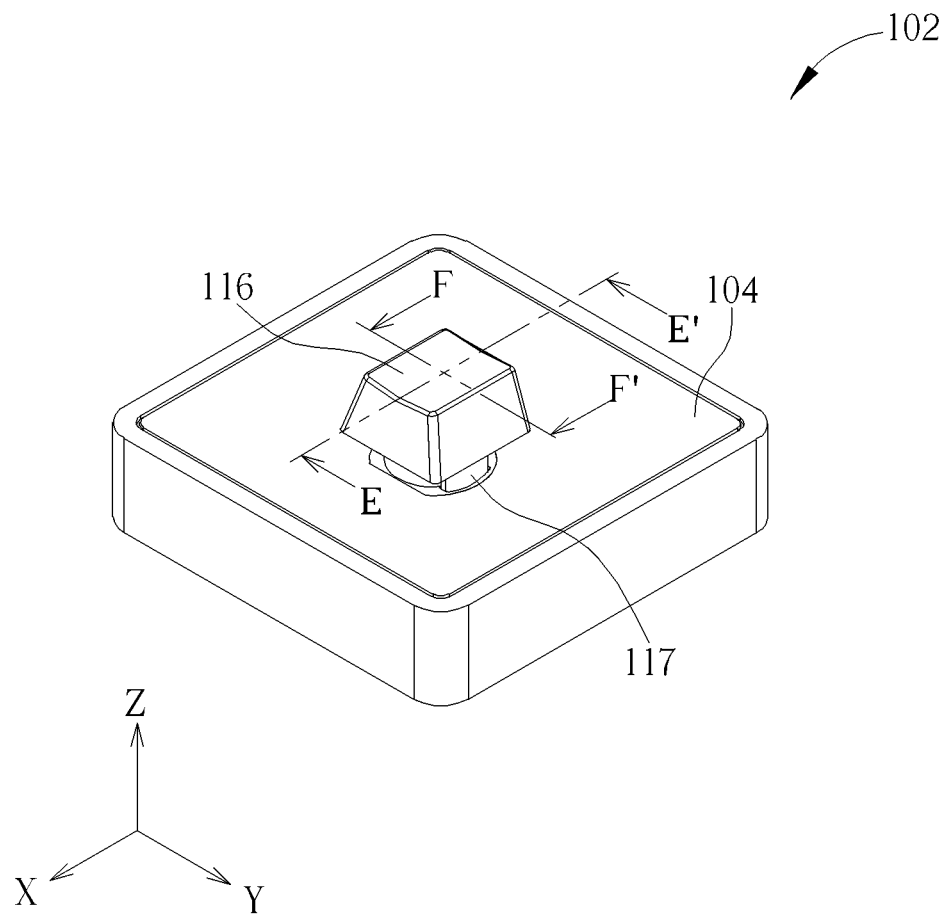
FIG. 20 is a diagram of a keyswitch according to another embodiment of the present invention.
Figure 21:
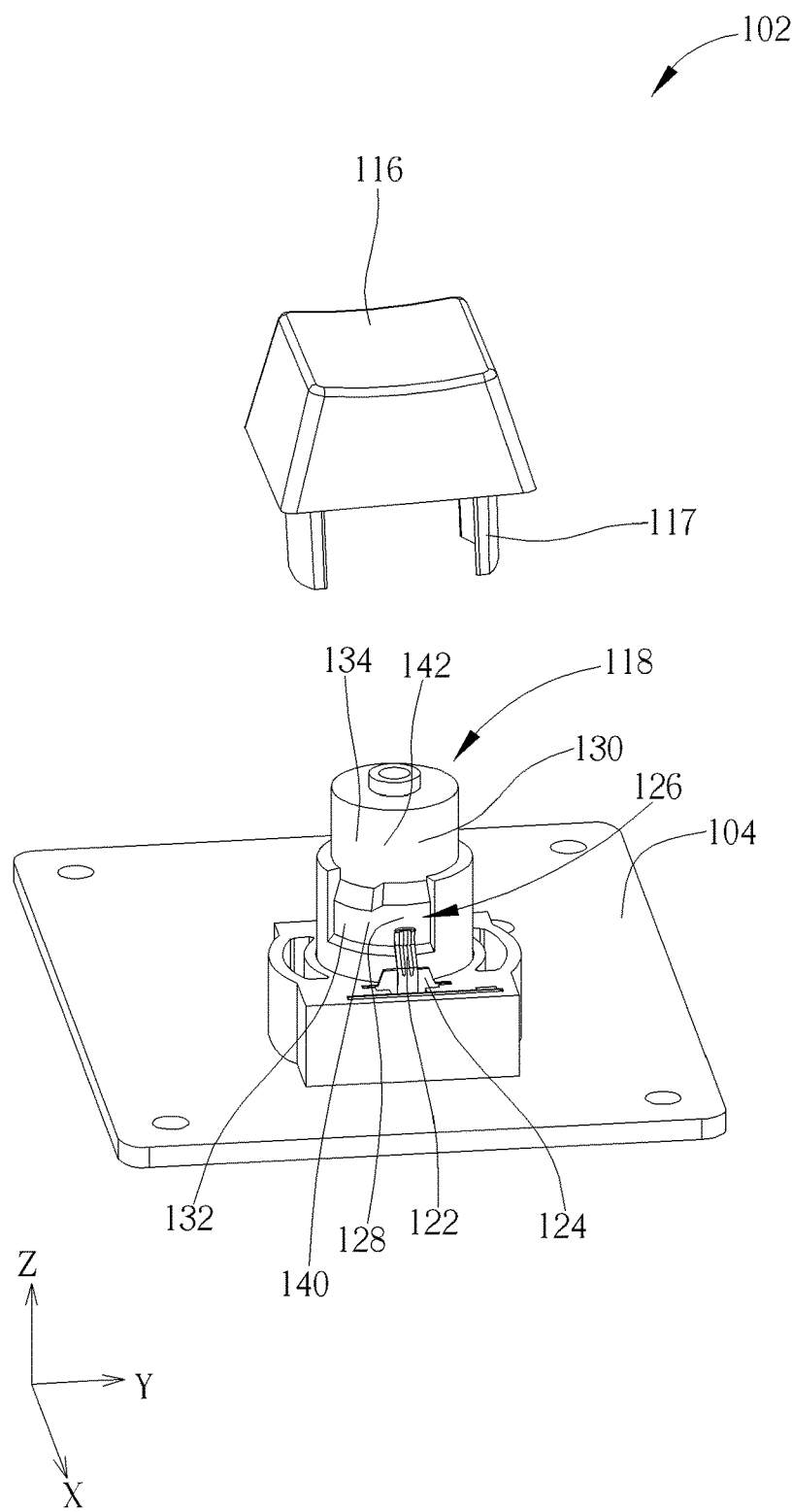
FIG. 21 is a partial exploded diagram of the keyswitch in FIG. 20.
Figure 22:
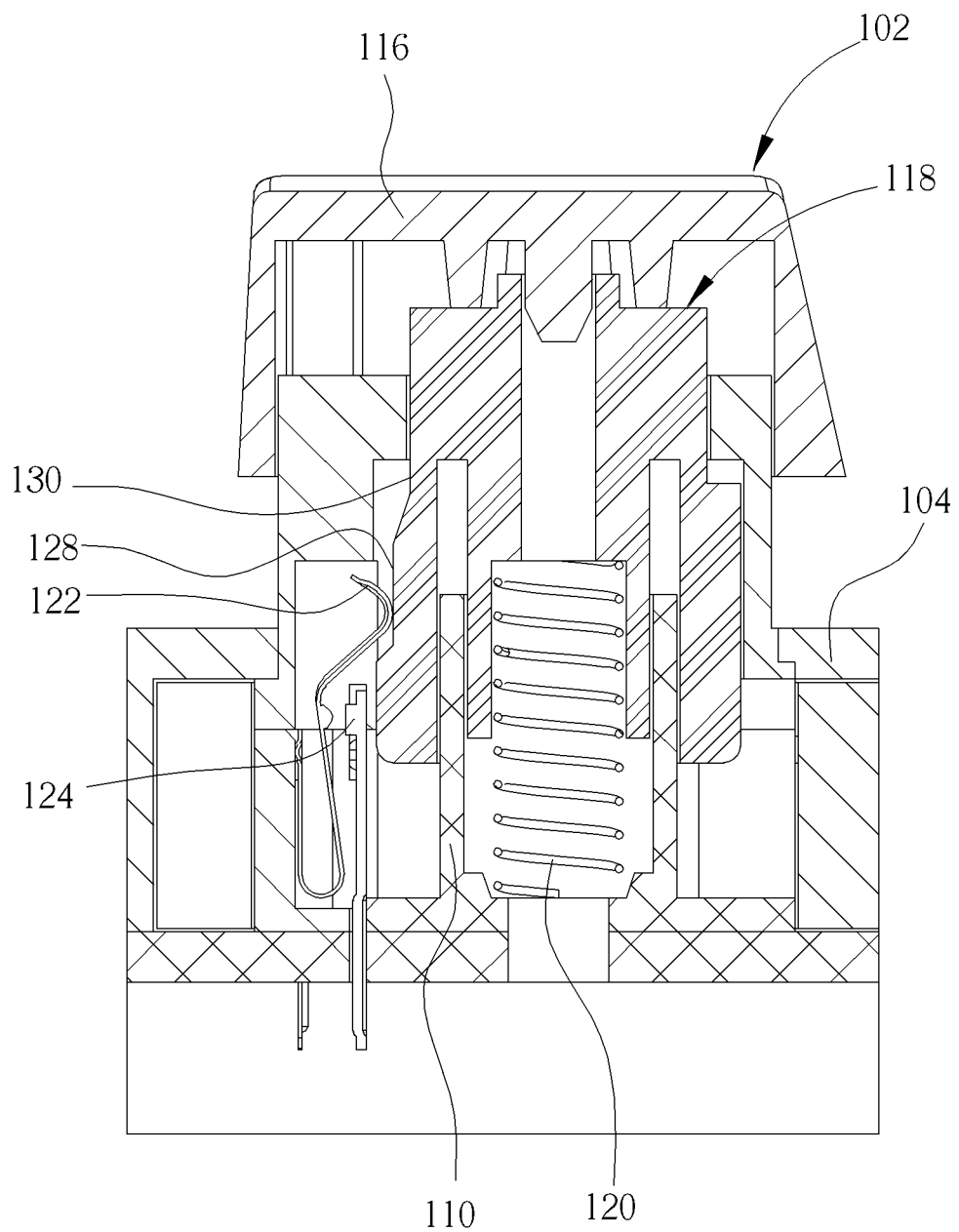
FIG. 22 is a cross-sectional diagram of the keyswitch in FIG. 20 along a cross-sectional line E-E'.
Figure 23:
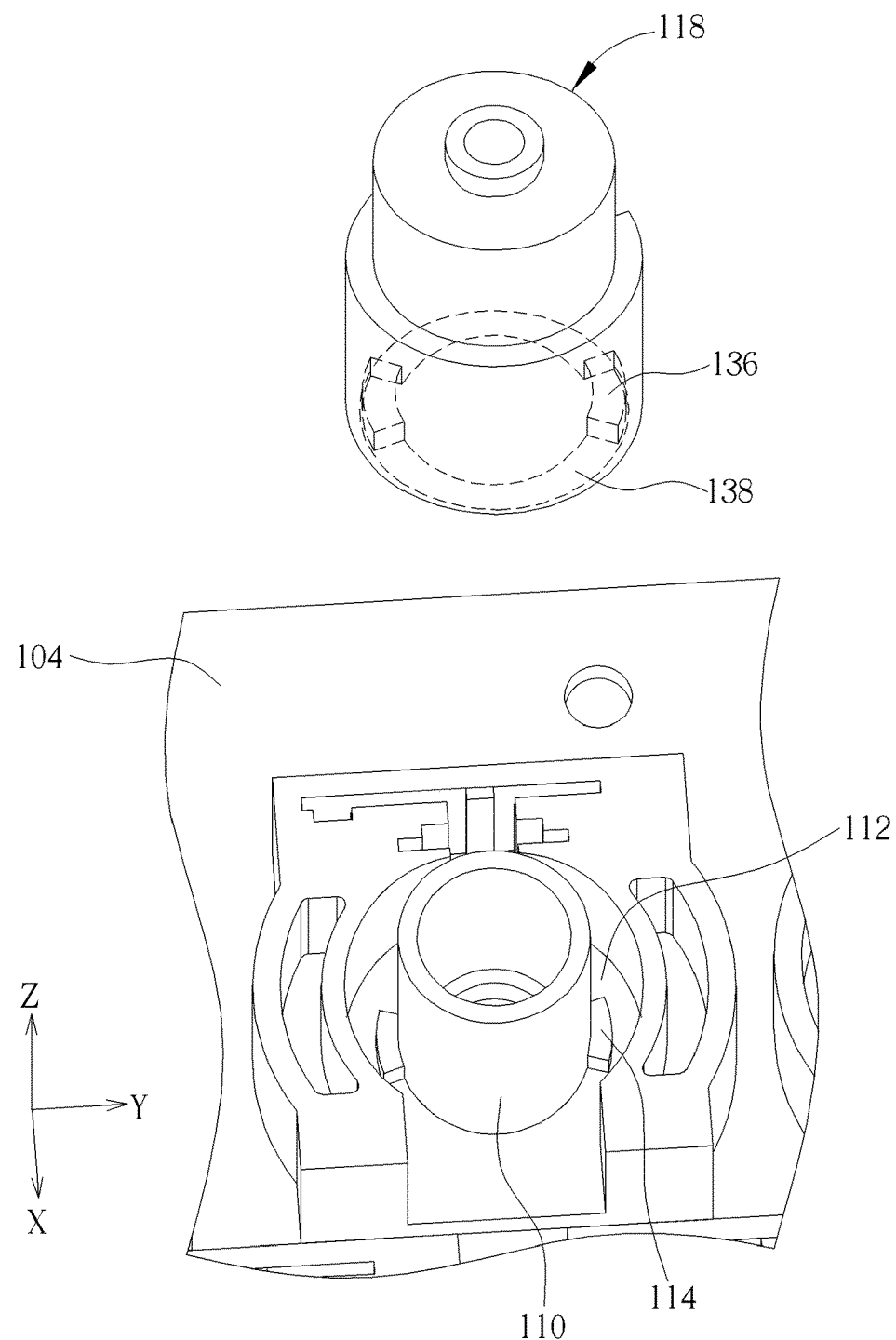
FIG. 23 is an exploded diagram of a sleeve and a base in FIG. 21.
Figure 24:
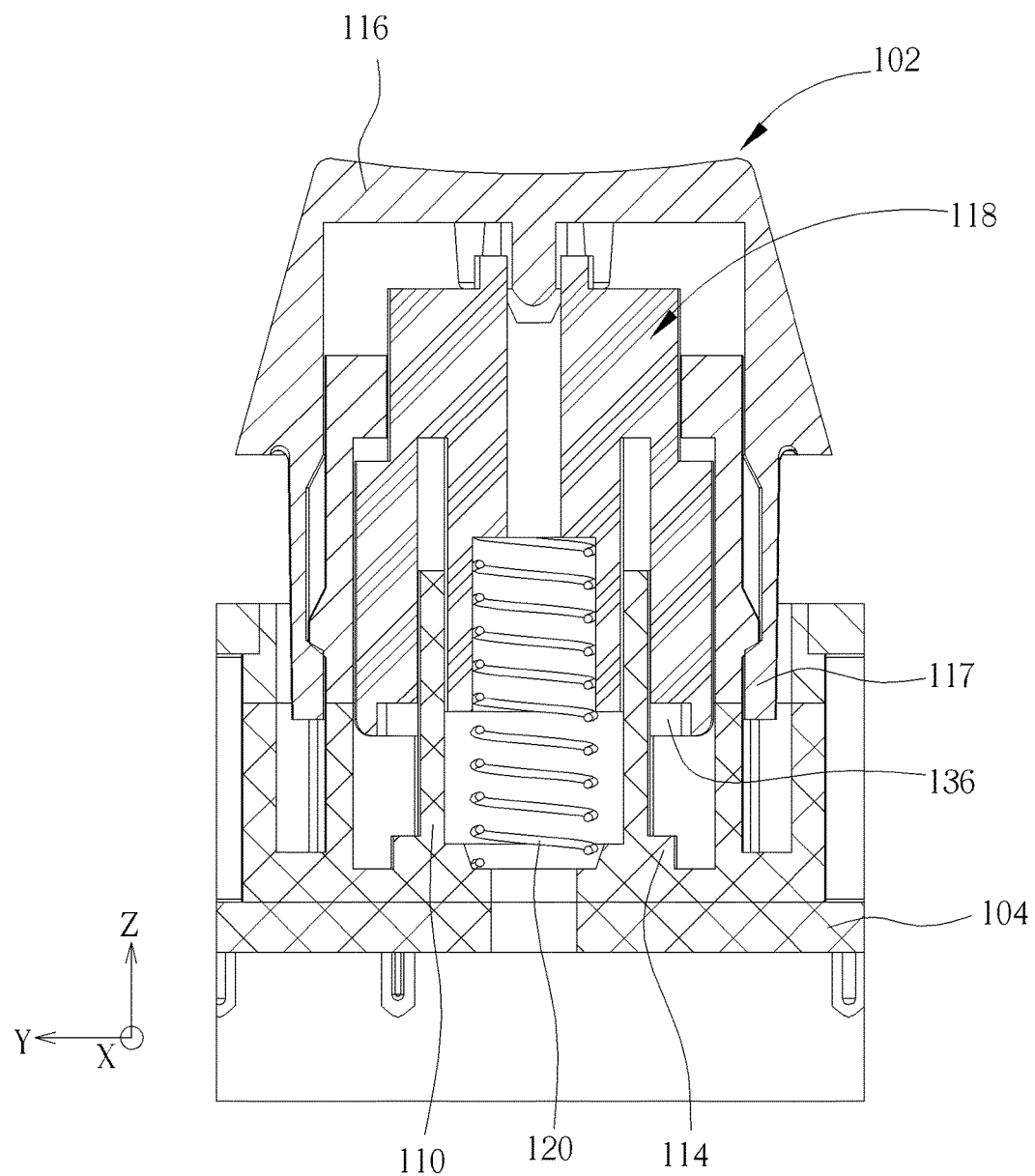
FIG. 24 is a cross-sectional diagram of the keyswitch in FIG. 20 along a cross-sectional line F-F'.
Figure 25:
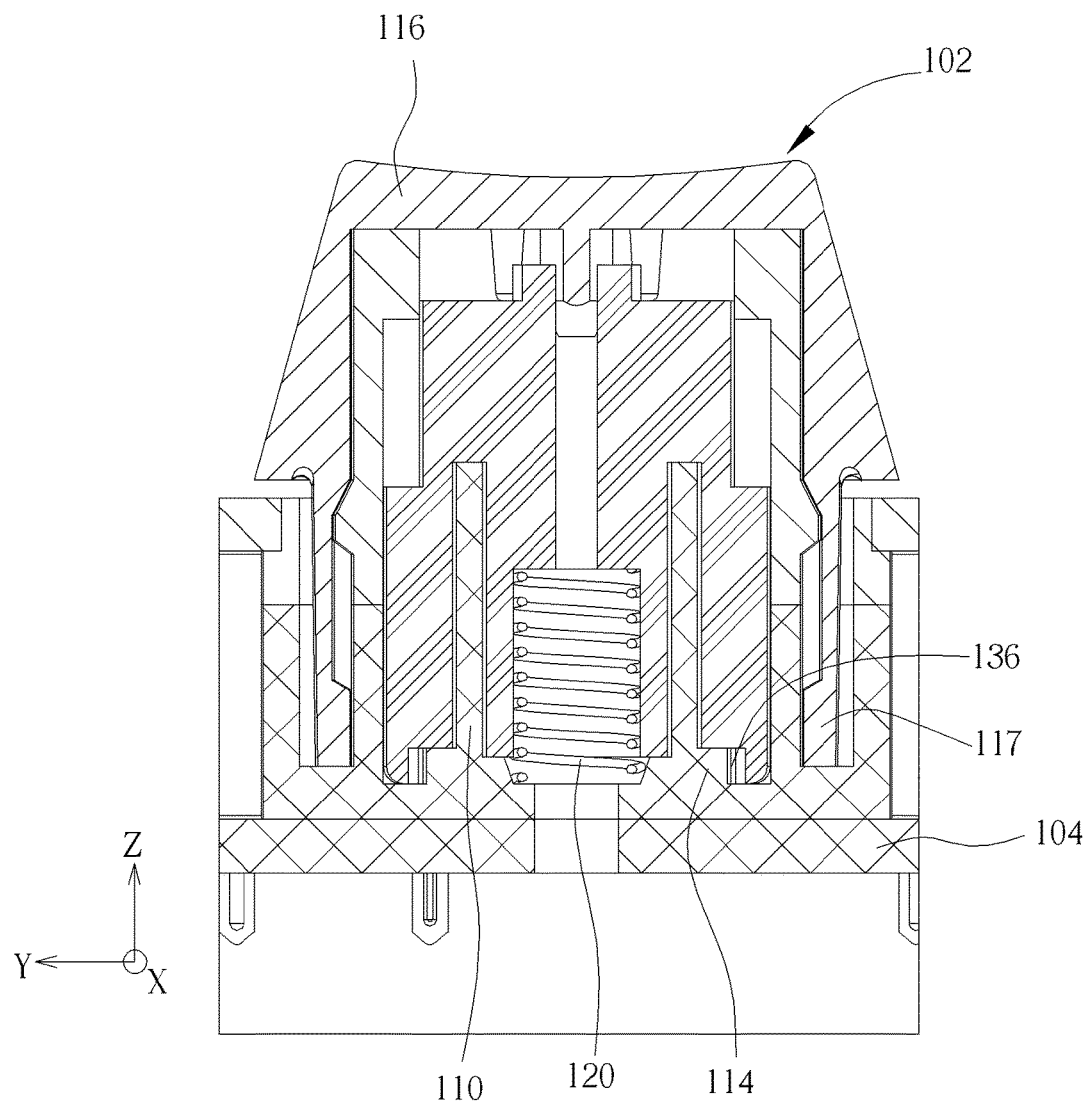
FIG. 25 is a cross-sectional diagram of a cap in FIG. 24 being pressed.
Figure 26:
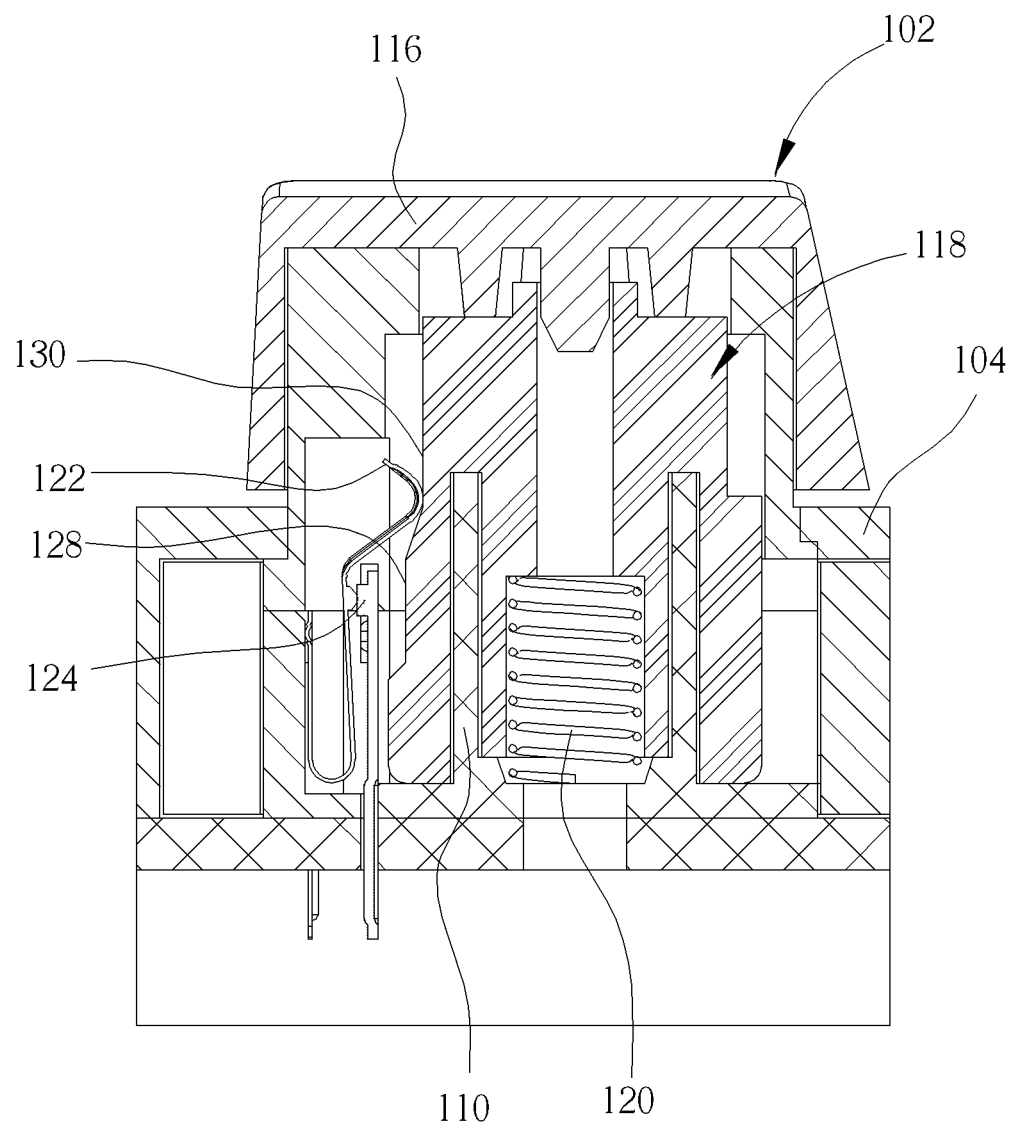
FIG. 26 is a cross-sectional diagram of the cap in FIG. 22 being pressed.
Figure 27:
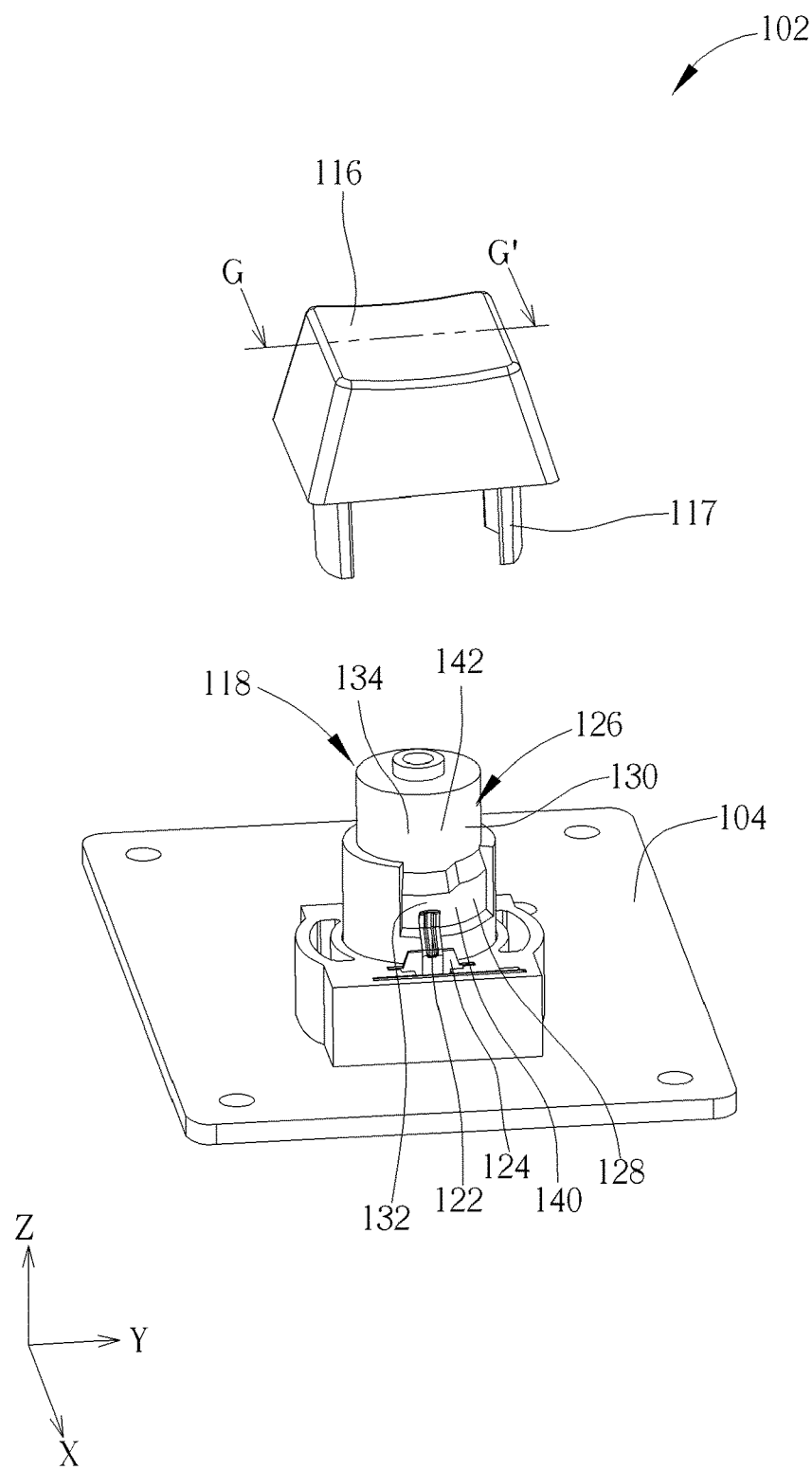
FIG. 27 is a diagram of the sleeve in FIG. 21 rotating relative to the base.
Figure 28:
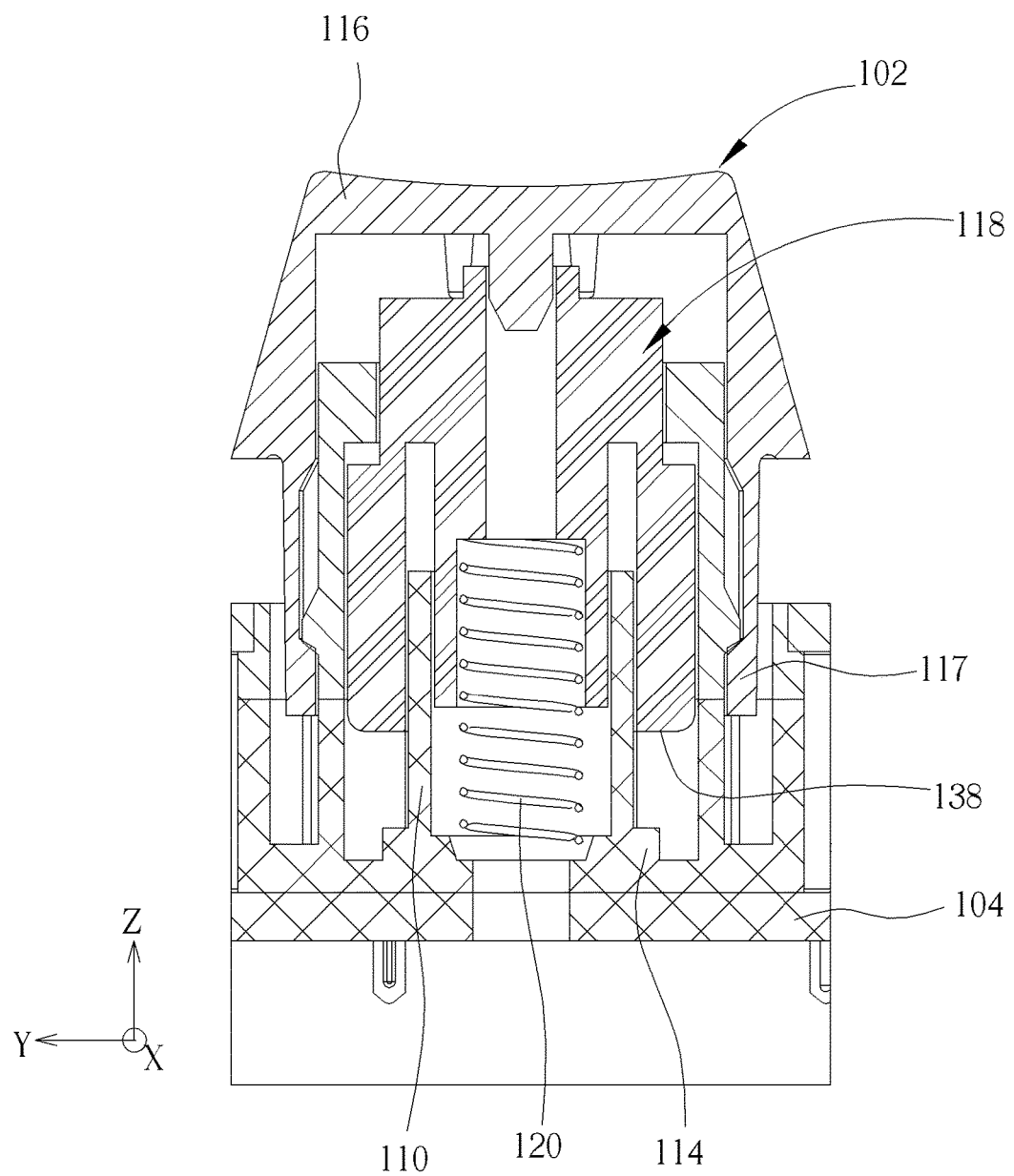
FIG. 28 is a cross-sectional diagram of the keyswitch in FIG. 27 along a cross-sectional line G-G'.
Figure 29:
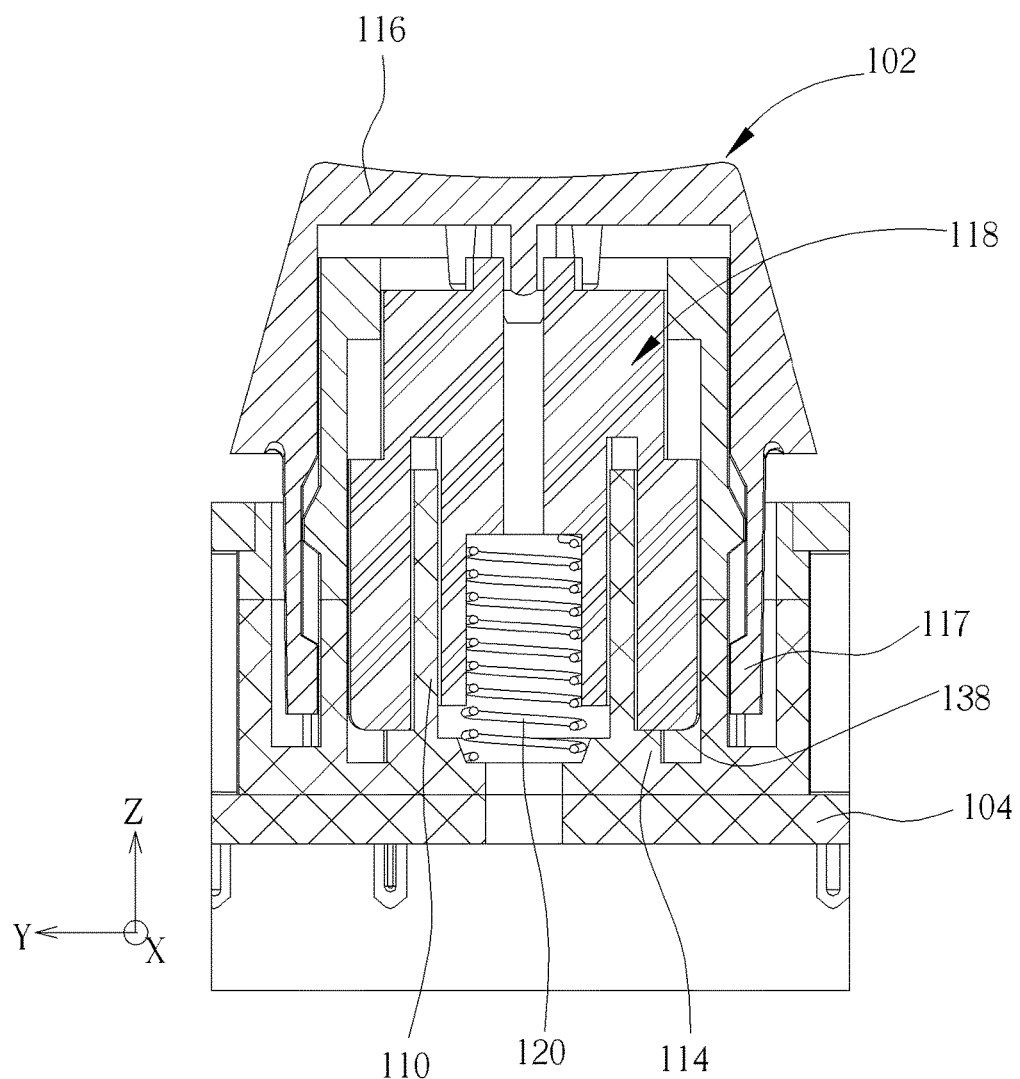
FIG. 29 is a cross-sectional diagram of a protruding block in FIG. 28 abutting against a bottom surface.

Please refer to FIG. 20, FIG. 21, FIG. 22, FIG. 23, FIG. 24, FIG. 25, FIG. 26, FIG. 27, FIG. 28, and FIG. 29. FIG. 20 is a diagram of a keyswitch 102 according to another embodiment of the present invention. FIG. 21 is a partial exploded diagram of the keyswitch 102 in FIG. 20. FIG. 22 is a cross-sectional diagram of the keyswitch 102 in FIG. 20 along a cross-sectional line E-E'. FIG. 23 is an exploded diagram of a sleeve 118 and a base 104 in FIG. 21. FIG. 24 is a cross-sectional diagram of the keyswitch 102 in FIG. 20 along a cross-sectional line F-F'. FIG. 25 is a cross-sectional diagram of a cap 116 in FIG. 24 being pressed. FIG. 26 is a cross-sectional diagram of the cap 116 in FIG. 22 being pressed. FIG. 27 is a diagram of the sleeve 118 in FIG. 21 rotating relative to the base 104. FIG. 28 is a cross-sectional diagram of the keyswitch 102 in FIG. 27 along a cross-sectional line G-G'. FIG. 29 is a cross-sectional diagram of a protruding block 114 in FIG. 28 abutting against a bottom surface 138. For clearly showing the internal mechanical design of the keyswitch 102, only the bottom half structure is depicted for the base 104 in FIGS. 21 and 27. In this embodiment, the base 104 has a pillar 110, a top surface 112, and the protruding block 114. The pillar 110 protrudes from the top surface 112 along the Z-axis. The protruding block 114 is adjacent to the pillar 110 and is higher than the top surface 112 along the Z-axis.

More detailed description for the mechanical design of the keyswitch 102 is provided as follows. As shown in FIGS. 20-29, the keyswitch 102 includes the base 104, the cap 116, the sleeve 118, an elastic member 120, a resilient arm 122 adjacent to the pillar 110, and a contact point 124. The cap 116 has a limiting arm 117 extending toward the base 104 along the Z-axis. The limiting arm 117 is movably connected to the base 104 to make the cap 116 movable upward and downward along the Z-axis between a high position and a low position. The sleeve 118 abuts against the cap 116 and rotatably sleeves the pillar 110. The sleeve 118 could have an outer annular surface 126. The outer annular surface 126 has a first convex portion 128, a first concave portion 130, a second convex portion 132, and a second concave portion 134. A groove 136 and a bottom surface 138 are formed on a bottom end of the sleeve 118. The sleeve 118 is rotatable on the pillar 110 around the Z-axis, so as to make the protruding block 114 selectively located under the groove 136 or the bottom surface 138.

In practical application, as shown in FIG. 21, the outer annular surface 126 could have an annular convex portion 140 and an annular concave portion 142. The annular convex portion 140 is connected to the first convex portion 128 and the second convex portion 132. The annular concave portion 142 is connected to the first concave portion 130 and the second concave portion 134. Accordingly, when the sleeve 118 rotates on the pillar 110 around the Z-axis, the resilient arm 122 slides from the first convex portion 128 to the second convex portion 132 along the annular convex portion 140 or slides from the first concave portion 130 to the second concave portion 134 along the annular concave portion 142 (it depends on whether the cap 116 is pressed), so as to make sliding of the resilient arm 122 on the sleeve 118 smooth. The elastic member 120 abuts against the sleeve 118 and the base 104 respectively for driving the sleeve 118 to move away from the base 104. The resilient arm 122 and the contact point 124 are opposite to each other and extend toward the cap 116 respectively. The resilient arm 122 and the contact point 124 are coupled to a circuit board of the keyswitch 102 (not shown in the figures).

To be more specific, when the cap 116 is located at the high position as shown in FIG. 22, the resilient arm 122 abuts against the first convex portion 128 to be separate from the contact point 128. When the cap 116 is pressed to the low position as shown in FIG. 26, the resilient arm 122 moves to abut against the first concave portion 130 instead. During this process, deformation of the resilient arm 122 is reduced to make the resilient arm 122 contact the contact point 124 for generating a corresponding input signal to the circuit board of the keyswitch 102, so that the keyswitch 102 could perform a corresponding input function. As shown in FIG. 21, the resilient arm 122 moves upward from the first convex portion 128 to the first concave portion 130 via a transition portion. As shown in FIG. 24 and FIG. 25, when the protruding block 114 is located under the groove 136 and the cap 116 is pressed along the Z-axis, the sleeve 118 moves downward accordingly until the protruding block 114 is contained in the groove 136. In such a manner, a maximum movable distance of the cap 116 along the Z-axis is set as a first travel distance, so as to provide a tactile feedback with a relatively long travel distance of the cap 116 when the user presses the keyswitch 102.

On the other hand, when the user wants to perform the travel distance adjusting operation of the keyswitch 102, the user just needs to rotate the sleeve 118 around the Z-axis from a position where the resilient arm 122 abuts against the first convex portion 128 as shown in FIG. 21 (at this time, as shown in FIG. 24, the protruding block 114 is located under the groove 136) to a position where the resilient arm 122 abuts against the second convex portion 132 as shown in FIG. 27 (at this time, as shown in FIG. 28, the protruding block 114 is located under the bottom surface 138). In such a manner, when the protruding block 114 is located under the bottom surface 138 and the cap 116 is pressed, the sleeve 118 moves downward along the Z-axis until the protruding block 114 abuts against the bottom surface 138 (as shown in FIG. 29). Accordingly, the maximum movable distance of the cap 116 along the Z-axis is set as the second travel distance. As shown in FIG. 24 and FIG. 28, the second travel distance is smaller than the first travel distance, so as to provide a tactile feedback with a relatively short travel distance of the cap 116 when the user presses the keyswitch 102. As shown in FIG. 27, the resilient arm 122 moves upward from the second convex portion 132 to the second concave portion 134 via the transition portion.

Figure 30:
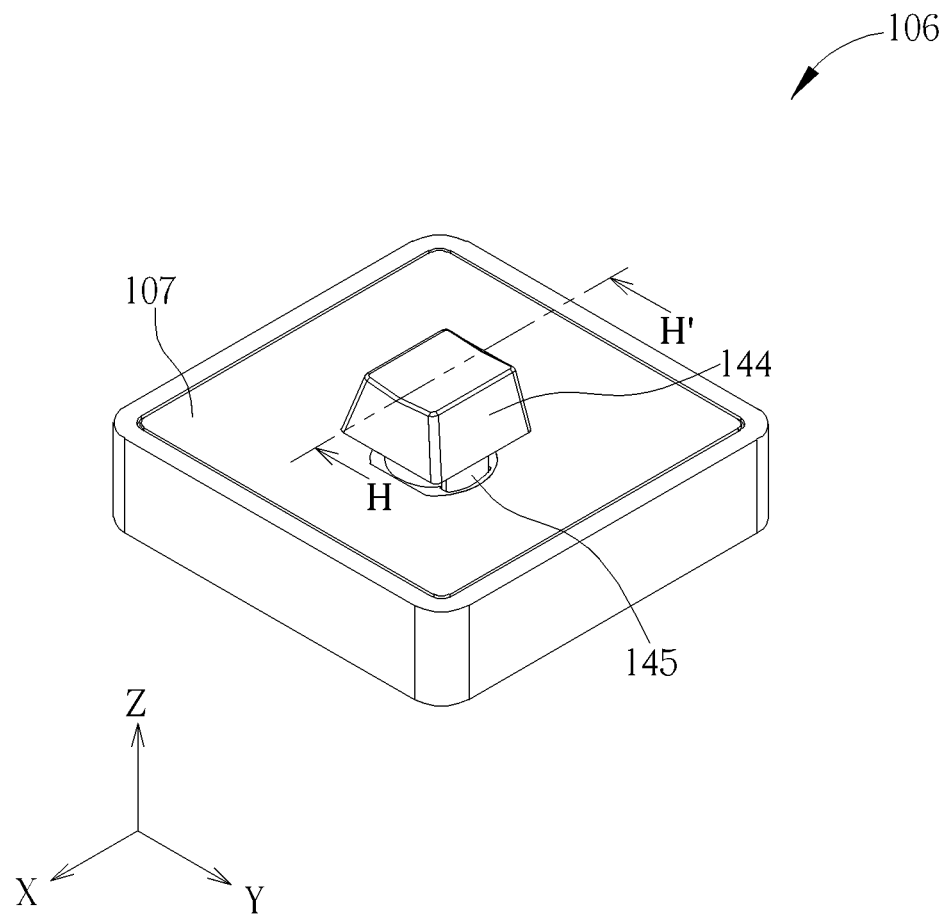
FIG. 30 is a diagram of a keyswitch according to another embodiment of the present invention.
Figure 31:
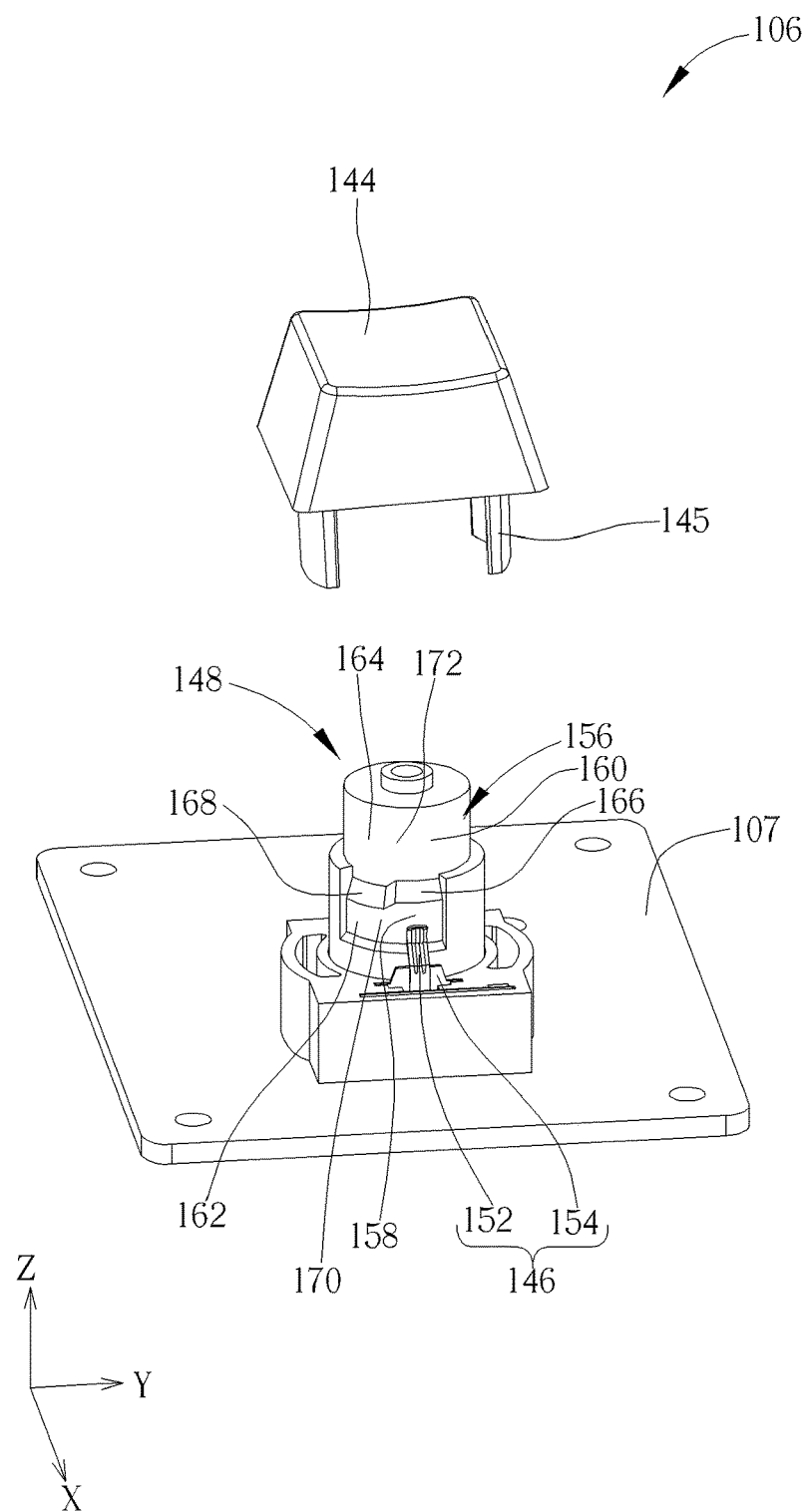
FIG. 31 is a partial exploded diagram of the keyswitch in FIG. 30.
Figure 32:
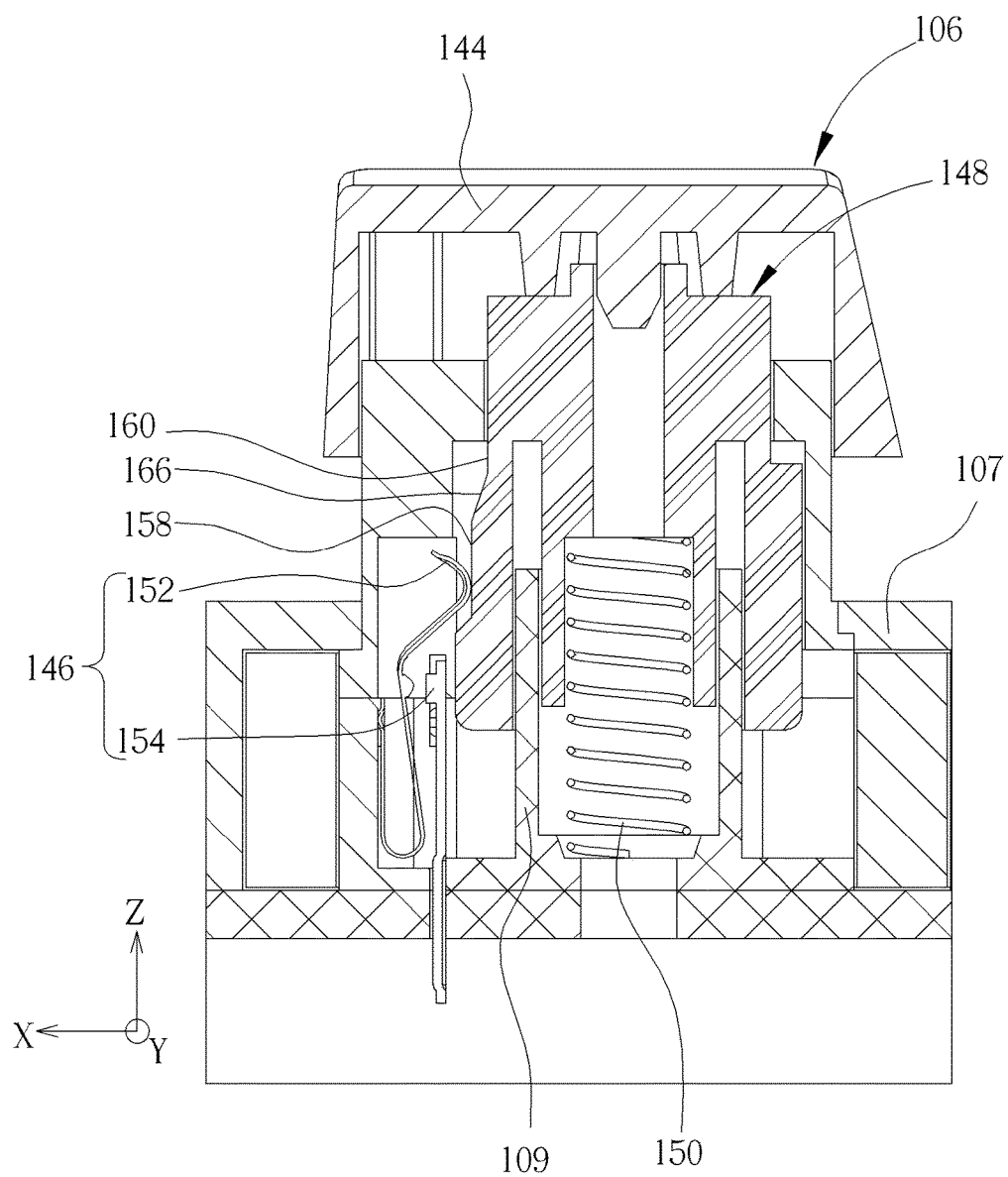
FIG. 32 is a cross-sectional diagram of the keyswitch in FIG. 30 along a cross-sectional line H-H'.
Figure 33:
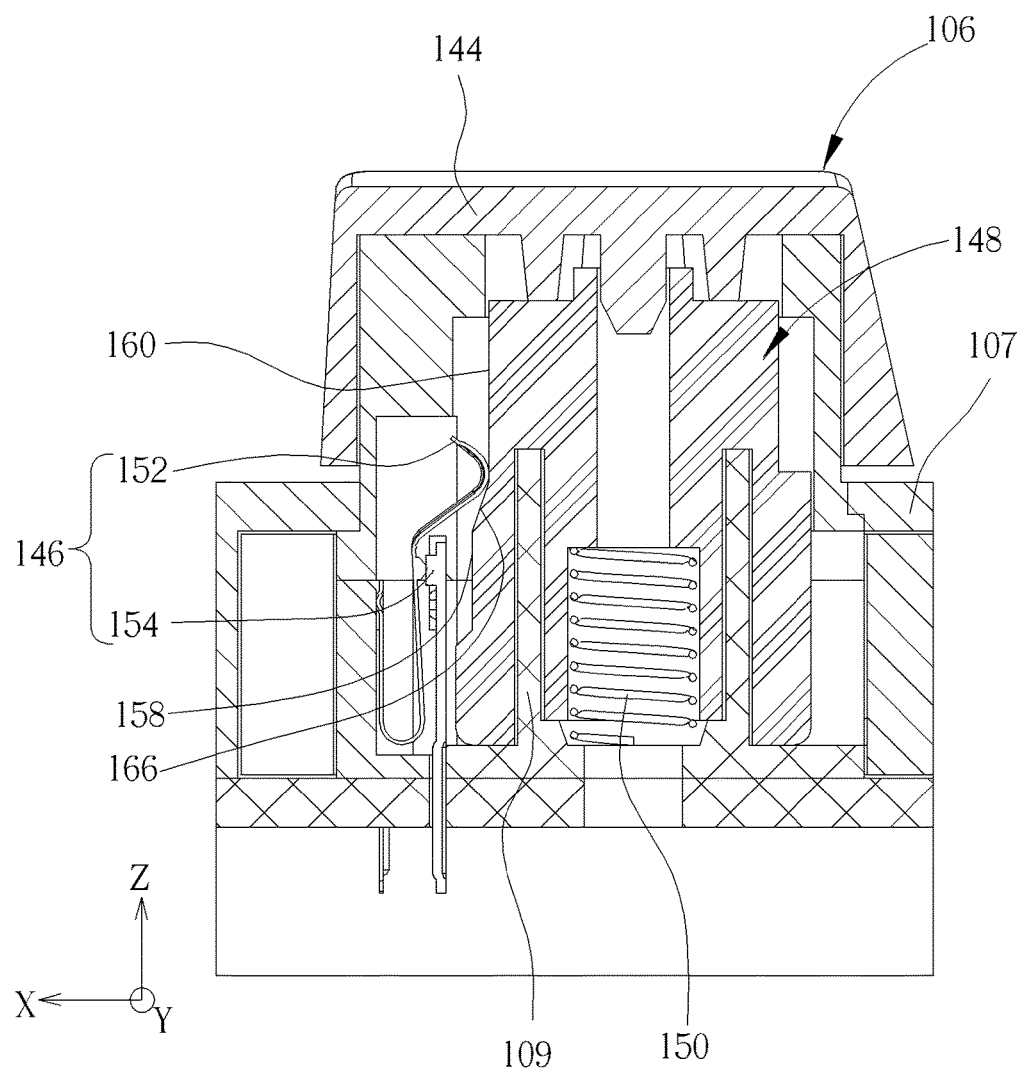
FIG. 33 is a cross-sectional diagram of a cap in FIG. 32 is pressed.
Figure 34:
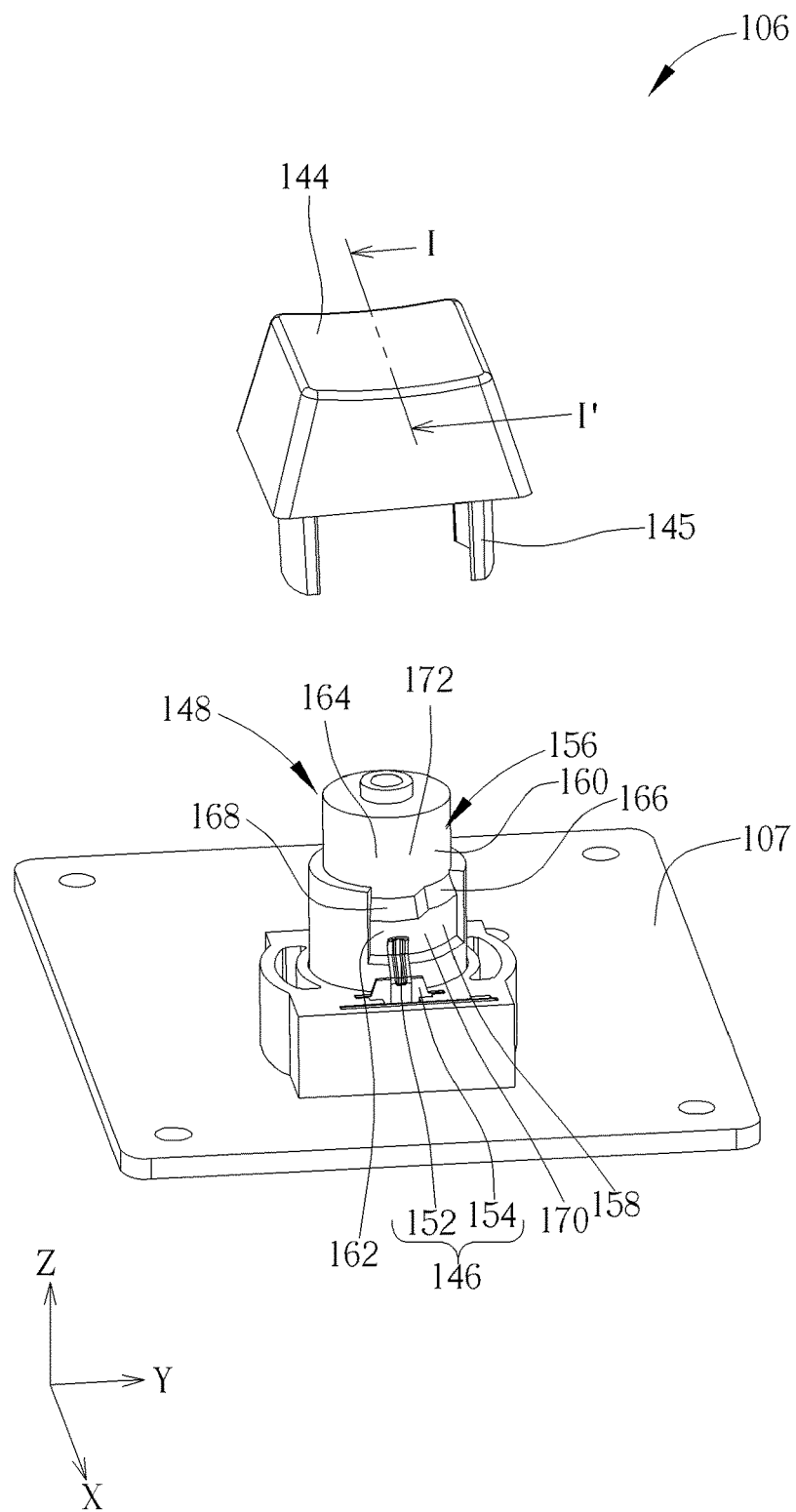
FIG. 34 is a diagram of a sleeve in FIG. 31 rotating relative to a base.
Figure 35:
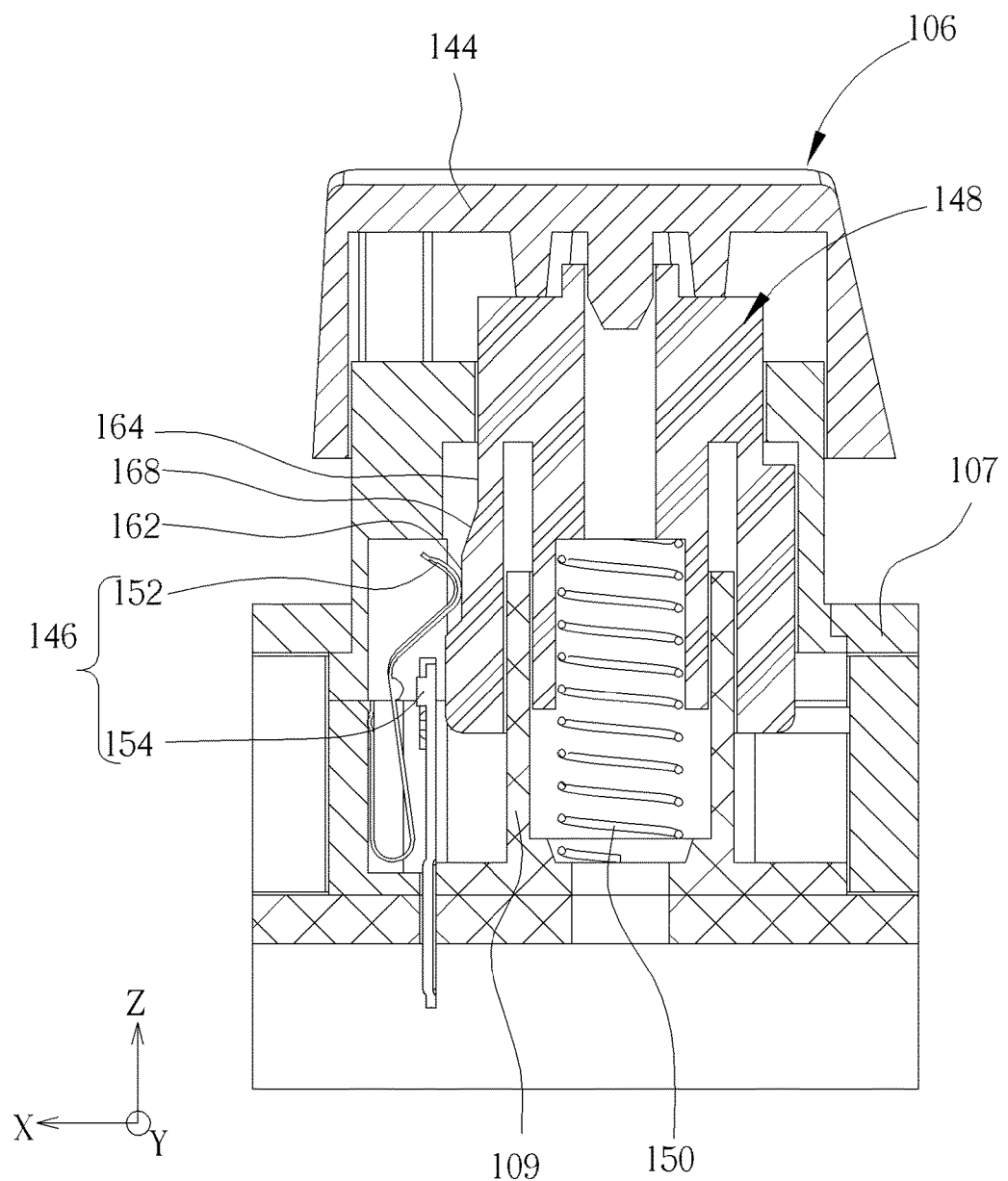
FIG. 35 is a cross-sectional diagram of the keyswitch in FIG. 34 along a cross-sectional line I-I'.
Figure 36:
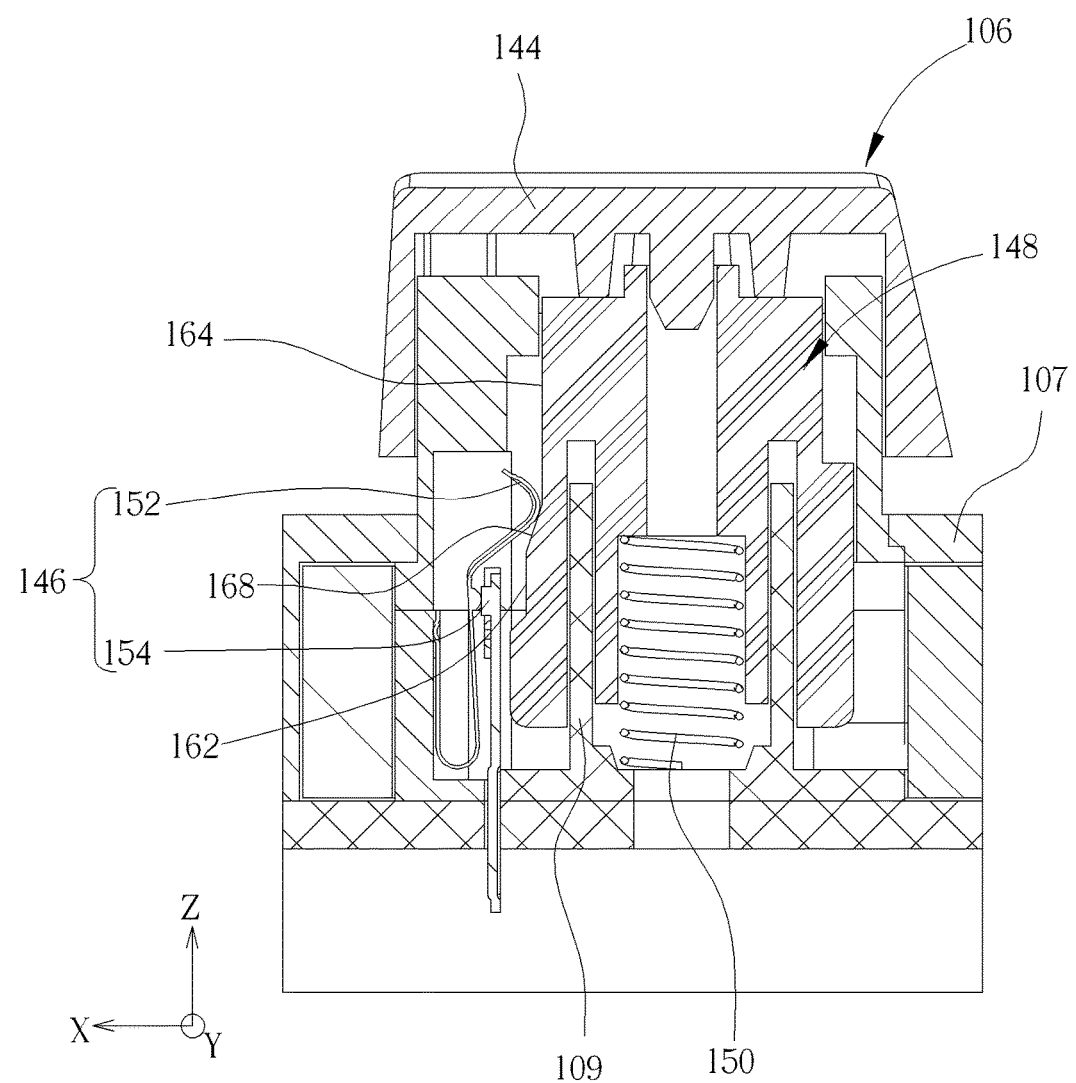
FIG. 36 is a cross-sectional diagram of the cap in FIG. 35 being pressed.

Please refer to FIG. 30, FIG. 31, FIG. 32, FIG. 33, FIG. 34, FIG. 35, and FIG. 36. FIG. 30 is a diagram of a keyswitch 106 according to another embodiment of the present invention. FIG. 31 is a partial exploded diagram of the keyswitch 106 in FIG. 30. FIG. 32 is a cross-sectional diagram of the keyswitch 106 in FIG. 30 along a cross-sectional line H-H'. FIG. 33 is a cross-sectional diagram of the cap 144 in FIG. 32 is pressed. FIG. 34 is a diagram of a sleeve 148 in FIG. 31 rotating relative to a base 107. FIG. 35 is a cross-sectional diagram of the keyswitch 106 in FIG. 34 along a cross-sectional line I-I'. FIG. 36 is a cross-sectional diagram of the cap 144 in FIG. 35 being pressed. For clearly showing the internal mechanical design of the keyswitch 106, only the bottom half structure is depicted for the base 107 in FIG. 31 and FIG. 34. In this embodiment, the base 107 has a pillar 109 extending along the Z-axis as shown in FIG. 32.

As shown in FIGS. 30-36, the keyswitch 106 includes the base 107, the cap 144, a switch unit 146, the sleeve 148, and an elastic member 150. The cap 144 has a limiting arm 145 extending toward the base 107 along the Z-axis. The limiting arm 145 is movably connected to the base 107 to make the cap 144 movable upward and downward along the Z-axis. The switch unit 146 is adjacent to the pillar 109 and has a resilient arm 152 and a contact point 154. The resilient arm 152 and the contact point 154 are opposite to each other and extend toward the cap 144 respectively. The switch unit 146 is used for electrically connecting to a circuit board (not shown in the figures) of the keyswitch 106. The sleeve 148 abuts against the cap 144 and rotatably sleeves the pillar 109. An outer annular surface 156 is formed on the sleeve 148 and has a first convex portion 158, a first concave portion 160, a second convex portion 162, a second concave portion 164, a first transition portion 166 and a second transition portion 168. As shown in FIG. 31, the first convex portion 158, the first transition portion 166, and the first concave portion 160 are arranged from down to up along the Z-axis, and the second convex portion 162, the second transition portion 168, and the second concave portion 164 are arranged from down to up along the Z-axis. The first transition portion 166 is higher than the second transition portion 168 along the Z-axis.

A first triggering position is defined by where the first transition portion 166 and the first concave portion 160 meet, and a second triggering position is defined by where the second transition portion 168 and the second concave portion 164 meet (but not limited thereto). That is to say, the first triggering position is higher than the second triggering position. In practical application, as shown in FIG. 31, the outer annular surface 156 could further have an annular convex portion 170 and an annular concave portion 172. The annular convex portion 170 is connected to the first convex portion 158 and the second convex portion 162, and the annular concave portion 172 is connected to the first concave portion 160 and the second concave portion 164. Accordingly, when the sleeve 148 rotates on the pillar 109, the resilient arm 152 slides from the first convex portion 158 to the second convex portion 162 along the annular convex portion 170 or slides from the first concave portion 160 to the second concave portion 164 along the annular concave portion 172 (it depends on whether the cap 144 is pressed), so as to make sliding of arm 152 on the sleeve 148 smooth. The elastic member 150 abuts against the sleeve 148 and the base 107 to drive the sleeve 148 to move away from the base 107.

To be more specific, when the cap 144 is located at the high position as shown in FIG. 32 and the resilient arm 152 abuts against the first convex portion 158, the resilient arm 152 abuts against the first convex portion 158 to be separate from the contact point 154. When the cap 144 is pressed to the low position as shown in FIG. 33, the resilient arm 152 moves upward from the first convex portion 158 to the first concave portion 160 via the first transition portion 166. During this process, deformation of the resilient arm 152 is reduced to make the resilient arm 152 move to the first triggering position as shown in FIG. 33 to trigger the contact point 154. In such a manner, a corresponding input signal could be transmitted to the circuit board of the keyswitch 106, so that the keyswitch 106 could perform a corresponding input function. Accordingly, since the resilient arm 152 triggers the contact point 154 at the first triggering position as shown in FIG. 33, the keyswitch 106 could provide a tactile feedback that the cap 144 is triggered at a relatively low triggering position when the user presses the keyswitch 106.

On the other hand, when the user wants to adjust the triggering position of the cap 144, the user just needs to rotate the sleeve 148 around the Z-axis from a position where the resilient arm 152 abuts against the first convex portion 158 as shown in FIG. 31 to a position where the resilient arm 152 abuts against the second convex portion 162 as shown in FIG. 34. In such a manner, when the cap 144 is located at the high position as shown in FIG. 35, the resilient arm 152 abuts against the second convex portion 162 to be separate from the contact point 154. When the cap 144 is pressed to the low position as shown in FIG. 36, the resilient arm 152 moves upward from the second convex portion 162 to the second concave portion 164 via the second transition portion 168. During this process, deformation of the resilient arm 152 is reduced to make the resilient arm 152 move to the second triggering position as shown in FIG. 36 to trigger the contact point 154. In such a manner, a corresponding input signal could be transmitted to the circuit board of the keyswitch 106, so that the keyswitch 106 could perform a corresponding input function.

As shown in FIG. 33 and FIG. 36, since the second transition portion 168 is lower than the first transition portion 166, the cap 144 just needs to move a shorter distance downward to make the resilient arm 152 abut against the contact point 154 at the second triggering position (at this time, the cap 144 is located at a relatively high triggering position). On the contrary, as shown in FIG. 33, the cap 144 needs to move a longer distance downward to make the resilient arm 152 abut against the contact point 154 at the first triggering position (at this time, the cap 144 is located at a relatively low triggering position). Accordingly, the keyswitch 106 allows that the user could switch the keyswitch 106 to provide a tactile feedback that the cap 144 is triggered at the relatively high triggering position or the relatively low triggering position during the user presses the keyswitch 106.

Figure 37:
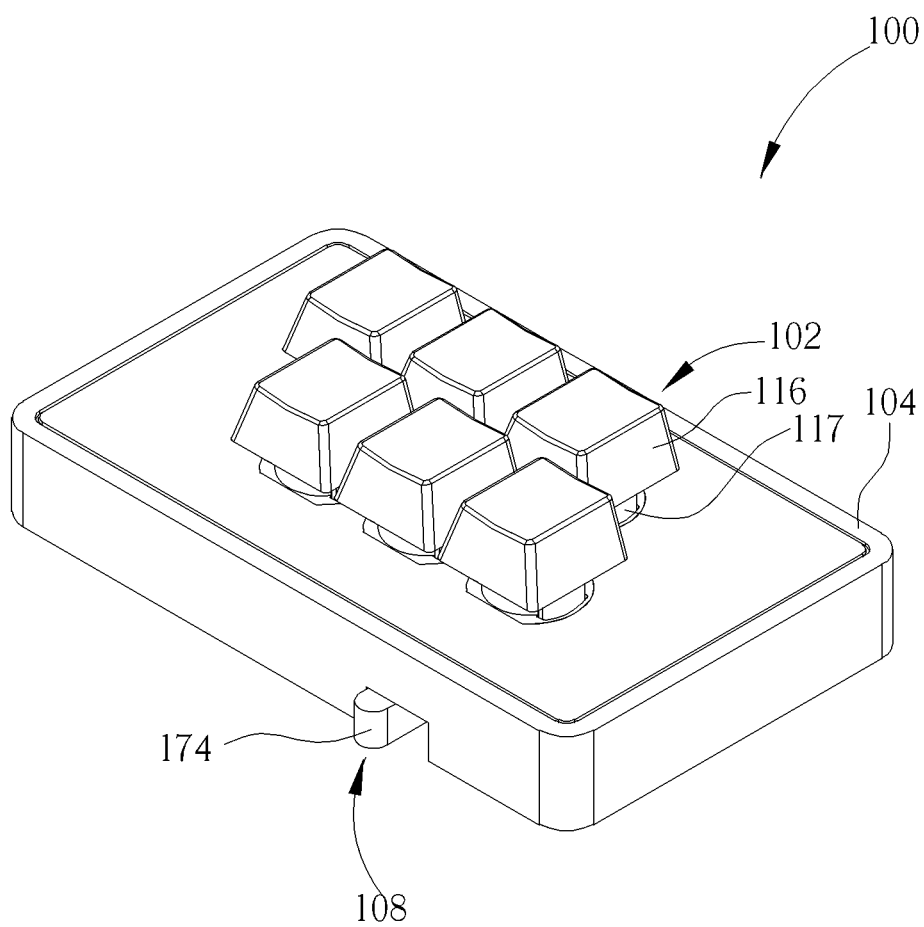
FIG. 37 is a diagram of a keyboard according to another embodiment of the present invention.
Figure 38:
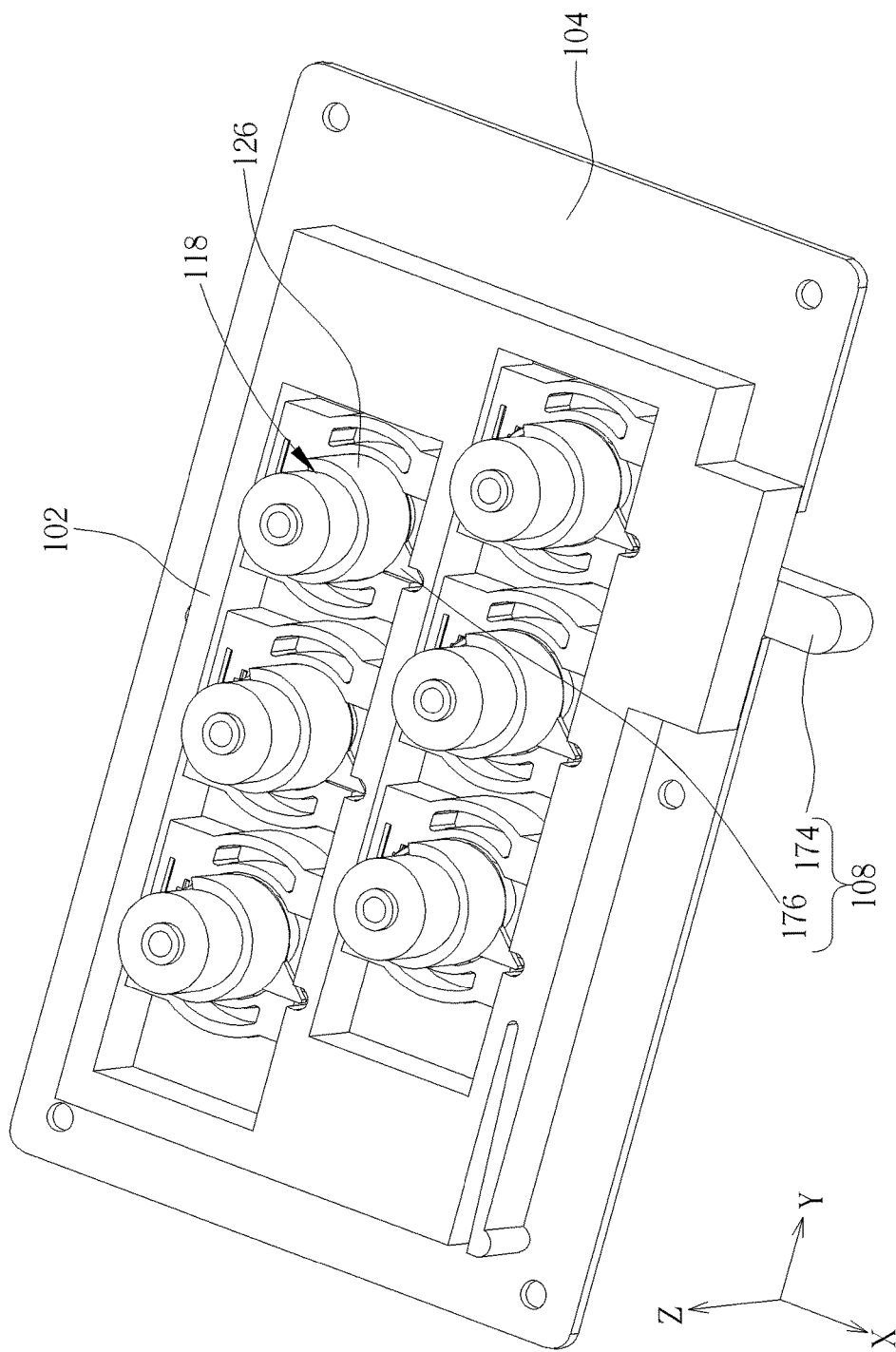
FIG. 38 is an internal enlarged diagram of the keyboard in FIG. 37.
Figure 39:
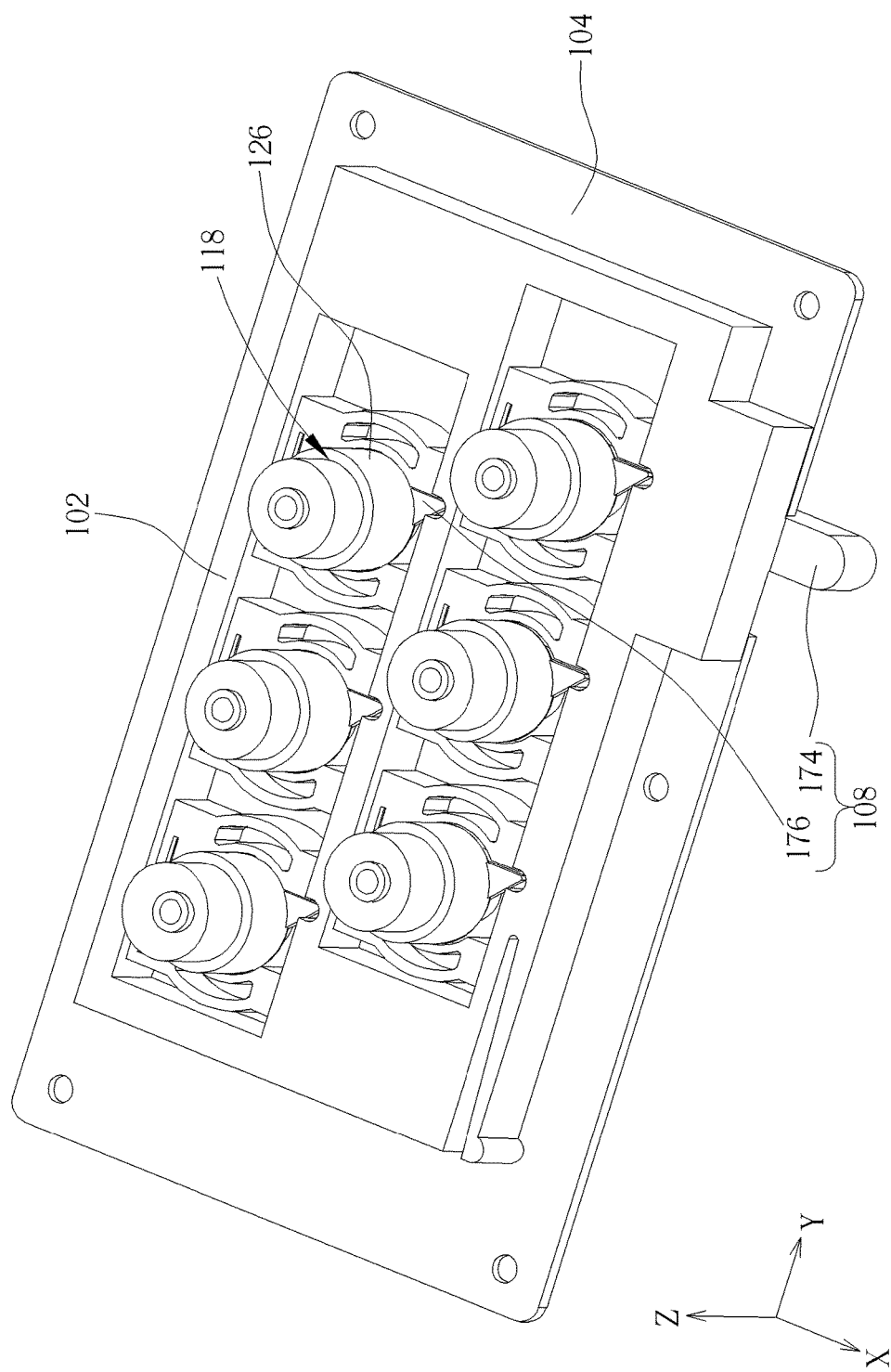
FIG. 39 is a diagram of a sliding plate of a linkage mechanism sliding relative to the base.

In practical application, the sleeve rotating design provided by the present invention is not limited to the aforesaid embodiments. More detailed description for the embodiment that the keyswitch 102 adopts a mechanical linkage design for performing the travel distance adjusting operation is provided as follows (but not limited thereto, meaning that the aforesaid mechanical linkage design could be applied to the keyswitch 10 or the keyswitch 106). Please refer to FIG. 37, FIG. 38, and FIG. 39. FIG. 37 is a diagram of a keyboard 100 according to another embodiment of the present invention. FIG. 38 is an internal enlarged diagram of the keyboard 100 in FIG. 37. FIG. 39 is a diagram of a sliding plate 174 of a linkage mechanism 108 sliding relative to the base 104. For clearly showing the internal mechanical design of the keyboard 100, only the bottom half structure is depicted for the base 104 in FIGS. 38 and 39. Components both mentioned in this embodiment and the aforesaid embodiments represent components with similar structures or functions, and the related description is omitted herein.

As shown in FIG. 37, FIG. 38, and FIG. 39, the keyboard 100 includes a plurality of keyswitches 102 (six as shown in FIG. 37, but not limited thereto), the base 104, and the linkage mechanism 108 is connected to the sleeve 118 for rotating the sleeve 118 relative to the base 104 around the Z-axis. In this embodiment, the linkage mechanism 108 could include a sliding plate 174 and a linkage member 176. The sliding plate 174 could slide relative to the base 104. The linkage member 176 extends outward from the outer annular surface 126 of the sleeve 118 to be movably connected to the sliding plate 174 (as shown in FIG. 38 and FIG. 39). Via the aforesaid linkage design, when the user wants to perform the travel distance adjusting operation of the keyswitch 102, the user just needs to drive the sliding plate 174 to slide relative to the base 104 to a position as shown in FIG. 38 or a position as shown in FIG. 39, for rotating the sleeve 118 around the Z-axis via the linkage member 176. In such a manner, when the user presses the keyswitch 102, the keyswitch 102 could provide a tactile feedback as mentioned in the aforesaid embodiments, such as a tactile feedback with a relatively long or short travel distance of the cap.

To be noted, the present invention could omit the cap to provide a switch with different tactile feedbacks. For example, in another embodiment, a switch provided by the present invention could include a base, a resilient arm, a sleeve, and an elastic member. The sleeve rotatably sleeves a positioning structure (e.g. a pillar) of the base and has an outer annular surface. The outer annular surface has a first large radius portion, a first small radius portion, a second large radius portion, and a second small radius portion (e.g. the first convex portion, the first concave portion, the second convex portion, and the second concave portion). The sleeve could rotate on the positioning structure to make the resilient arm selectively abut against the first large radius portion or the second large radius portion.

In such a manner, when the resilient arm abuts against the first large radius portion and the sleeve moves downward, the resilient arm moves from the first large radius portion to the first small radius portion along a first path (e.g. the first transition portion), so as to make the first path interact with the resilient arm to generate a first tactile feedback (e.g. a tactile feedback that the cap is triggered at a relatively low triggering position when the user presses the switch). When the resilient arm abuts against the second large radius portion and the sleeve moves downward, the resilient arm moves from the second large radius portion to the second small radius portion along a second path (e.g. the second transition portion), so as to make the second path interact with the resilient arm to generate a second tactile feedback (e.g. a tactile feedback that the cap is triggered at a relatively high triggering position when the user presses the switch).

The first path is different from the second path to make the first tactile feedback different from the second tactile feedback.

On the other hand, when the sleeve is released, the elastic member drives the sleeve to move upward, so as to make the resilient arm move back to abut against the first large radius portion or the second large radius portion. As for the related description for other related designs (e.g. disposal of the contact point, the linkage mechanism, or the adjusting tool, the rotating design that the sleeve rotatably sleeves the positioning structure, etc.) and other derived embodiments (e.g. the design that the resilient arm crosses the arc-shaped bar to generate a clicky tactile feedback, the design that the external sleeve collides with the internal sleeve to generate a clicky sound, etc.), it could be reasoned by analogy according to the aforementioned embodiments and omitted herein.

Furthermore, the design that the rib of the cap could abut against the top surface of the sleeve for prepressing the elastic member, the design that the protruding block of the base could be contained in the groove of the sleeve or abut against the bottom surface of the sleeve to change the travel distance of the cap, the design that the resilient arm could abut against different triggering positions of the sleeve, the design that the resilient arm could cross the arc-shaped bar to generate a clicky tactile feedback, and the design that the external sleeve could collide with the internal sleeve to make a clicky sound could be applied to each other, so that the keyswitch and the switch thereof provided by the present invention could provide a tactile feedback adjusting function via the multi-stage rotating operation of the sleeve (e.g. the four-stage or two-stage rotating operation mentioned in the aforesaid embodiment).

For example, in another embodiment, the present invention could adopt the design that the user could perform the sleeve rotating operation to make the rib of the cap abut against the top surface of the sleeve for prepressing the elastic member and make the protruding block of the base located under the groove of the sleeve so that the keyswitch could provide a tactile feedback with a large preload and a long travel distance of the cap during the user presses the keyswitch. In another embodiment, the present invention could adopt the design that the user could perform the sleeve rotating operation to make the resilient arm trigger the contact point at a low triggering position and make the external sleeve collide with the internal sleeve so that the keyswitch could make a clicky sound and provide a tactile feedback that the cap is triggered at a high triggering position during the user presses the keyswitch.

Compared with the prior art only providing one single kind of tactile feedback without a tactile feedback adjusting function, the present invention adopts the design that the sleeve could rotate relative to the base for performing the tactile feedback adjustment operation of the keyswitch to generate the inventive effect that the user could switch the keyswitch to provide a desired tactile feedback, so as to greatly improve flexibility and convenience of the mechanical keyswitch structure in use.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A keyswitch comprising:
a base having a pillar extending along a Z-axis, the Z-axis, an X-axis and a Y-axis being perpendicular to each other;
a cap having a first rib and a limiting arm, the first rib protruding toward the base along the Z-axis, the limiting arm protruding toward the base along the Z-axis and being movably connected to the base, so as to make the cap movable upward and downward between a high position and a low position along the Z-axis;
a sleeve rotatably sleeving the pillar, the sleeve being located under the cap and having a first top surface, a second top surface, and an outer annular surface formed thereon, the first top surface being higher than the second top surface along the Z-axis, the outer annular surface having a convex portion and a concave portion;
an elastic member abutting against the sleeve and the base for driving the sleeve to move away from the base; and
a resilient arm adjacent to the pillar, corresponding to the rotation of the sleeve on the pillar around the Z-axis, the resilient arm selectively abutting against a first position or a second position on the convex portion to have a first amount of deformation when the cap is located at the high position, the resilient arm abutting against the concave portion to have a second amount of deformation when the cap is located at the low position, the first amount of deformation being different from the second amount of deformation;
wherein when the resilient arm abuts against the first position, the first rib abuts against the first top surface to make the sleeve prepress the elastic member at a first length for generating a first preload, and when the cap moves downward along the Z-axis to move the sleeve downward, the resilient arm moves from the first position to the concave portion;
when the resilient arm abuts against the second position, the first rib abuts against the second top surface to make the sleeve prepress the elastic member at a second length for generating a second preload, the first length is larger than the second length to make the first preload smaller than the second preload, and when the cap moves downward along the Z-axis to move the sleeve downward, the resilient arm moves from the second position to the concave portion;
when the cap is released, the elastic member drives the sleeve to move to the high position along the Z-axis relative to the pillar, so as to make the resilient arm back to abut against the first position or the second position on the convex portion.

2. The keyswitch of claim 1, wherein the cap further has a second rib protruding toward the base, the first rib and the second rib are opposite to each other and are in an arc shape, the sleeve further has a third top surface and a fourth top surface formed thereon, the third top surface and the fourth top surface are opposite to each other and are in an arc shape; when the resilient arm abuts against the first position, the first rib and the second rib abut against the second top surface and the fourth top surface of the sleeve respectively, so as to make the sleeve prepress the elastic member at the first length for generating the first preload, and when the resilient arm abuts against the second position, the first rib and the second rib abut against the first top surface and the third top surface of the sleeve respectively, so as to make the sleeve prepress the elastic member at the second length for generating the second preload.

3. The keyswitch of claim 2, wherein the first rib and the second rib have the same center of curvature, and a first curvature radius of the first rib is larger than a second curvature radius of the second rib.

4. The keyswitch of claim 1, wherein the convex portion and the concave portion are in an annular shape and extend along a plane formed by the X-axis and the Y-axis in parallel.

5. The keyswitch of claim 1 further comprising a contact point opposite to the resilient arm, the contact point and the resilient arm extending toward the cap respectively and being coupled to a circuit board respectively;
wherein when the cap is located at the high position, the convex portion abuts against the resilient arm to cause outward deformation of the resilient arm for generating the first amount of deformation of the resilient arm, so as to make the resilient arm separate from the contact point, and when the cap is located at the low position, the resilient arm moves to abut against the concave portion to reduce deformation of the resilient arm for generating the second amount of deformation of the resilient arm, so as to make the resilient arm abut against the contact point.

6. The keyswitch of claim 1 further comprising:
a linkage mechanism connected to the sleeve for driving the sleeve to rotate on the pillar around the Z-axis, so as to make the resilient arm selectively abut against the first position or the second position on the convex portion;
wherein the linkage mechanism comprises a sliding plate and a linkage member, the sliding plate is movable between a third position and a fourth position, and the linkage member extends outwardly from the outer annular surface of the sleeve to be movably connected to the sliding plate;
when the sliding plate is located at the third position, the linkage member drives the sleeve to rotate on the pillar around the Z-axis with movement of the sliding plate, so as to make the resilient arm abut against the first position on the convex portion;
when the sliding plate is located at the fourth position, the linkage member drives the sleeve to rotate on the pillar around the Z-axis with movement of the sliding plate, so as to make the resilient arm abut against the second position on the convex portion.

7. The keyswitch of claim 1, wherein the pillar has a positioning arm, the sleeve has at least two positioning slots, a protruding point is formed at an end of the positioning arm corresponding to the at least two positioning slots; when the protruding point is engaged with one of the at least two positioning slots, the sleeve is positioned to make the resilient arm abut against the first position on the convex portion; when the protruding point is engaged with another of the at least two engaging slots, the sleeve is positioned to make the resilient arm abut against the second position on the convex portion.

8. The keyswitch of claim 1 further comprising:
an adjusting tool having two third ribs, the two third ribs protruding downward and being separate from each other;
wherein after the cap is detached from the base, the adjusting tool sleeves an top end of the sleeve to make the two third ribs laterally abut against the first top surface for driving the sleeve to rotate on the pillar around the Z-axis, so as to make the resilient arm selectively abut against the first position or the second position.

9. A keyswitch comprising:
a base having a pillar extending along a Z-axis, the Z-axis, an X-axis and a Y-axis being perpendicular to each other;
a cap having a limiting arm, the limiting arm protruding toward the base along the Z-axis and being movably connected to the base, so as to make the cap movable upward and downward between a high position and a low position along the Z-axis;
a resilient arm adjacent to the pillar;
a sleeve abutting against the cap and rotatably sleeving the pillar for rotating on the pillar around the Z-axis, the sleeve having an outer annular surface formed thereon, the outer annular surface having a first convex portion, a first concave portion, a second convex portion, a second concave portion and an arc-shaped bar, the arc-shaped bar extending above the second convex portion but not extending above the first convex portion, the resilient arm selectively abutting against the first convex portion or the second convex portion when the cap is located at the high position; and
an elastic member abutting against the sleeve and the base respectively for driving the sleeve to move away from the base;
wherein when the resilient arm abuts against the second convex portion and the cap is pressed to move the sleeve downward along the Z-axis, the resilient arm needs to cross the arc-shaped bar with downward movement of the sleeve during the resilient arm moves from the second convex portion to the second concave portion;
when the resilient arm abuts against the first convex portion and the cap is pressed to move the sleeve downward, the resilient arm does not need to cross the arc-shaped bar during the resilient arm moves from the first convex portion to the first concave portion;
when the cap is released, the elastic member drives the sleeve to move upward along the Z-axis relative to the pillar, so as to make the resilient arm move back to abut against the first convex portion or the second convex portion.

10. The keyswitch of claim 9, wherein the outer annular surface has an annular convex portion, the annular convex portion is connected to the first convex portion and the second convex portion, and when the sleeve rotates on the pillar around the Z-axis, the resilient arm slides from the first convex portion to the second convex portion along the annular convex portion.

11. The keyswitch of claim 9, wherein the outer annular surface has an annular concave portion, the annular concave portion is connected to the first concave portion and the second concave portion, and when the sleeve rotates on the pillar around the Z-axis, the resilient arm slides from the first concave portion to the second concave portion along the annular concave portion.

12. The keyswitch of claim 9 further comprising a contact point opposite to the resilient arm, the contact point and the resilient arm extending toward the cap respectively and being coupled to a circuit board respectively;
wherein when the cap is located at the high position, the first convex portion or the second convex portion abuts against the resilient arm to cause outward deformation of the resilient arm, so as to make the resilient arm separate from the contact point;
when the cap is located at the low position, the resilient arm moves to abut against the first concave portion or the second concave portion to reduce deformation of the resilient arm, so as to make the resilient arm abut against the contact point.

13. The keyswitch of claim 9 further comprising:
a linkage mechanism connected to the sleeve and movably disposed on the base for driving the sleeve to rotate on the pillar around the Z-axis, so as to make the resilient arm selectively abut against the first convex portion or the second convex portion;

wherein the linkage mechanism comprises a linkage member and a sliding plate slidable relative to the base, and the linkage member extends outwardly from the outer annular surface of the sleeve to be movably connected to the sliding plate;

when the sliding plate slides relative to the base, the linkage member swings with sliding of the sliding plate to drive the sleeve to rotate on the pillar around the Z-axis, so as to make the resilient arm selectively abut against the first convex portion or the second convex portion.

14. The keyswitch of claim 9, wherein the pillar has a positioning arm, the sleeve has at least two positioning slots, a protruding point is formed at an end of the positioning arm corresponding to the at least two positioning slots; when the protruding point is engaged with one of the at least two positioning slots, the sleeve is positioned to make the resilient arm abut against the first convex position; when the protruding point is engaged with another of the at least two engaging slots, the sleeve is positioned to make the resilient arm abut against the second convex portion.

15. The keyswitch of claim 9 further comprising:
an adjusting tool, the adjusting tool sleeving an top end of the sleeve for driving the sleeve to rotate on the pillar around the Z-axis after the cap is detached from the base, so as to make the resilient arm selectively abut against the first convex portion or the second convex portion.

16. A keyswitch comprising:
a base having a pillar, a top surface and a protruding block adjacent to the pillar, the pillar protruding from the top surface along a Z-axis, the Z-axis, an X-axis and a Y-axis being perpendicular to each other, the protruding block being higher than the top surface along the Z-axis;
a cap having a limiting arm extending toward the base along the Z-axis, the limiting arm being movably connected to the base to make the cap movable upward and downward between a high position and a low position along the Z-axis;
a sleeve abutting against the cap and rotatably sleeving the pillar, the sleeve having an outer annular surface formed thereon, the outer annular surface having a first convex portion, a first concave portion, a second convex portion, and a second concave portion, a groove and a bottom surface being formed on a bottom end of the sleeve, the sleeve rotating on the pillar around the Z-axis to make the protruding block selectively located under the groove or the bottom surface;
an elastic member abutting against the sleeve and the base respectively for driving the sleeve to move away from the base; and
a resilient arm adjacent to the pillar, the resilient arm abutting against the first convex portion when the sleeve rotates around the Z-axis to make the protruding block located under the groove, and the resilient arm abutting against the second convex portion when the sleeve rotates around the Z-axis to make the protruding block located under the bottom surface;
wherein when the protruding block is located under the groove and the cap is pressed, the sleeve moves downward and the resilient arm moves from the first convex portion to the first concave portion until the protruding block is contained in the groove, so that a maximum movable distance of the cap along the Z-axis is set as a first travel distance;

when the protruding block is located under the bottom surface and the cap is pressed, the sleeve moves downward and the resilient arm moves from the second convex portion to the second concave portion until the protruding block abuts against the bottom surface, so that the maximum movable distance of the cap along the Z-axis is set as a second travel distance less than the first travel distance;

when the cap is released, the elastic member drives the sleeve to move upward along the Z-axis relative to the pillar, so as to make the resilient arm move back to abut against the first convex portion or the second convex portion.

17. The keyswitch of claim 16, wherein the outer annular surface has an annular convex portion, the annular convex portion is connected to the first convex portion and the second convex portion, and when the sleeve rotates on the pillar around the Z-axis, the resilient arm slides from the first convex portion to the second convex portion along the annular convex portion.

18. The keyswitch of claim 16, wherein the outer annular surface has an annular concave portion, the annular concave portion is connected to the first concave portion and the second concave portion, and when the sleeve rotates on the pillar around the Z-axis, the resilient arm slides from the first concave portion to the second concave portion along the annular concave portion.

19. The keyswitch of claim 16 further comprising a contact point opposite to the resilient arm, the contact point and the resilient arm extending toward the cap respectively and being coupled to a circuit board respectively;
wherein when the cap is located at the high position, the first convex portion or the second convex portion abuts against the resilient arm to cause outward deformation of the resilient arm, so as to make the resilient arm separate from the contact point;
when the cap is located at the low position, the resilient arm moves to abut against the first concave portion or the second concave portion to reduce deformation of the resilient arm, so as to make the resilient arm abut against the contact point.

20. The keyswitch of claim 16 further comprising:
a linkage mechanism connected to the sleeve and movably disposed on the base for driving the sleeve to rotate on the pillar around the Z-axis, so as to make the resilient arm selectively abut against the first convex portion or the second convex portion;
wherein the linkage mechanism comprises a linkage member and a sliding plate slidable relative to the base, and the linkage member extends outwardly from the outer annular surface of the sleeve to be movably connected to the sliding plate;
when the sliding plate slides relative to the base, the linkage member swings with sliding of the sliding plate to drive the sleeve to rotate on the pillar around the Z-axis, so as to make the resilient arm selectively abut against the first convex portion or the second convex portion.

21. The keyswitch of claim 16, wherein the pillar has a positioning arm, the sleeve has at least two positioning slots, a protruding point is formed at an end of the positioning arm corresponding to the at least two positioning slots; when the protruding point is engaged with one of the at least two positioning slots, the sleeve is positioned to make the protruding block located under the groove; when the protruding point is engaged with another of the at least two engaging slots, the sleeve is positioned to make the protruding block located under the bottom surface.

22. The keyswitch of claim 16 further comprising:
an adjusting tool, the adjusting tool sleeving an top end of the sleeve for driving the sleeve to rotate on the pillar around the Z-axis after the cap is detached from the base, so as to make the resilient arm selectively abut against the first convex portion or the second convex portion.

23. A keyswitch comprising:
a base having a pillar extending along a Z-axis, the Z-axis, an X-axis and a Y-axis being perpendicular to each other;
a cap having a limiting arm, the limiting arm protruding toward the base along the Z-axis and being movably connected to the base, so as to make the cap movable upward and downward between a high position and a low position along the Z-axis;
a switch unit adjacent to the pillar, the switch unit having a resilient arm and a contact point opposite to the resilient arm, the contact point and the resilient arm extending toward the cap respectively, the switch unit being electrically connected to a circuit board;
a sleeve abutting against the cap and rotatably sleeving the pillar for rotating on the pillar around the Z-axis, the sleeve having an outer annular surface formed thereon, the outer annular surface having a first convex portion, a first concave portion, a second convex portion, a second concave portion, a first transition portion, and a second transition portion lower than the first transition portion along the Z-axis, the first convex portion, the first transition portion and the first concave portion being arranged from down to up along the Z-axis, the second convex portion, the second transition portion and the second concave portion being arranged from down to up along the Z-axis, the resilient arm selectively abutting against the first convex portion or the second convex portion when the cap is located at the high position; and
an elastic member abutting against the sleeve and the base respectively for driving the sleeve to move away from the base;
wherein when the resilient arm abuts against the first convex portion and the cap is pressed to move the sleeve downward along the Z-axis, the resilient arm abuts against the sleeve member and moves from the first convex portion to the first concave portion along the first transition portion to make the resilient arm located at a first triggering position for triggering the contact point;
when the resilient arm abuts against the second convex portion and the cap is pressed to move the sleeve downward along the Z-axis, the resilient arm abuts against the sleeve member and moves from the second convex portion to the second concave portion along the second transition portion to make the resilient arm located at a second triggering position lower than the first triggering position along the Z-axis for triggering the contact point;
when the cap is released, the elastic member drives the sleeve to move upward along the Z-axis relative to the pillar, so as to make the resilient arm move to abut against the first convex portion or the second convex portion and to be separate from the contact point.

24. The keyswitch of claim 23, wherein the first triggering position is defined by where the first transition portion and the first concave portion meet, and the second triggering position is defined by where the second transition portion and the second concave portion meet.

25. The keyswitch of claim 23, wherein the outer annular surface has an annular convex portion, the annular convex portion is connected to the first convex portion and the second convex portion, and when the sleeve rotates on the pillar around the Z-axis, the resilient arm slides from the first convex portion to the second convex portion along the annular convex portion.

26. The keyswitch of claim 23, wherein the outer annular surface has an annular concave portion, the annular concave portion is connected to the first concave portion and the second concave portion, and when the sleeve rotates on the pillar around the Z-axis, the resilient arm slides from the first concave portion to the second concave portion along the annular concave portion.

27. The keyswitch of claim 23 further comprising:
a linkage mechanism connected to the sleeve and movably disposed on the base for driving the sleeve to rotate on the pillar around the Z-axis, so as to make the resilient arm selectively abut against a position under the first transition portion or the second transition portion;
wherein the linkage mechanism comprises a linkage member and a sliding plate slidable relative to the base, and the linkage member extends outwardly from the outer annular surface of the sleeve to be movably connected to the sliding plate;
when the sliding plate slides relative to the base, the linkage member swings with sliding of the sliding plate to drive the sleeve to rotate on the pillar around the Z-axis, so as to make the resilient arm selectively abut against the position under the first transition portion or the second transition portion.

28. The keyswitch of claim 23, wherein the pillar has a positioning arm, the sleeve has at least two positioning slots, a protruding point is formed at an end of the positioning arm corresponding to the at least two positioning slots; when the protruding point is engaged with one of the at least two positioning slots, the sleeve is positioned to make the resilient arm abut against a position under the first transition portion; when the protruding point is engaged with another of the at least two engaging slots, the sleeve is positioned to make the resilient arm abut against a position under the second transition portion.

29. The keyswitch of claim 23 further comprising:
an adjusting tool, the adjusting tool sleeving an top end of the sleeve for driving the sleeve to rotate on the pillar around the Z-axis after the cap is detached from the base, so as to make the resilient arm selectively abut against a position under the first transition portion or the second transition portion.

30. A keyswitch comprising:
a base having a pillar extending along a Z-axis, the Z-axis, an X-axis and a Y-axis being perpendicular to each other;
a cap having a first rib and a limiting arm, the first rib and the limiting arm protruding toward the base along the Z-axis, the limiting arm being movably connected to the base to make the cap movable upward and downward between a high position and a low position along the Z-axis;
a resilient arm adjacent to the pillar;
an internal sleeve having a support surface;
an external sleeve supported on the support surface, the external sleeve rotatably sleeving the pillar for rotating on the pillar around the Z-axis, the external sleeve having a first top surface, a second top surface, and an outer annular surface formed thereon, the first top surface being higher than the second top surface along the Z-axis, the outer annular surface having a first convex portion, a first concave portion, a second convex portion, a second concave portion, and an arc-shaped bar, the resilient arm selectively abutting against the first convex portion or the second convex portion when the cap is located at the high position, the arc-shaped bar at least extending above the second convex portion and having a bottom edge surface and an upper edge surface; and an elastic member abutting against the internal sleeve and the base for driving the internal sleeve to move away from the base;

wherein when the resilient arm abuts against the second convex portion, the first rib of the cap is separate from the second top surface of the external sleeve at a gap, and the resilient arm needs to cross the arc-shaped bar during the resilient arm moves from the second convex portion to the second concave portion;

when a downward moving distance of the cap is less than the gap, the cap drives the internal sleeve to move downward and the resilient arm abuts against the bottom edge surface to make the external sleeve not move together with the internal sleeve, so as to make the external sleeve separate from the support surface of the internal sleeve;

when the downward moving distance of the cap is larger than the gap to make the cap drive the external sleeve to move downward, the resilient arm crosses the arc-shaped bar to abut against the upper edge surface with downward movement of the external sleeve, and then the resilient arm drives the external sleeve to collide with the support surface of the internal sleeve for making a sound;

when the resilient arm abuts against the first convex portion, the first rib abuts against the first top surface, and then the resilient arm moves from the first convex portion to the first concave portion when the cap is pressed to move the internal sleeve and the external sleeve downward along the Z-axis;

when the cap is released, the elastic member drives the external sleeve via the internal sleeve to move upward along the Z-axis relative to the pillar, so as to make the resilient arm back to abut against the first convex portion or the second convex portion.

31. The keyswitch of claim 30, wherein a second rib protrudes from the cap toward the base along the Z-axis and is opposite to the first rib, the second rib and the first rib are in an arc shape, the external sleeve further has a third top surface and a fourth top surface, the third top surface and the first top surface are opposite to each other and are in an arc shape, the fourth top surface and the second top surface are opposite to each other and are in an arc shape, the first rib and the second rib are separate from the second top surface and the fourth top surface respectively at the gap when the resilient arm abuts against the second convex portion, and the first rib and the second rib abut against the first top surface and the third top surface respectively when the resilient arm abuts against the first convex portion.

32. The keyswitch of claim 31, wherein the first rib and the second rib has the same center of curvature, and a first curvature radius of the first rib is larger than a second curvature radius of the second rib.

33. The keyswitch of claim 30, wherein the outer annular surface has an annular convex portion, the annular convex portion is connected to the first convex portion and the second convex portion, and when the external sleeve rotates on the pillar around the Z-axis, the resilient arm slides from the first convex portion to the second convex portion along the annular convex portion.

34. The keyswitch of claim 30, wherein the outer annular surface has an annular concave portion, the annular concave portion is connected to the first concave portion and the second concave portion, and when the external sleeve rotates on the pillar around the Z-axis, the resilient arm slides from the first concave portion to the second concave portion along the annular concave portion.

35. The keyswitch of claim 30 further comprising a contact point opposite to the resilient arm, the contact point and the resilient arm extending toward the cap respectively and being coupled to a circuit board respectively;

wherein when the cap is located at the high position, the first convex portion or the second convex portion abuts against the resilient arm to cause outward deformation of the resilient arm, so as to make the resilient arm separate from the contact point, and when the cap is located at the low position, the resilient arm moves to abut against the first concave portion or the second concave portion to reduce deformation of the resilient arm, so as to make the resilient arm abut against the contact point.

36. The keyswitch of claim 30 further comprising:

a linkage mechanism connected to the external sleeve and movably disposed on the base for driving the external sleeve to rotate on the pillar around the Z-axis, so as to make the resilient arm selectively abut against the first convex portion or the second convex portion;

wherein the linkage mechanism comprises a linkage member and a sliding plate slidable relative to the base, and the linkage member extends outwardly from the outer annular surface of the external sleeve to be movably connected to the sliding plate;

when the sliding plate slides relative to the base, the linkage member swings with sliding of the sliding plate to drive the external sleeve to rotate on the pillar around the Z-axis, so as to make the resilient arm selectively abut against the first convex portion or the second convex portion.

37. The keyswitch of claim 30, wherein the pillar has a positioning arm, the sleeve has at least two positioning slots, a protruding point is formed at an end of the positioning arm corresponding to the at least two positioning slots; when the protruding point is engaged with one of the at least two positioning slots, the external sleeve is positioned to make the resilient arm abut against the first convex portion; when the protruding point is engaged with another of the at least two engaging slots, the external sleeve is positioned to make the resilient arm abut against the second convex portion.

38. The keyswitch of claim 30 further comprising:

an adjusting tool having two third ribs, the two third ribs protruding downward and being separate from each other;

wherein after the cap is detached from the base, the adjusting tool sleeves an top end of the external sleeve to make the two third ribs laterally abut against the first top surface for driving the external sleeve to rotate on the pillar around the Z-axis, so as to make the resilient arm selectively abut against the first convex portion or the second convex portion.

39. A switch comprising:

a base having a positioning structure extending along a Z-axis, the Z-axis, an X-axis and a Y-axis being perpendicular to each other;

a resilient arm adjacent to the positioning structure;

a sleeve having an outer annular surface and rotatably sleeving the positioning structure for rotating on the positioning structure around the Z-axis and moving upward and downward between a high position and a low position along the Z-axis, the outer annular surface having a first large radius portion, a first small radius portion, a second large radius portion, and a second small radius portion, the resilient arm selectively abutting against the first large radius portion or the second large radius portion when the sleeve is located at the high position; and an elastic member abutting against the sleeve and the base respectively for driving the sleeve to move away from the base;

wherein when the resilient arm abuts against the first large radius portion and the sleeve moves downward along the Z-axis, the resilient arm moves from the first large radius portion to the first small radius portion along a first path and the first path interacts with the resilient arm to generate a first tactile feedback;

when the resilient arm abuts against the second large radius portion and the sleeve moves downward along the Z-axis, the resilient arm moves from the second large radius portion to the second small radius portion along a second path and the second path interacts with the resilient arm to generate a second tactile feedback;

when the sleeve is released, the elastic member drives the sleeve to move upward along the Z-axis, so as to make the resilient arm move back to abut against the first large radius portion or the second large radius portion.

40. The switch of claim 39 further comprising:

a cap connected to the sleeve, the cap having a limiting arm protruding toward the base along the Z-axis, the limiting arm being movably connected to the base to make the cap movable upward and downward between the high position and the low position along the Z-axis.

41. The switch of claim 39 further comprising a contact point opposite to the resilient arm, the contact point and the resilient arm being coupled to a circuit board respectively; wherein when the sleeve is located at the high position, the first large radius portion or the second large radius portion abuts against the resilient arm to cause outward deformation of the resilient arm, so as to make the resilient arm separate from the contact point;

when the sleeve is located at the low position, the resilient arm moves to abut against the first small radius portion or the second small radius portion to reduce deformation of the resilient arm, so as to make the resilient arm abut against the contact point.

42. The switch of claim 39 further comprising:

a linkage mechanism connected to the sleeve for driving the sleeve to rotate on the positioning structure around the Z-axis, so as to make the resilient arm selectively abut against the first large radius portion or the second large radius portion;

wherein the linkage mechanism comprises a linkage member and a sliding plate slidable relative to the base, and the linkage member extends outwardly from the outer annular surface of the sleeve to be movably connected to the sliding plate;

when the sliding plate slides relative to the base, the linkage member swings with sliding of the sliding plate to drive the sleeve to rotate on the positioning structure around the Z-axis, so as to make the resilient arm selectively abut against the first large radius portion or the second large radius portion.

43. The switch of claim 39, wherein the positioning structure has a positioning arm, the sleeve has at least two positioning slots, a protruding point is formed at an end of the positioning arm corresponding to the at least two positioning slots; when the protruding point is engaged with one of the at least two positioning slots, the sleeve is positioned to make the resilient arm abut against the first large radius portion; when the protruding point is engaged with another of the at least two engaging slots, the sleeve is positioned to make the resilient arm abut against the second large radius portion.

44. The switch of claim 39 further comprising:

an adjusting tool, the adjusting tool sleeving an top end of the sleeve for driving the sleeve to rotate on the positioning structure around the Z-axis after the cap is detached from the base, so as to make the resilient arm selectively abut against the first large radius portion or the second large radius portion.

* * * * *